United States Patent
Tani et al.

(10) Patent No.: US 11,011,706 B2
(45) Date of Patent: May 18, 2021

(54) ORGANIC SEMICONDUCTOR ELEMENT, ORGANIC SEMICONDUCTOR COMPOSITION, ORGANIC SEMICONDUCTOR FILM, METHOD OF MANUFACTURING ORGANIC SEMICONDUCTOR FILM, AND POLYMER USING THE SAME

(71) Applicants: FUJIFILM Corporation, Tokyo (JP); The University of Tokyo, Tokyo (JP)

(72) Inventors: Yukio Tani, Kanagawa (JP); Kenji Shirokane, Kanagawa (JP); Tetsuya Watanabe, Kanagawa (JP); Toshihiro Okamoto, Tokyo (JP); Junichi Takeya, Tokyo (JP)

(73) Assignees: FUJIFILM Corporation, Tokyo (JP); The University of Tokyo, Tokyo (JP)

( * ) Notice: Subject to any disclaimer, the term of this patent is extended or adjusted under 35 U.S.C. 154(b) by 0 days.

(21) Appl. No.: 16/924,003

(22) Filed: Jul. 8, 2020

(65) Prior Publication Data
US 2020/0343451 A1    Oct. 29, 2020

Related U.S. Application Data

(63) Continuation of application No. PCT/JP2018/048046, filed on Dec. 27, 2018.

(30) Foreign Application Priority Data

Jan. 23, 2018  (JP) .............................. JP2018-008590

(51) Int. Cl.
*H01L 51/00* (2006.01)
*C08G 61/00* (2006.01)
(Continued)

(52) U.S. Cl.
CPC ........ *H01L 51/0036* (2013.01); *C08F 220/68* (2013.01); *C08G 61/122* (2013.01);
(Continued)

(58) Field of Classification Search
CPC . H01B 1/121; H01L 51/0035; H01L 51/0036; H01L 51/0045; C08F 20/26;
(Continued)

(56) References Cited

U.S. PATENT DOCUMENTS 8,022,214 B2 * 9/2011 Facchetti ............. C07D 471/12
546/37
10,131,656 B2 * 11/2018 Tsuyama ............... H01L 29/786
(Continued)

FOREIGN PATENT DOCUMENTS

JP      2011-514913 A    5/2011
JP      2015-153780 A    8/2015
(Continued)

OTHER PUBLICATIONS

International Search Report issued in PCT/JP2018/048046; dated Mar. 19, 2019.
(Continued)

*Primary Examiner* — Mark Kopec
(74) *Attorney, Agent, or Firm* — Studebaker & Brackett PC

(57) ABSTRACT

Provided are an organic thin film transistor element comprising an organic semiconductor layer containing a specific polymer which has a repeating unit including a structure represented by a specific formula, an organic semiconductor film suitable as the organic semiconductor layer and a method of manufacturing the same, and a polymer and a composition suitable as a constituent material of the organic semiconductor film.

12 Claims, 1 Drawing Sheet

(51) Int. Cl.
*C08F 220/68* (2006.01)
*C08G 61/12* (2006.01)
*C09D 5/24* (2006.01)
*C09D 165/00* (2006.01)
*H01L 51/05* (2006.01)

(52) U.S. Cl.
CPC .............. *C08G 61/126* (2013.01); *C09D 5/24* (2013.01); *C09D 165/00* (2013.01); *H01L 51/0035* (2013.01); *H01L 51/0043* (2013.01); *C08G 2261/124* (2013.01); *C08G 2261/149* (2013.01); *C08G 2261/1412* (2013.01); *C08G 2261/1424* (2013.01); *C08G 2261/18* (2013.01); *C08G 2261/228* (2013.01); *C08G 2261/312* (2013.01); *C08G 2261/3223* (2013.01); *C08G 2261/3241* (2013.01); *C08G 2261/514* (2013.01); *H01L 51/0004* (2013.01); *H01L 51/0545* (2013.01); *H01L 51/0558* (2013.01)

(58) Field of Classification Search
CPC .......... C08F 20/36; C08F 20/42; C08G 61/12; C08G 73/10; C07D 471/08
See application file for complete search history.

(56) References Cited

U.S. PATENT DOCUMENTS

| | | | |
|---|---|---|---|
| 10,333,072 B2* | 6/2019 | Weitz | .................. H01L 51/0566 |
| 2010/0283047 A1 | 11/2010 | Facchetti et al. | |
| 2018/0261770 A1 | 9/2018 | Yamamoto et al. | |
| 2019/0036029 A1 | 1/2019 | Tamakuni | |
| 2019/0131546 A1* | 5/2019 | Fukuzaki | ............ H01L 51/0053 |

FOREIGN PATENT DOCUMENTS

| | | |
|---|---|---|
| JP | 2017-054876 A | 3/2017 |
| WO | 2014/178415 A1 | 11/2014 |
| WO | 2017/057747 A1 | 4/2017 |
| WO | 2017/086320 A1 | 5/2017 |
| WO | 2017/175665 A1 | 10/2017 |
| WO | 2018/003701 A1 | 1/2018 |

OTHER PUBLICATIONS

International Preliminary Report on Patentability issued in PCT/JP2018/048046; completed Sep. 19, 2019.
The extended European search report issued by the European Patent Office dated Feb. 10, 2021, which correspond to European Patent Application No. 18902942.4-1212 and is related to U.S. Appl. No. 16/924,003.

* cited by examiner

ORGANIC SEMICONDUCTOR ELEMENT, ORGANIC SEMICONDUCTOR COMPOSITION, ORGANIC SEMICONDUCTOR FILM, METHOD OF MANUFACTURING ORGANIC SEMICONDUCTOR FILM, AND POLYMER USING THE SAME

CROSS-REFERENCE TO RELATED APPLICATIONS

This application is a Continuation of PCT International Application No. PCT/JP2018/048046 filed on Dec. 27, 2018, which claims priority under 35 U.S.C. § 119 (a) to Japanese Patent Application No. 2018-008590 filed in Japan on Jan. 23, 2018. Each of the above applications is hereby expressly incorporated by reference, in its entirety, into the present application.

BACKGROUND OF THE INVENTION

1. Field of the Invention

The present invention relates to an organic semiconductor element, an organic semiconductor composition, an organic semiconductor film, a method of manufacturing an organic semiconductor film, and a polymer using the same.

2. Description of the Related Art

A semiconductor element has been used for displays such as a liquid crystal display or an organic electroluminescent display, devices using a radio frequency identifier (RFID: RF tags) or a logic circuit, for example, a memory, solar cells, and the like. Among these, since weight and cost can be reduced and flexibility are excellent, an organic semiconductor element having an organic semiconductor film is superior to an inorganic semiconductor element having an inorganic semiconductor film.

As an organic compound forming the organic semiconductor film, a compound which has a repeating unit consisting of a fused ring structure including a 5-membered monocyclic ring and an aliphatic 7-membered monocyclic ring as a fused ring (JP2015-153780A) or a polymer which has a repeating unit consisting of a repeating unit including a polycyclic moiety and a perylene bisimide structure (JP2011-514913A) has been studied.

SUMMARY OF THE INVENTION

The above-described displays and the like have been rapidly improved in performance, and organic semiconductor elements mounted thereon are required to improve semiconductor characteristics (for example, carrier mobility). In addition, in order to achieve the demands for cost reduction or flexibility in the above-described displays and the like, characteristics (durability) of driving stably in the atmosphere and maintaining the semiconductor characteristics are required even in a case where a special protective layer or sealing layer is not provided.

However, including an organic semiconductor element using the compound disclosed in JP2015-153780A or the polymer described in JP2011-514913A, the organic semiconductor element in the related art tends to have significantly reduced semiconductor characteristics in the atmosphere, and there is a room for improvement in compatibility between the semiconductor characteristics and durability for maintaining the semiconductor characteristics.

An object of the present invention is to provide an organic semiconductor element having excellent durability which maintains desired semiconductor characteristics (for example, high carrier mobility) even in the atmosphere. In addition, another object of the present invention is to provide an organic semiconductor film suitable as an organic semiconductor layer in the organic semiconductor element and a manufacturing method thereof. Furthermore, another object of the present invention is to provide a polymer and a composition suitable as a constituent material of the organic semiconductor film.

As a result of intensive studies, the present inventors have found that a specific polymer which has a repeating unit including a structure represented by a specific formula (1) described later can be preferably used as an organic semiconductor. Furthermore, the present inventors have found that, by containing the polymer in an organic semiconductor film, an organic semiconductor element can exhibit high carrier mobility and can suppress the decrease of carrier mobility even in the atmosphere. Based on the findings, the present invention has been further studied and completed.

The above-described objects of the present invention have been achieved by the following methods.

<1> An organic semiconductor element comprising:

an organic semiconductor layer containing a polymer which has a repeating unit including a structure represented by Formula (1),

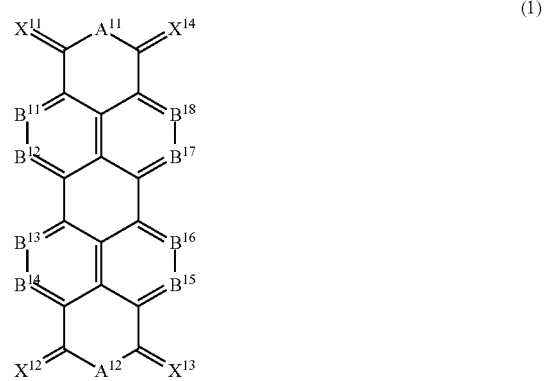

in Formula (1), $A^{11}$ and $A^{12}$ represent —O—, —N($R^N$)—, or —P($R^N$)—, $B^{11}$ to $B^{18}$ represent —N= or —C($R^M$)=, at least one of which is —N=, at least one of $R^N$ or $R^M$ represents a single bond or a linking group, and the other represents a hydrogen atom or a substituent, $X^{11}$ to $X^{14}$ represent an oxygen atom or a sulfur atom, and the polymer includes no repeating unit having an aliphatic 7-membered ring structure.

<2> The organic semiconductor element according to <1>, in which the polymer has, as the repeating unit, a group consisting of a 5-membered or 6-membered monocyclic ring, a group consisting of a condensed ring in which at least two of the monocyclic rings are condensed, an ethenylene group or an ethynylene group, or a group obtained by combining these groups.

<3> The organic semiconductor element according to <1> or <2>,
in which the repeating unit including the structure represented by Formula (1) is a repeating unit including a structure represented by Formula (2),

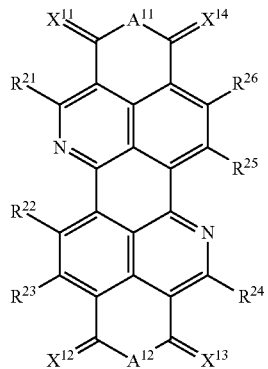

(2)

in Formula (2), $A^{11}$ and $A^{12}$ represent —O—, —N($R^N$)—, or —P($R^N$)—, at least one of $R^N$ and $R^{21}$ to $R^{26}$ represent a single bond or a linking group, and the others represent a hydrogen atom or a substituent, and $X^{11}$ to $X^{14}$ have the same meaning as $X^{11}$ to $X^{14}$ in Formula (1).

<4> The organic semiconductor element according to any one of <1> to <3>,
in which the repeating unit including the structure represented by Formula (1) is a repeating unit including a structure represented by Formula (3-1) or Formula (3-2),

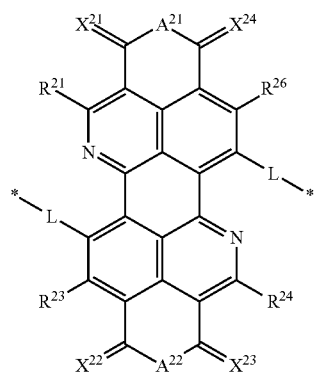

(3-1)

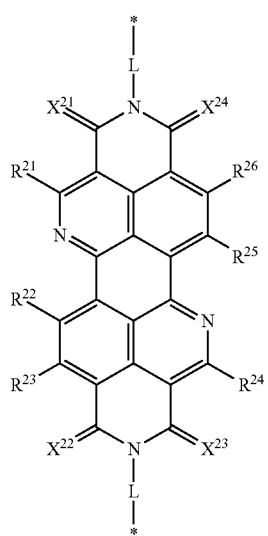

(3-2)

in Formula (3-1) and Formula (3-2), $A^{21}$ and $A^{22}$ represent —O—, —N($R^N$)—, or —P($R^N$)—, $R^N$ and $R^{21}$ to $R^{26}$ represent a hydrogen atom or a substituent, $X^{22}$ to $X^{24}$ have the same meaning as $X^{11}$ to $X^{14}$ in Formula (1), L represents a single bond or a linking group, and * represents a linking site.

<5> The organic semiconductor element according to any one of <1> to <4>, which is
an organic thin film transistor element.

<6> An organic semiconductor composition comprising:
a polymer which has a repeating unit including a structure represented by Formula (1); and
a solvent,

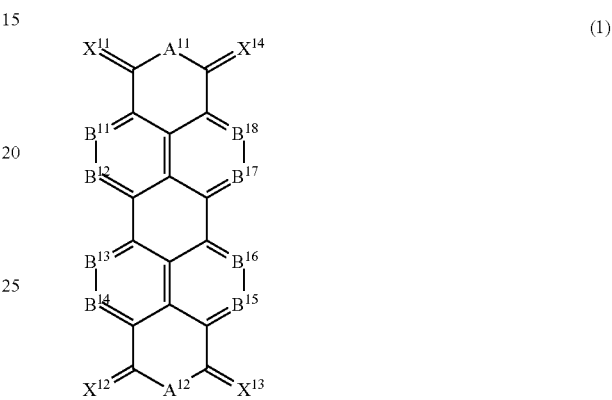

(1)

in Formula (1), $A^{11}$ and $A^{12}$ represent —O—, —N($R^N$)—, or —P($R^N$)—, $B^{11}$ to $B^{18}$ represent —N= or —C($R^M$)=, at least one of which is —N=, at least one of $R^N$ or $R^M$ represents a single bond or a linking group, and the other represents a hydrogen atom or a substituent, $X^{11}$ to $X^{14}$ represent an oxygen atom or a sulfur atom, and the polymer includes no repeating unit having an aliphatic 7-membered ring structure.

<7> An organic semiconductor film comprising:
a polymer which has a repeating unit including a structure represented by Formula (1),

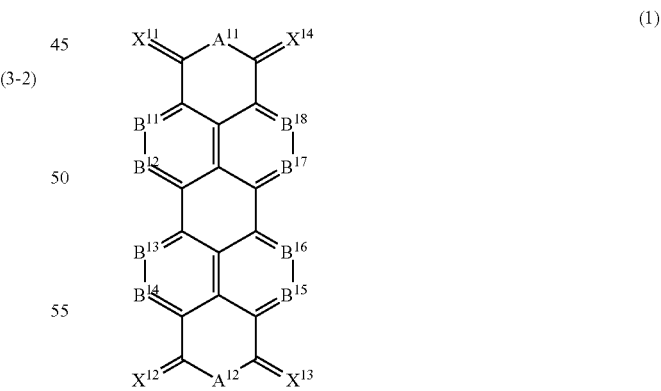

(1)

in Formula (1), $A^{11}$ and $A^{12}$ represent —O—, —N($R^N$)—, or —P($R^N$)—, $B^{11}$ to $B^{18}$ represent —N= or —C($R^M$)=, at least one of which is —N=, at least one of $R^N$ or $R^M$ represents a single bond or a linking group, and the other represents a hydrogen atom or a substituent, $X^{11}$ to $X^{24}$ represent an oxygen atom or a sulfur atom, and the polymer includes no repeating unit having an aliphatic 7-membered ring structure.

<8> A method of manufacturing an organic semiconductor film, the method comprising:
a step of applying or printing the organic semiconductor composition according to <6> on a substrate, and drying the applied or printed organic semiconductor composition to form an organic semiconductor film.

<9> A polymer which has a repeating unit including a structure represented by Formula (1),

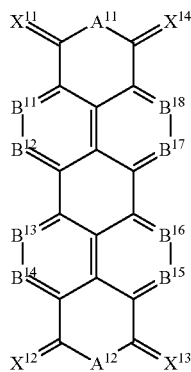

(1)

in Formula (1), $A^{11}$ and $A^{12}$ represent —O—, —N($R^N$)—, or —P($R^N$)—, $B^{11}$ to $B^{18}$ represent —N= or —C($R^M$)=, at least one of which is —N=, at least one of $R^N$ or $R^M$ represents a single bond or a linking group, and the other represents a hydrogen atom or a substituent, $X^{11}$ to $X^{14}$ represent an oxygen atom or a sulfur atom, and the polymer includes no repeating unit having an aliphatic 7-membered ring structure.

<10> The polymer according to <9>, which has, as the repeating unit, a group consisting of a 5-membered or 6-membered monocyclic ring, a group consisting of a condensed ring in which at least two of the monocyclic rings are condensed, an ethenylene group or an ethynylene group, or a group obtained by combining these groups.

<11> The polymer according to <9> or <10>,
in which the repeating unit including the structure represented by Formula (1) is a repeating unit including a structure represented by Formula (2),

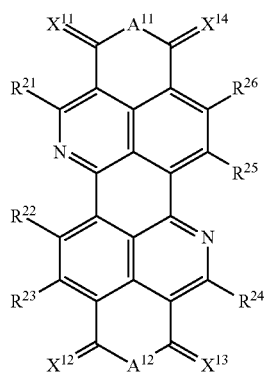

(2)

in Formula (2), $A^{11}$ and $A^{12}$ represent —O—, —N($R^N$)—, or —P($R^N$)—, at least one of $R^N$ and $R^{21}$ to $R^{26}$ represent a single bond or a linking group, and the others represent a hydrogen atom or a substituent, and $X^{11}$ to $X^{14}$ have the same meaning as $X^{11}$ to $X^{14}$ in Formula (1).

<12> The polymer according to any one of <9> to <11>,
wherein the repeating unit including the structure represented by Formula (1) is a repeating unit including a structure represented by Formula (3-1) or Formula (3-2),

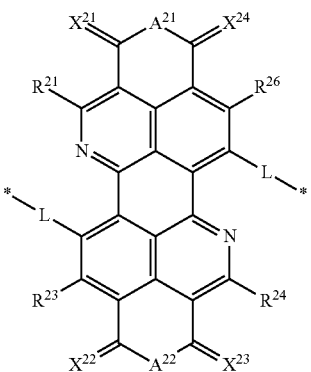

(3-1)

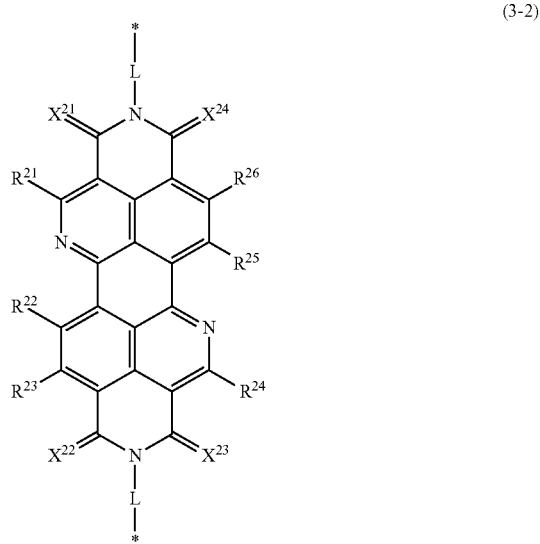

(3-2)

in Formula (3-1) and Formula (3-2), $A^{21}$ and $A^{22}$ represent —O—, —N($R^N$)—, or —P($R^N$)—, $R^N$ and $R^{21}$ to $R^{26}$ represent a hydrogen atom or a substituent, $X^{21}$ to $X^{24}$ have the same meaning as $X^{11}$ to $X^{14}$ in Formula (1), L represents a single bond or a linking group, and * represents a linking site.

According to the present invention, it is possible to provide an organic semiconductor element having durability in which desired excellent semiconductor characteristics can be maintained even in the atmosphere. In addition, according to the present invention, it is possible to provide an organic semiconductor film suitable as an organic semiconductor layer in the organic semiconductor element exhibiting the above-described characteristics, and a manufacturing method thereof. Furthermore, according to the present invention, it is possible to provide a polymer and a composition suitable as a constituent material of the organic semiconductor film.

The above-described and other features and advantages of the present invention will be more apparent from the following description, appropriately referring to the accompanying drawings.

DESCRIPTION OF THE PREFERRED EMBODIMENTS

Figure 1:
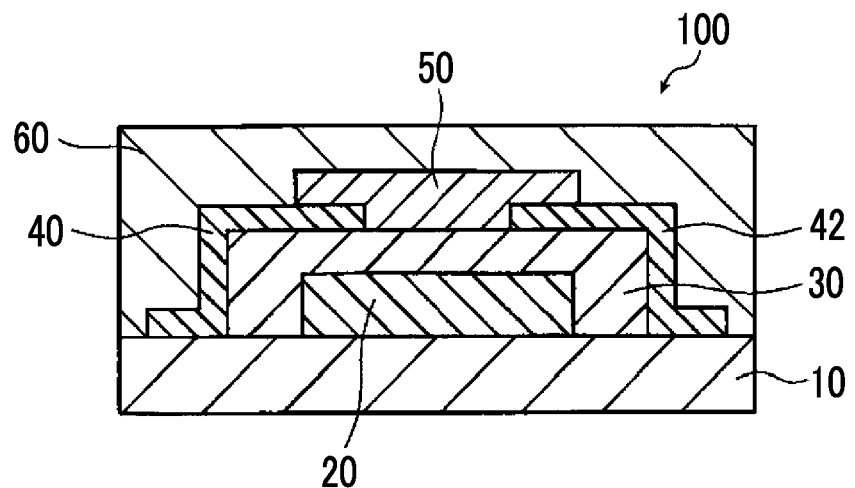
FIG. 1 is a cross-sectional schematic view illustrating a bottom gate-bottom contact type organic thin film transistor element which is an example of a semiconductor element of the present invention.

In the present specification, the numerical range expressed by using "to" means a range including numerical values described before and after "to" as a lower limit value and an upper limit value.

In the present specification, the expression of a compound includes the compound itself, a salt thereof, and an ion thereof. A portion of the structure may be changed without deteriorating the desired effect.

A compound which is not specifically described as substituted or unsubstituted includes those having an arbitrary substituent without deteriorating the desired effect. The same is also applied to a substituent, a linking group, a ring structure, and the like (hereinafter, referred to as a substituent and the like).

In the present specification, in a case where there are a plurality of substituents and the like represented by a specific symbol, or in a case where a plurality of substituents and the like are simultaneously defined, unless described otherwise, respective substituents and the like may be identical to or different from each other. The same is also applied to the definition of the number of substituents and the like. In a case where a plurality of substituents and the like are near (particularly, adjacent to each other), unless described otherwise, the substituents and the like may be linked to each other to form a ring.

In the present invention, in a case where a plurality of repeating units represented by the same chemical structure in the polymer are present, the respective repeating units present in the polymer may be identical to or different from each other. The same applies to each group forming the repeating unit.

In the present invention, in a case where the number of carbon atoms of a group is limited, the number of carbon atoms of the group means the total number of carbon atoms including a substituent, unless described otherwise.

In the present invention, in the case where the group can form an acyclic skeleton and a cyclic skeleton, unless described otherwise, the group includes an acyclic skeleton group and a cyclic skeleton group. For example, the alkyl group includes a linear alkyl group, a branched alkyl group, and a cyclic (cyclo) alkyl group. In a case where the group can form a cyclic skeleton, the lower limit of the number of atoms of the group forming the cyclic skeleton is 3 or more and preferably 5 or more, regardless of the lower limit of the number of atoms specifically described for this group. The cycloalkyl group includes a bicycloalkyl group, a tricycloalkyl group, and the like.

Preferred embodiments of the present invention will be described below, but the present invention is not limited thereto.

[Organic Semiconductor Element]

In the organic semiconductor element of the present invention, an organic semiconductor layer thereof is formed by using the polymer of the present invention described later.

The organic semiconductor element of the present invention is not particularly limited, but is preferably used as a non-luminescent organic semiconductor device. The non-luminescent organic semiconductor device means a device which does not have a purpose of emitting light. Examples of the device include an organic thin film transistor element which controls the amount of current or the amount of voltage, an organic photoelectric conversion element which converts light energy into electric power (such as a solid-state imaging element for light sensors or a solar cell for energy conversion), an organic thermoelectric conversion element which converts thermal energy into electric power, a gas sensor, an organic rectifying element, an organic inverter, and an information recording element. The non-luminescent organic semiconductor device preferably causes the organic semiconductor film to function as an electronic element.

As a representative example of the organic semiconductor element, an organic thin film transistor element will be described. An aspect in which the polymer of the present invention constitutes the organic semiconductor layer of the organic thin film transistor element will be described below, but the present invention is not limited to the aspect. That is, any organic semiconductor element in an aspect in which an organic semiconductor layer contains the polymer of the present invention described later is included in the organic semiconductor element of the present invention. In addition, the organic semiconductor layer of various elements can be formed by the method of forming the organic semiconductor layer in the organic thin film transistor element described below.

In addition, in the following description of the organic thin film transistor element, the improvement and maintenance of carrier mobility are mentioned, but the carrier mobility is basic characteristics of an organic semiconductor. The organic semiconductor having high carrier mobility and capable of suppressing the decrease of carrier mobility is not limited to the organic thin film transistor element, and can exhibit desired performances even in a case of being applied to each of the above-described organic semiconductor elements.

<Organic Thin Film Transistor Element>

The organic thin film transistor element (also referred to as an organic TFT element) of the present invention includes an organic semiconductor film (also referred to as an organic semiconductor layer or a semiconductor active layer). As a result, the organic TFT element of the present invention exhibits high carrier mobility and can effectively suppress a decrease over time even in the atmosphere, thereby driving stably.

In the present invention, the ambient temperature or humidity in the atmosphere is not particularly limited as long as a temperature or humidity in the usage environment of the organic thin film transistor element, and examples thereof include room temperature (20° C.) as a temperature and 10 to 90 RH % as a humidity.

The organic TFT element of the present invention is preferably used as an organic field effect transistor element (field effect transistor (FET)) and more preferably used as an insulated gate type FET in which the gate and the channel are insulated.

The thickness of the organic thin film transistor element of the present invention is not particularly limited, but in a case of a thinner transistor element, for example, the thickness of the entire transistor element is preferably 0.1 to 0.5 µm.

The organic TFT element of the present invention has the organic semiconductor film of the present invention, and can further have a source electrode, a drain electrode, a gate electrode, and a gate insulating film.

The organic TFT element of the present invention includes a gate electrode, an organic semiconductor layer, a gate insulating layer provided between the gate electrode and the organic semiconductor layer, and a source electrode and a drain electrode which are provided in contact with the organic semiconductor layer and are linked to each other through the organic semiconductor layer, on a substrate. In the organic TFT element, the organic semiconductor layer and the gate insulating layer are provided to be adjacent to each other.

The structure of the organic thin film transistor element of the present invention is not particularly limited as long as the above respective layers are provided. For example, the organic TFT element may have any structures of a bottom contact type (a bottom gate-bottom contact type and a top gate-bottom contact type) or a top contact type (a bottom gate-top contact type and a top gate-top contact type). The organic thin film transistor element of the present invention is more preferably a bottom gate-bottom contact type or a bottom gate-top contact type (these are collectively referred to as a bottom gate type).

Hereinafter, an example of the organic TFT element of the present invention will be described with reference to the drawings.

—Bottom Gate-Bottom Contact Type Organic Thin Film Transistor Element—

FIG. 1 is a cross-sectional schematic view of a bottom gate-bottom contact type organic TFT element 100 which is an example of the semiconductor element of the present invention.

As illustrated in FIG. 1, the organic TFT element 100 has a substrate (base material) 10, a gate electrode 20, a gate insulating film 30, a source electrode 40 and a drain electrode 42, an organic semiconductor film 50, and a sealing layer 60, in this order.

Hereinafter, a substrate (base material), a gate electrode, a gate insulating film, a source electrode, a drain electrode, an organic semiconductor film, a sealing layer, and a manufacturing method thereof will be described in detail.

(Substrate)

The substrate acts as supporting the gate electrode, the source electrode, the drain electrode, and the like described later.

The types of the substrate are not particularly limited, and examples thereof include a plastic substrate, a silicon substrate, a glass substrate, or a ceramic substrate. Among these, from the viewpoint of applicability to each device and costs, a glass substrate or a plastic substrate is preferable.

The thickness of the substrate is not particularly limited, but is, for example, preferably 10 mm or less, more preferably 2 mm or less, and particularly preferably 1.5 mm or less. Meanwhile, the thickness is preferably 0.01 mm or more and more preferably 0.05 mm or more.

(Gate Electrode)

As the gate electrode, a general electrode which is used as a gate electrode of an organic TFT element can be applied without particular limitation.

A material (electrode material) for forming the gate electrode is not particularly limited, and examples thereof include metals such as gold, silver, aluminum, copper, chromium, nickel, cobalt, titanium, platinum, magnesium, calcium, barium, and sodium, conductive oxides such as $InO_2$, $SnO_2$, and indium tin oxide (ITO), conductive polymers such as polyaniline, polypyrrole, polythiophene, polyacetylene, and polydiacetylene, semiconductors such as silicon, germanium, and gallium arsenide, and carbon materials such as fullerene, carbon nanotube, and graphite. Among these, the above-described metals are preferable, and silver or aluminum is more preferable.

The thickness of the gate electrode is not particularly limited, but is preferably 20 to 200 nm.

The gate electrode may function as the substrate, and in this case, the above-described substrate may not be provided.

The method of forming the gate electrode is not particularly limited, and examples thereof include a method of performing vacuum deposition (hereinafter, simply referred to as vapor deposition) of or sputtering the above-described electrode material on the substrate, and a method of applying or printing a composition for forming an electrode, which contains the above-described electrode material, on the substrate. In addition, in a case of patterning the electrode, examples of the patterning method include printing methods such as inkjet printing, screen printing, offset printing, and relief printing (flexographic printing), a photolithography method, and a mask vapor deposition method.

(Gate Insulating Layer)

The gate insulating layer is not particularly limited as long as the gate insulating layer is a layer having insulating properties, and may be a single layer or a multilayer.

The gate insulating layer is preferably formed of an insulating material. The insulating material is not particularly limited, and examples thereof include polymers such as polymethyl methacrylate, polystyrene, polyvinyl phenol, melamine resin, polyimide, polycarbonate, polyester, polyvinyl alcohol, polyvinyl acetate, polyurethane, polysulfone, polybenzoxazole, polysilsesquioxane, epoxy resin, and phenol resin, inorganic oxides such as silicon dioxide, aluminum oxide, and titanium oxide, and nitrides such as silicon nitride. Among these, from the viewpoint of congeniality with the organic semiconductor film, the above-described polymers are preferable, and from the viewpoint of uniformity of the film, the above-described inorganic oxides, particularly silicon dioxide, are preferable.

These materials may be used singly, and two or more kinds thereof may be used in combination.

The film thickness of the gate insulating film is not particularly limited, but is preferably 100 to 1,000 nm.

The method of forming the gate insulating film is not particularly limited, and examples thereof include a method of applying a composition for forming a gate insulating film, which contains the above-described material, on the substrate on which the gate electrode is formed, and a method of performing vapor deposition of or sputtering the above-described material.

(Source Electrode and Drain Electrode)

In the organic TFT element of the present invention, the source electrode is an electrode in which a current flows from the outside through a wiring. In addition, the drain electrode is an electrode in which a current is sent to the outside through a wiring.

As materials for forming the source electrode and the drain electrode, the same materials as the electrode material for forming the above-described gate electrode can be used. Among these, metal is preferable, and molybdenum, chromium, gold, or silver is more preferable.

The thicknesses of the source electrode and the drain electrode are not particularly limited, but are respectively preferably 1 nm or more and particularly preferably 10 nm or more. In addition, the thicknesses are preferably 500 nm or less and particularly preferably 300 nm or less.

The distance (gate length) L between the source electrode and the drain electrode may be appropriately determined, but for example, the distance L is preferably 200 μm or less and particularly preferably 100 μM or less. In addition, the gate width W may be appropriately determined, but for example, the gate width W is preferably 5000 μM or less and particularly preferably 1000 μm or less. Furthermore, a ratio of the gate width W to the gate length L is not particularly limited, but for example, the ratio W/L is preferably 10 or more and more preferably 20 or more.

The method of forming the source electrode and the drain electrode is not particularly limited, and examples thereof include a method of performing vacuum deposition of or sputtering the electrode material on the substrate on which the gate electrode and the gate insulating film are formed, and a method of applying or printing a composition for forming an electrode on the substrate. In a case of patterning, the patterning method is the same as the method of the gate electrode described above.

(Organic Semiconductor Layer)

The organic semiconductor layer in the organic TFT element contains a specific polymer (sometimes referred to as the polymer of the present invention) having a repeating unit including a structure represented by Formula (1).

In the present invention, the expression "polymer" is used in a meaning of including an oligomer (for example, an oligomer having about 2 to 10 repeating units). That is, the expression "polymer" is meant to include all compounds having two or more repeating units including a structure represented by Formula (1).

The organic semiconductor layer containing the polymer of the present invention can impart to the organic thin film transistor element high carrier mobility and durability for maintaining the carrier mobility even in the atmosphere. The reason is not clear in detail, but is considered as follows. The polymer of the present invention has a repeating unit including a structure represented by Formula (1), in which at least one of ring-constituting carbon atoms forming a 3,4,9,10-perylene bisimide skeleton is substituted with a nitrogen atom, and does not have a repeating unit including an aliphatic 7-membered ring structure. Therefore, due to the π-π interaction between the repeating units (particularly, the polymer chains) having high planarity, it is considered that the polymer of the present invention has improved n-type semiconductor property. In addition, even in a case of being exposed to oxygen gas or moisture in the atmosphere, it is considered that the deterioration of the organic semiconductor layer (decomposition of the polymer of the present invention) due to these is effectively suppressed. Therefore, in a case where the polymer of the present invention is used for the organic thin film transistor element, carrier mobility can be improved to a high level, and the decrease over time can be suppressed even in the atmosphere.

The polymer of the present invention is preferably used as an organic semiconductor material of the organic thin film transistor element among organic semiconductor elements.

(Polymer of Present Invention)

The polymer of the present invention has a repeating unit (sometimes referred to as a repeating unit (I)) including a structure represented by Formula (1).

—Repeating unit (I) including structure represented by Formula (1)—

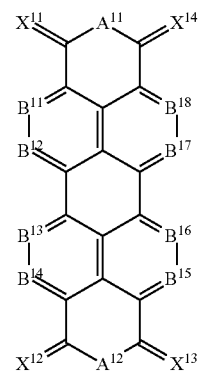

(1)

In Formula (1), $A^{11}$ and $A^{12}$ respectively represent —O—, —N($R^N$)—, or —P($R^N$)—. $A^{11}$ and $A^{12}$ are each preferably —N($R^N$)—. $A^{11}$ and $A^{12}$ may be identical to or different from each other, but are preferably identical to each other and more preferably —N($R^N$)—.

$R^N$ represents a hydrogen atom or a substituent, and can adopt a single bond or a linking group for incorporating into the polymer of the present invention. The details will be described later.

The substituent which can be adopted as $R^N$ is not particularly limited. Examples thereof include a group selected from the following substituent group Z.

Substituent Group Z

Examples thereof include a halogen atom (for example, a fluorine atom, a chlorine atom, a bromine atom, or an iodine atom, and a fluorine atom or a chlorine atom is preferable); an alkyl group (having preferably 1 (3) to 40 carbon atoms, more preferably 1 (3) to 40 carbon atoms, and particularly preferably 4 to 30 carbon atoms, in which the number in parentheses indicates the number of carbon atoms in a case of a cycloalkyl group; examples of the alkyl group include methyl, ethyl, propyl, 2-methylpropyl, butyl, amyl, pentyl, 2,2-dimethylpropyl, hexyl, heptyl, octyl, nonyl, decyl, undecyl, dodecyl, tridecyl, tetradecyl, pentadecyl, 2,6-dimethyloctyl, icosyl, 2-decyltetradecyl, 2-hexyldodecyl, 2-ethyloctyl, 2-butyldecyl, 1-octylnonyl, 2-ethyloctyl, 2-octyldecyl, 2-octyldodecyl, 7-hexylpentadecyl, 2-octyltetradecyl, 2-ethylhexyl, cyclopropyl, cyclobutyl, cyclopentyl, cyclohexyl, adamantyl, benzyl, p-chlorobenzyl, trifluoromethyl, perfluoroethyl, 2,2,3,3,4,4,4-heptafluobutyl, $C_5F_{11}C_2H_4$—, 3-aminopropyl, 4-aminobutyl, 5-ethoxypentyl, (meth)acryloxypropyl, (meth)acryloxypentyl, 4-hydroxybutyl, 4-sulfobutyl, 10-phosphonodecyl, 2-hydroxyethoxymethyl, 2-imidazolylethoxymethyl, and 4-(N,N-dimethylamino)butyl); an alkenyl group (having preferably 2 to 20 carbon atoms, more preferably 2 to 12 carbon atoms, and particularly preferably 2 to 8 carbon atoms; examples thereof include vinyl, allyl, 2-butenyl, 1-pentenyl, and 4-pentenyl) an alkynyl group (having preferably 2 to 20 carbon atoms, more preferably 2 to 12 carbon atoms, and particularly preferably 2 to 8 carbon atoms; examples thereof include propargyl, 1-pentynyl, trimethylsilylethynyl, triethylsilylethynyl, tri-i-propylsilylethynyl, and 2-p-propylphenylethynyl); an aryl group (having preferably 6 to 20 carbon atoms and more preferably 6 to 12 carbon atoms; examples thereof include phenyl, naphtyl, 2,4,6-trimethylphenyl, p-(t-butyl)phenyl, 4-methyl-2,6-dipropylphenyl, 4-fluorophenyl, 4-trifluoromethylphenyl, p-pentylphenyl, p-octylphenyl, 3,4-dipentylphenyl, p-heptoxyphenyl, and 3,4-diheptoxyphenyl); a heterocyclic group (including at least one heteroatom and 1 to 30 carbon atoms as ring-constituting atoms; examples of the heteroatom include a nitrogen atom, an oxygen atom, and a sulfur atom; the number of heteroatoms is not particularly limited, but for example, 1 or 2; the number of ring-constituting carbon atoms is preferably 3 to 20 and more preferably 3 to 12; as the heterocyclic group, a 5-membered ring, a 6-membered ring, or a fused ring thereof is preferable; the heterocyclic group includes an aromatic heterocyclic group (heteroaryl group) and an aliphatic heterocyclic group; examples of the heterocyclic group include thienyl, thiazolyl, imidazolyl, pyridyl, pyrimidinyl, quinolyl, furanyl, selenophenyl ($C_4H_3Se$), piperidyl, morpholino, benzoxazolyl, benzimidazolyl, benzothiazolyl, 2-hexyl furanyl, pyranyl, and tetrahydropyranyl);

a silyl group (having preferably 3 to 40 carbon atoms, more preferably 3 to 30 carbon atoms, and particularly preferably 3 to 24 carbon atoms; examples thereof include trimethylsilyl, triphenylsilyl, and dimethylphenylsilyl); an alkoxy group (having preferably 1 to 30 carbon atoms, more preferably 1 to 12 carbon atoms, and particularly preferably 1 to 8 carbon atoms; examples thereof include methoxy, ethoxy, and butoxy); an amino group (having preferably 0 to 20 carbon atoms, more preferably 0 to 10 carbon atoms, and particularly preferably 0 to 6 carbon atoms; examples thereof include amino, methylamino, dimethylamino, diethylamino, dibenzylamino, and anilino); an aryloxy group (having preferably 6 to 20 carbon atoms, more preferably 6 to 16 carbon atoms, and particularly preferably 6 to 12 carbon atoms; examples thereof include phenyloxy and 2-naphtyloxy); an acyl group (having preferably 1 to 20 carbon atoms, more preferably 1 to 16 carbon atoms, and particularly preferably 1 to 12 carbon atoms; examples thereof include acetyl, hexanoyl, benzoyl, formyl, and pivaloyl); an alkoxycarbonyl group (having preferably 2 to 20 carbon atoms, more preferably 2 to 16 carbon atoms, and particularly preferably 2 to 12 carbon atoms; examples thereof include methoxycarbonyl and ethoxycarbonyl); an aryloxycarbonyl group (having preferably 7 to 20 carbon atoms, more preferably 7 to 16 carbon atoms, and particularly preferably 7 to 10 carbon atoms; examples thereof include phenyloxycarbonyl); an acyloxy group (having preferably 2 to 20 carbon atoms, more preferably 2 to 16 carbon atoms, and particularly preferably 2 to 10 carbon atoms; examples thereof include acetoxy, benzoyloxy, and (meth)acryloyloxy); an acylamino group (having preferably 2 to 20 carbon atoms, more preferably 2 to 16 carbon atoms, and particularly preferably 2 to 10 carbon atoms; examples thereof include acetylamino and benzoylamino); an aminocarbonylamino group (having preferably 2 to 20 carbon atoms, more preferably 2 to 16 carbon atoms, and particularly preferably 2 to 12 carbon atoms; examples thereof include an ureido group); an alkoxy or aryloxycarbonylamino group (having preferably 2 (7) to 20 carbon atoms, more preferably 2 (7) to 16 carbon atoms, and particularly preferably 2 (7) to 12 carbon atoms; the number in parentheses indicates the number of carbon atoms in the aryloxycarbonylamino group; examples thereof include methoxycarbonylamino and phenyloxycarbonylamino); alkyl or arylsulfonylamino; an alkylthio group (having preferably 1 to 20 carbon atoms, more preferably 1 to 16 carbon atoms, and particularly preferably 1 to 12 carbon atoms; examples thereof include methylthio, ethylthio, and octylthio); an arylthio group (having preferably 6 to 20 carbon atoms, more preferably 6 to 16 carbon atoms, and particularly preferably 6 to 12 carbon atoms; examples thereof include a phenylthio group); an alkyl or arylsulfinyl group; an alkyl or arylsulfonyl group; a silyloxy group; a heterocyclic oxy group (a group in which an —O— group is bonded to the heterocyclic group); a carbamoyl group; a carbamoyloxy group; a heterocyclic thio group (a group in which an —S— group is bonded to the heterocyclic group); a sulfamoyl group; an aryl or heterocyclic azo group (the heterocyclic azo group is a group in which an azo group is bonded to the heterocyclic group); an imido group; a phosphino group; a phosphinyl group; a phosphinyloxy group; a phosphinylamino group; a hydrazino group; an imino group; a cyano group; a hydroxy group; a nitro group; a mercapto group; a sulfo group; a carboxy group; a hydroxamic acid group; a sulfino group; a boronic acid group (—$B(OH)_2$); a phosphate group (—$OPO(OH)_2$); a phosphono group (—$PO(OH)_2$); and a sulfate group (—$OSO_3H$).

Among these, as the group selected from the above-described substituent group Z, which can be adopted as $R^N$, an alkyl group, an aryl group, an alkenyl group, an alkynyl group, a heterocyclic group, or a silyl group is preferable, an alkyl group (preferably having 1 to 24 carbon atoms), an aryl group (preferably having 6 to 20 carbon atoms), or a heteroaryl group (including at least one heteroatom as a ring-constituting atom; preferably a 5-membered ring, a 6-membered ring, or a fused ring thereof; the number of ring-constituting carbon atoms is preferably 3 to 20) is more preferable, and an alkyl group (particularly preferably having 4 to 24 carbon atoms) is still more preferable.

The group selected from the substituent group Z may further have a substituent. Examples of such a substituent include groups selected from the substituent group Z.

In the group which further has a substituent (also referred to as a group obtained by combining these substituents), the number of substituents which may be further included is, for example, preferably 1 to 6 and more preferably 1 to 3.

The group obtained by combining these substituents is not particularly limited, and examples thereof include a group obtained by substituting each of the preferred groups selected from the substituent group Z with another group selected from the substituent group Z. Specific examples thereof include an alkyl group having, as a substituent, a group selected from the group consisting of a halogen atom, an alkyl group, an aryl group, a heterocyclic group (heteroaryl group), an alkoxy group (for example, a hydroxyalkoxy group, a halogenated alkoxy group, or a heteroarylalkoxy group), an amino group, an acyloxy group, a hydroxy group, a sulfate group, and a phosphono group; and an alkynyl group having, as a substituent, a halogenated aryl group, a (fluorinated) alkyl aryl group, or a silyl group. Furthermore, examples thereof also include a group obtained by removing one hydrogen atom from the repeating unit including the structure represented by Formula (1).

More specifically, examples thereof include the group described as the examples of the substituent group Z, an exemplary compound described below, or a group in a compound used in Examples.

Among these, as the group obtained by combining these substituents, an alkyl group having an alkoxy group as a substituent or an alkyl group having an aryl group as a substituent is preferable, and an alkyl group having an alkoxy group as a substituent is particularly preferable.

As the substituent which can be adopted as $R^N$, an (unsubstituted) alkyl group or an alkyl group having an alkoxy group as a substituent is more preferable.

In a case where $A^{11}$ and $A^{12}$ respectively have $R_N$, two $R_N$'s may be identical to or different from each other.

In Formula (1), $B^{11}$ to $B^{18}$ respectively represent —N═ or —C($R^M$)═. Here, $R^M$ represents a hydrogen atom or a substituent, and preferably a hydrogen atom. $R^M$ can adopt a single bond or a linking group for incorporating into the polymer of the present invention, other than a hydrogen atom or a substituent. The details will be described later.

The substituent which can be adopted as $R^M$ is not particularly limited, and examples thereof include groups selected from the substituent group Z. The group selected from the substituent group Z may further have a substituent. Examples of such a substituent include groups selected from the substituent group Z. Examples of the group which further has a substituent include the above-described group obtained by combining these substituents, which can be adopted as $R^N$. Specific examples thereof include the above-described group, a group consisting of a perylene bisimide skeleton in which, in Formula (1), at least one ring-constituting carbon atom is substituted with a nitrogen atom, and a group having a methine group which is bonded to a carbon atom of the perylene bisimide skeleton.

Among these, as the substituent which can be adopted as $R^M$, an alkyl group, an alkenyl group, an alkoxycarbonyl group, an aryl group, an alkoxy group, a heterocyclic group (particularly, heteroaryl group), an amino group, a halogen atom, a cyano group, a carboxy group, a nitro group, or a mercapto group is preferable, an alkyl group, an alkenyl group, an aryl group, an alkoxy group, a heterocyclic group (particularly, heteroaryl group), a halogen atom, or a cyano group is more preferable, and an alkyl group, an aryl group, a heterocyclic group (particularly, heteroaryl group), a halogen atom, or a cyano group is particularly preferable.

The substituent which can be adopted as $R^M$ may form a ring. Examples of an aspect in which the substituent forms a ring include an aspect in which substituents are bonded to each other to form a ring and an aspect in which one atom is shared by a plurality of substituents to form a ring.

Examples of the aspect in which substituents are bonded to each other to form a ring include an aspect in which two vinyl groups are bonded to each other to form a benzene ring together with a carbon atom to which $R^M$ is bonded. In addition, examples of the aspect in which one atom is shared by a plurality of substituents to form a ring include an aspect in which two substituents are combined to form a thioether group (—S— group).

At least one of $B^{11}$ to $B^{18}$ is —N=, and it is preferable that one to four of $B^{11}$ to $B^{18}$ represent —N=, it is more preferable that one or two of $B^{11}$ to $B^{18}$ represent —N=, and it is more preferable that two of $B^{11}$ to $B^{18}$ represent —N=.

B which can adopt —N= is not particularly limited, and any one of $B^{11}$ to $B^{18}$ may be —N=. For example, it is preferable that at least one of $B^{12}$, $B^{13}$, $B^{16}$, or $B^{17}$ is —N=, and it is more preferable that any one or both of $B^{12}$ and $B^{16}$ is —N=.

In —N= which can be adopted as $B^{11}$ to $B^{18}$, the nitrogen atom may have a substituent. Examples of the substituent include an N-oxide group (N→O group and a salt having a counter anion.

In the repeating unit (I), at least one of $R^N$ in —N($R^N$)— or —P($R^N$)— which can be adopted as $A^{11}$ and $A^{12}$ or $R^M$ in C($R^M$)= which can be adopted as $B^{11}$ to IV represents a single bond or a linking group, and the other represents a hydrogen atom or a substituent. A single bond or a linking group which can be adopted as at least one of $R^N$ or $R^M$ is usually bonded to other repeating unit forming the polymer of the present invention. Since $R^N$ and $R^M$ adopt a single bond or a linking group, the structure represented by Formula (1) is a repeating unit of a desired polymer. In a case where $R^N$ and $R^M$ adopt a single bond or a linking group, a single bond is preferable.

It is sufficient that the number of adoption of single bonds or linking groups in a plurality of $R^N$ and $R^M$ ($B^{11}$ to $B^{18}$) is one or more, and for example, the number of adoption of single bonds or linking groups in a plurality of $R^N$ and $R^M$ ($B^{11}$ to $B^{18}$) is preferably 1 to 4, more preferably 1 or 2, and still more preferably 2.

In a plurality of $R^N$ and $R^M$, $R^N$ and $R^M$ which adopt a single bond or a linking group may be any of $A^{11}$, $A^{12}$, or $B^{11}$ to $B^{18}$ ($R^N$ or $R^M$ bonded to these). Examples thereof include $A^{11}$, $A^{12}$, $B^{12}$, $B^{13}$, $B^{16}$, and $B^{17}$. In a case where one of $R^N$ and $R^M$ adopts a single bond or a linking group, $A^{11}$ or $A^{12}$ is preferable. In a case where two of $R^N$ and $R^M$ adopt a single bond or a linking group, $A^{11}$ and $A^{12}$, or $B^{13}$ and $B^{17}$ is preferable.

A combination of B adopting —N= and B adopting a single bond or a linking group is not particularly limited, but is preferably a combination of the above-mentioned preferred B's, and more preferably a combination in which $B^{12}$ and $B^{16}$ adopt —N= and $B^{13}$ and $B^{17}$ adopt a single bond or a linking group. In a case where at least one of $R^N$'s in $A^{11}$ and $A^{12}$ adopts a single bond or a linking group, all of $B^{11}$ to $B^{18}$ can adopt —N=, and a preferred aspect in which $B^{11}$ to $B^{18}$ adopt —N= is as described above.

The linking group which can be adopted as $R^N$ or $R^M$ is not particularly limited as long as a site consisting of a linking group capable of incorporating the structure represented by Formula (1) into a polymer. Examples of such a linking group include a divalent group in which one hydrogen atom is removed from the above-described substituent which can be adopted as $R^N$ or $R^M$, and an alkylene group, —C(=O)—NH—, —C(=O)—O—, or the like is preferable.

In Formula (1), $X^{11}$ to $X^{14}$ respectively represent an oxygen atom or a sulfur atom, and an oxygen atom is preferable. It is more preferable that all of $X^{11}$ to $X^{14}$ is an oxygen atom.

Here, a combination of $A^{11}$ and $A^{12}$, and $X^{11}$ to $X^{14}$ is not particularly limited, but is preferably a combination in which $A^{11}$ and $A^{12}$ are —N($R^N$)— and all of $X^{11}$ to $X^{14}$ are oxygen atoms.

It is preferable that the repeating unit including the structure represented by Formula (1) is a repeating unit including a structure represented by Formula (2).

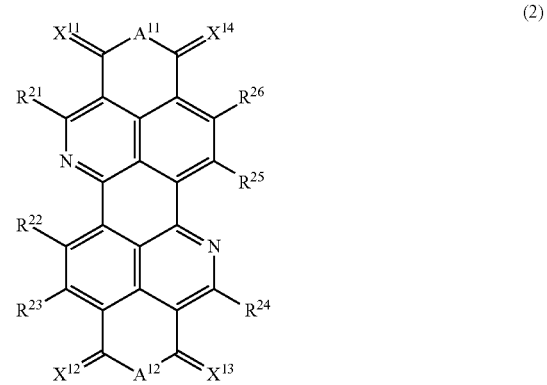

In Formula (2), $A^{11}$, $A^{12}$, and $X^{11}$ to $X^{14}$ respectively have the same meaning as $A^{11}$, $A^{12}$, and $X^{11}$ to $X^{14}$ in Formula (1), and preferred aspects are also the same. In addition, preferred combinations of $A^{11}$, $A^{12}$, and $X^{11}$ to $X^{14}$ are also as described above.

$R^{21}$ to $R^{26}$ respectively represent a hydrogen atom or a substituent. A substituent which can be adopted as $R^{21}$ to $R^{26}$ is the same meaning as the substituent which can be adopted as $R^M$, and preferred aspects are also the same. In order to form a ring, $R^{21}$ to $R^{26}$ may be bonded to each other, or may be bonded to a carbon atom forming an isoquinolino quinoline skeleton.

In Formula (2), at least one of $R^N$ in —N($R^N$)— or —P($R^N$)— which can be adopted as $A^{11}$ and $A^{12}$, or $R^{21}$ to $R^{26}$ represents a single bond or a linking group. An aspect in which at least one of $R^N$ and $R^{21}$ to $R^{26}$ adopts a single bond or a linking group is the same as the aspect in which $R^N$ and $R^M$ adopt a single bond or a linking group. Among these, it is particularly preferable that $R^{22}$ and $R^{25}$ adopt a single bond or a linking group.

It is preferable that the repeating unit including the structure represented by Formula (1) and the repeating unit including the structure represented by Formula (2) are respectively a repeating unit including a structure represented by Formula (3-1) and a repeating unit including a structure represented by Formula (3-2).

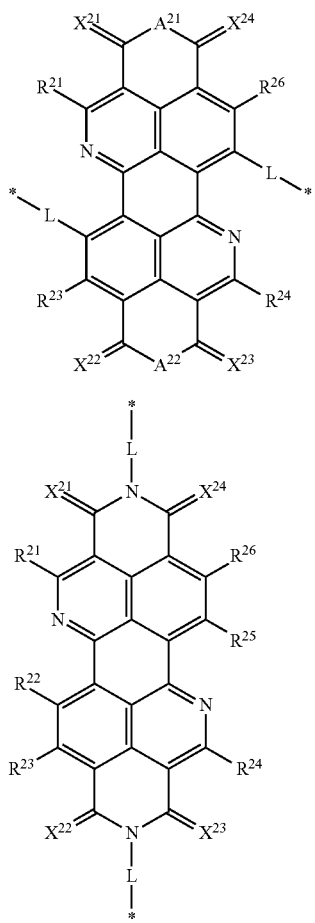

(3-1)

(3-2)

In Formula (3-1) and Formula (3-2), $A^{21}$, $A^{22}$, and $X^{21}$ to $X^{24}$ respectively have the same meaning as $A^{11}$, $A^{12}$, and $X^{11}$ to $X^{14}$ in Formula (1), and preferred aspects are also the same. In addition, preferred combinations of $A^{21}$, $A^{22}$ and $X^{21}$ to $X^{24}$ are also the same as the preferred combinations of $A^{11}$, $A^{12}$ and $X^{11}$ to $X^{14}$.

$R^{21}$ to $R^{26}$ respectively represent a hydrogen atom or a substituent. A substituent which can be adopted as $R^{21}$ to $R^{26}$ is the same meaning as the substituent which can be adopted as $R^M$, and preferred aspects are also the same. In order to form a ring, $R^{21}$ to $R^{26}$ may be bonded to each other, or may be bonded to a carbon atom forming an isoquinolino quinoline skeleton.

Each L represents a single bond or a linking group. The linking group which can be adopted as L has the same meaning as the linking group which can be adopted as $R^N$ or $R^M$, and preferred aspects are also the same.

* represents a linking site.

In the present invention, an aspect in which the repeating unit (I) includes the structure represented by Formula (I) includes an aspect in which the repeating unit (I) has the structure represented by Formula (1) as a partial structure of the repeating unit, in addition to an aspect in which the repeating unit consists of only the structure represented by Formula (1).

An aspect in which the repeating unit (I) is incorporated (introduced) into the polymer is not particularly limited. That is, examples thereof include an aspect in which the structure represented by Formula (1) is bonded to the other repeating unit forming the polymer of the present invention and incorporated into a polymer chain (forms a polymer chain), an aspect in which the structure represented by Formula (1) is incorporated into a side chain (such as a graft chain or a pendant chain) of the repeating unit forming the polymer chain of the present invention, an aspect in which the structure represented by Formula (1) is incorporated into a bridge site (crosslinking site) of the polymer chain of the present invention, and an aspect obtained by combining these aspects. In the present invention, an aspect incorporated into the polymer chain is preferable.

In the aspects in which the structure represented by Formula (1) is incorporated into the side chain and the structure represented by Formula (1) is incorporated into the crosslinking site, the polymer chain (referring to a main chain of the side chain and the crosslinking site) into which the structure represented by Formula (1) is incorporated is not particularly limited, and appropriately determined in consideration of polymerizability with other repeating units, ease of incorporating the structure represented by Formula (1), and the like. Examples thereof include a (meth)acrylic acid ester polymer, a (meth)acrylic acid amide polymer, a urethane polymer, a polyester polymer, and a polymer obtained by combining these polymers.

Specific examples of the repeating unit (I) are shown below, but the present invention is not limited thereto.

In the following specific examples, a repeating unit in which all of $A^{11}$ and $A^{12}$ is —N($R^N$)— or —P($R^N$)— is shown, but specific examples thereof also include a compound in which any one or both of $A^{11}$ and $A^{12}$ is substituted with —O—. Here, examples of $R^N$ in —P($R^N$)— include the same group as $R^{N1}$ or $R^{N2}$ in the specific examples.

In the following specific examples, * represents a bonding site. Wavy lines in the columns of $R^{N1}$ and $R^{N2}$ represent a compound part in which $R^{N1}$ or $R^{N2}$ is removed from perylene bisimide compounds of the specific examples, and wavy lines in the columns of $R^{21}$ and $R^{25}$ to $R^{28}$ represent a compound part in which corresponding R is removed from perylene bisimide compounds of the specific examples. In addition, TIPS represents triisopropylsilyl.

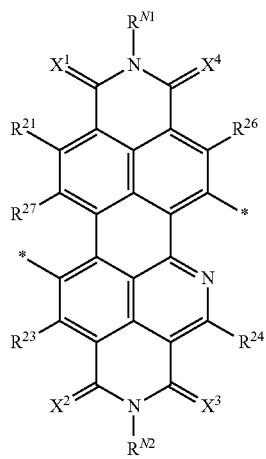

| No. | X¹ | X² | X³ | X⁴ | $R^{21}$ | $R^{27}$ | $R^{23}$ | $R^{24}$ | $R^{26}$ | $R^{N1}$ | $R^{N2}$ |
|---|---|---|---|---|---|---|---|---|---|---|---|
| 101 | O | O | O | O | H | H | H | H | H | H | H |
| 102 | O | O | O | O | H | H | H | H | H | $CH_3$ | $CH_3$ |
| 103 | O | O | O | O | H | H | H | H | H | $nC_6H_{13}$ | $nC_6H_{13}$ |
| 104 | O | O | O | O | H | H | H | H | H | cyclohexyl | cyclohexyl |
| 105 | S | S | O | O | H | H | H | H | H | cyclohexyl | cyclohexyl |
| 106 | O | O | S | S | H | H | H | H | H | cyclohexyl | cyclohexyl |
| 107 | O | S | S | O | H | H | H | H | H | cyclohexyl | cyclohexyl |
| 108 | O | O | O | O | H | H | H | H | H | $CH_2C_3F_7$ | $CH_2C_3F_7$ |
| 109 | O | O | O | O | H | H | H | H | H | -isoPropyl | -isoPropyl |
| 110 | O | O | O | O | H | H | H | H | H | -tert-Butyl | -tert-Butyl |
| 111 | S | S | O | O | H | H | H | H | H | $CH(C_8H_{17})_2$ | $CH(C_8H_{17})_2$ |
| 112 | O | O | O | O | H | H | H | H | H | $CH(C_8H_{17})_2$ | $CH(C_8H_{17})_2$ |
| 113 | O | O | O | O | H | H | H | H | H | $C_2H_4C_5F_{11}$ | $C_2H_4C_5F_{11}$ |
| 114 | O | O | O | O | Cl | Cl | Cl | Cl | Cl | cyclohexyl | cyclohexyl |

-continued
| No. | $X^1$ | $X^2$ | $X^3$ | $X^4$ | $R^{21}$ | $R^{27}$ | $R^{23}$ | $R^{24}$ | $R^{26}$ | $R^{N1}$ | $R^{N2}$ |
|---|---|---|---|---|---|---|---|---|---|---|---|
| 115 | O | O | O | O | F | H | H | F | H | 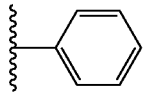 | 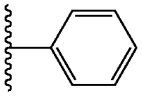 |
| 116 | O | O | O | O | F | F | F | F | F | 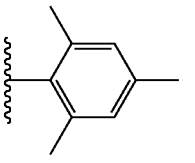 [SMILES: *c1c(C)cc(C)cc1C] | 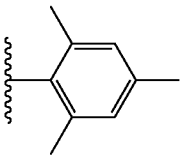 [SMILES: *c1c(C)cc(C)cc1C] |
| 117 | O | O | O | O | CN | H | H | H | CN | 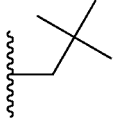 | 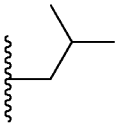 |
| 118 | O | O | O | O | Br | H | H | H | H | 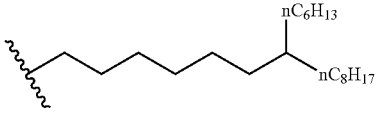 | 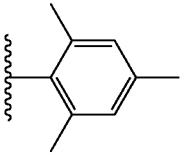 [SMILES: *c1c(C)cc(C)cc1C] |
| 119 | O | O | O | O | $NO_2$ | H | H | H | H | 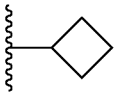 | 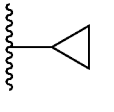 |
| 120 | O | O | O | O | $CH_3$ | $nC_6H_{13}$ | H | H | H | 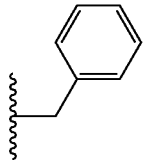 | 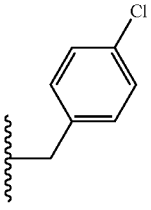 |
| 121 | O | O | O | O | $CO_2CH_3$ | H | H | H | H | 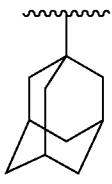 [SMILES: *C12CC3CC(CC(C3)C1)C2] | 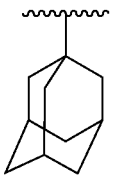 |
| 122 | O | O | O | O | H | —Ph | H | H | H | 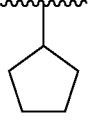 [SMILES: *C1CCCC1] | 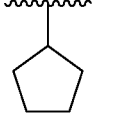 [SMILES: *C1CCCC1] |
| 123 | O | O | O | O | —COOH | H | H | H | H | $CF_3$ | $C_2F_5$ |
| 124 | O | O | O | O | H | $CF_3$ | H | H | H | 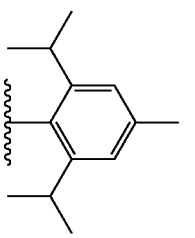 [SMILES: *c1c(C(C)C)cc(C)cc1C(C)C] | 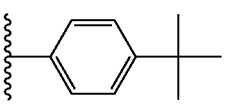 |

-continued
| No. | X¹ | X² | X³ | X⁴ | R²¹ | R²⁷ | R²³ | R²⁴ | R²⁶ | R^{N1} | R^{N2} |
|---|---|---|---|---|---|---|---|---|---|---|---|
| 125 | O | O | O | O | OCH₃ | H | H | H | H | 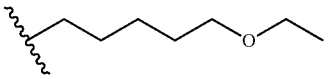 [SMILES: *CCCCCOCC] | 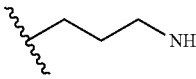 |
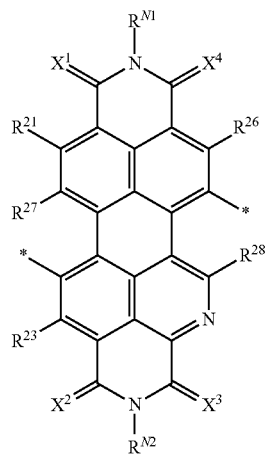
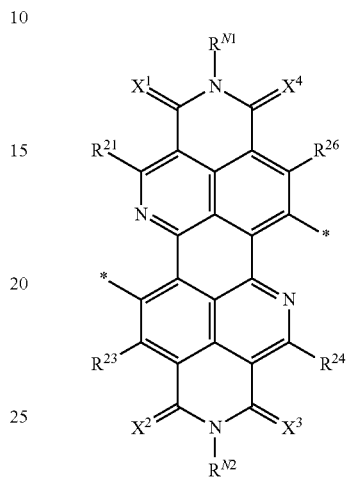
| No. | X¹ | X² | X³ | X⁴ | R²¹ | R²⁷ | R²³ | R²⁸ | R²⁶ | R^{N1} | R^{N2} |
|---|---|---|---|---|---|---|---|---|---|---|---|
| 201 | O | O | O | O | H | H | H | H | H | H | H |
| 202 | O | O | O | O | H | H | H | H | H | CH₃ | CH₃ |
| 203 | O | O | O | O | H | H | H | H | H | 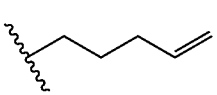 [SMILES: *CCCC=C] | nC₆H₁₃ |
| 204 | O | O | O | O | H | H | H | H | H | 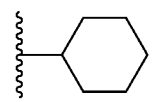 [SMILES: *C1CCCCC1] | 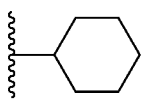 [SMILES: *C1CCCCC1] |
| 205 | S | S | O | O | H | H | H | H | H | nC₁₀H₂₁ | nC₁₀H₂₁ |
| 206 | O | O | S | S | H | H | H | H | H | 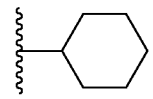 [SMILES: *C1CCCCC1] | 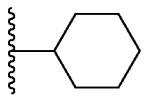 [SMILES: *C1CCCCC1] |
| 207 | O | S | S | O | H | H | H | H | H | 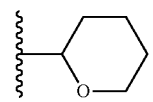 | 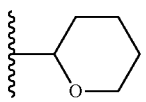 |
| 208 | O | O | O | O |  | H | H | H | H | 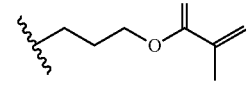 | CH₂C₃F₇ |
| 209 | O | O | O | O | H |  | H |  | H | -isoPropyl | -isoPropyl |
| 210 | O | O | O | O | H | H | H | H | H | 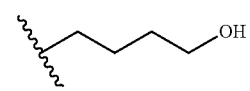 | 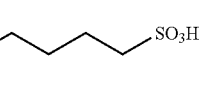 |

| No. | X¹ | X² | X³ | X⁴ | $R^{21}$ | $R^{23}$ | $R^{24}$ | $R^{26}$ | $R^{N1}$ | $R^{N2}$ |
|---|---|---|---|---|---|---|---|---|---|---|
| 301 | O | O | O | O | H | H | H | H | H | H |
| 302 | O | O | O | O | H | H | H | H | $CH_3$ | $CH_3$ |
| 303 | O | O | O | O | H | H | H | H | $nC_6H_{13}$ | $nC_6H_{13}$ |
| 304 | O | O | O | O | H | H | H | H | 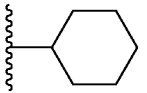 | 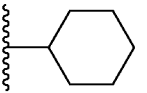 |
| 305 | S | S | O | O | H | H | H | H | 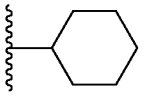 | 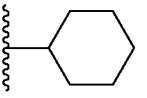 |
| 306 | O | O | S | S | H | H | H | H | 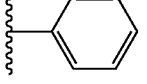 | 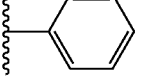 |
| 307 | O | S | S | O | H | H | H | H | 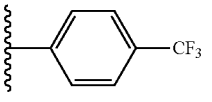 | 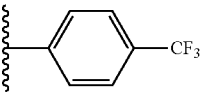 |
| 308 | O | O | O | O | H | H | H | H | $CH_2C_3F_7$ | $CH_2C_3F_7$ |
| 309 | O | O | O | O | H | H | H | H | -isoPropyl | -isoPropyl |
| 310 | O | O | O | O | H | H | H | H | -tert-Butyl | -tert-Butyl |
| 311 | S | S | O | O | H | H | H | H | 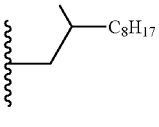 | 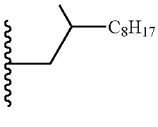 |
| 312 | O | O | O | O | H | H | H | H | 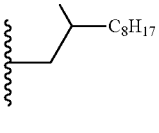 | 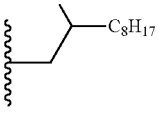 |
| 313 | O | O | O | O | H | H | H | H | $C_2H_4C_5F_{11}$ | $C_2H_4C_5F_{11}$ |
| 314 | O | O | O | O | Cl | Cl | Cl | Cl | 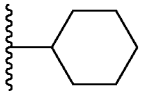 | 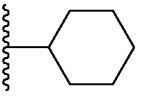 |
| 315 | O | O | O | O | H | H | H | H | 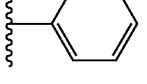 | 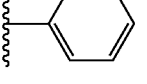 |
| 316 | O | O | O | O | F | F | F | F | 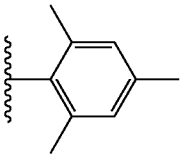 [SMILES: *c1c(C)cc(C)cc1C] | 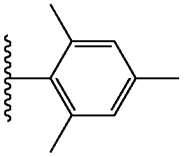 [SMILES: *c1c(C)cc(C)cc1C] |
| 317 | O | O | O | O | H | H | H | H | 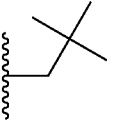 [SMILES: *CC(C)(C)C] | 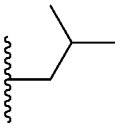 [SMILES: *CC(C)C] |

-continued

| No. | X¹ | X² | X³ | X⁴ | $R^{21}$ | $R^{23}$ | $R^{24}$ | $R^{26}$ | $R^{N1}$ | $R^{N2}$ |
|---|---|---|---|---|---|---|---|---|---|---|
| 318 | O | O | O | O | Br | H | H | H | pentadecyl chain branched with nC₆H₁₃ and nC₈H₁₇ | 2,4,6-trimethylphenyl |
| 319 | O | O | O | O | NO₂ | H | H | H | cyclobutyl | cyclopropyl |
| 320 | O | O | O | O | CH₃ | H | H | H | benzyl | 4-chlorobenzyl |
| 321 | O | O | O | O | CO₂CH₃ | H | H | H | 1-adamantyl | 1-adamantyl |
| 322 | O | O | O | O | H | H | H | —Ph | cyclopentyl | cyclopentyl |
| 323 | O | O | O | O | —COOH | H | H | H | CF₃ | C₂F₅ |
| 324 | O | O | O | O | H | H | H | H | 2,6-diisopropyl-4-methylphenyl | 4-tert-butylphenyl |
| 325 | O | O | O | O | OCH₃ | H | H | H | —(CH₂)₅—O—C₂H₅ | —(CH₂)₃—NH₂ |
| 326 | O | O | O | O | H | H | H | H | 4-fluorophenyl | 4-fluorophenyl |
| 327 | O | O | O | O | H | H | H | H | CF₃ | CF₃ |
| 328 | O | O | O | O | H | H | H | H | nC₈H₁₇ | nC₈H₁₇ |
| 329 | O | O | O | O | H | H | H | H | nC₁₀H₂₁ | nC₁₀H₂₁ |
| 330 | O | O | O | O | H | H | H | H | 4-(C₈H₁₇)phenyl | 4-(C₈H₁₇)phenyl |

-continued

| No. | X¹ | X² | X³ | X⁴ | R²¹ | R²³ | R²⁴ | R²⁶ | R^{N1} | R^{N2} |
|---|---|---|---|---|---|---|---|---|---|---|
| 331 | O | O | O | O | H | H | H | H | cyclohexyl-C₄H₉ | cyclohexyl-C₄H₉ |
| 332 | O | O | O | O | H | H | H | H | -CH₂-Ph | -CH₂-Ph |
| 333 | O | O | O | O | H | H | H | H | -CH(CH₃)-Ph (S) | -CH(CH₃)-Ph (R) |
| 334 | O | O | O | O | H | H | H | H | -CH₂CH₂-Ph | -CH₂CH₂-Ph |
| 335 | O | O | O | O | H | H | H | H | -CH₂CH₂CH₂-Ph | -CH₂CH₂CH₂-Ph |
| 336 | O | O | O | O | H | H | H | H | -CH₂CH₂CH₂CH₂-Ph | -CH₂CH₂CH₂CH₂-Ph |
| 337 | O | O | O | O | H | H | H | H | -CH(CH₃)CH₂-Ph | -CH(CH₃)CH₂-Ph |
| 338 | O | O | O | O | H | H | H | H | -CH(CH₃)CH₂-Ph (chiral) | -CH(CH₃)CH₂-Ph (chiral) |
| 339 | O | O | O | O | H | H | H | H | -CH₂CH₂-C₆F₅ | -CH₂CH₂-C₆F₅ |
| 340 | O | O | O | O | H | H | H | H | -CH₂CH₂-C₆F₄-C₈H₁₇ | -CH₂CH₂-C₆F₄-C₈H₁₇ |

-continued
| No. | X¹ | X² | X³ | X⁴ | R²¹ | R²³ | R²⁴ | R²⁶ | $R^{N1}$ | $R^{N2}$ |
|---|---|---|---|---|---|---|---|---|---|---|
| 341 | O | O | O | O | H | H | H | H | 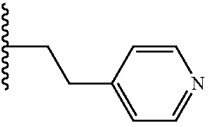 [SMILES: *CCc1ccncc1] | 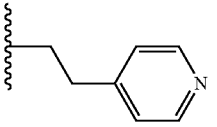 |
| 342 | O | O | O | O | H | H | H | H | 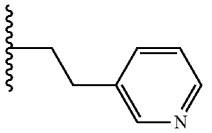 [SMILES: *CCc1cccnc1] | 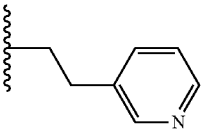 [SMILES: *CCc1cccnc1] |
| 343 | O | O | O | O | H | H | H | H | 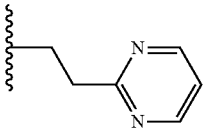 | 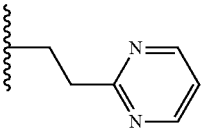 |
| 344 | O | O | O | O | H | H | H | H | 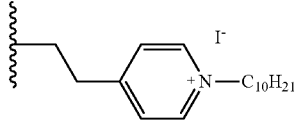 | 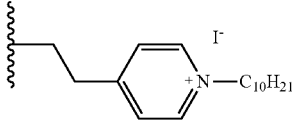 |
| 345 | O | O | O | O | H | H | H | H | 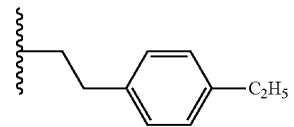 [SMILES: *CCc1ccc(CC)cc1] | 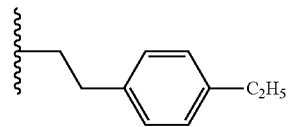 [SMILES: *CCc1ccc(CC)cc1] |
| 346 | O | O | O | O | H | H | H | H | 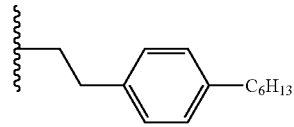 | 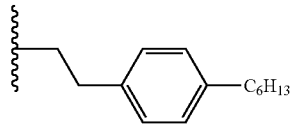 |
| 347 | O | O | O | O | H | H | H | H | 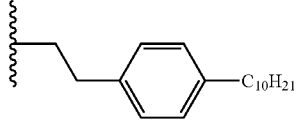 | 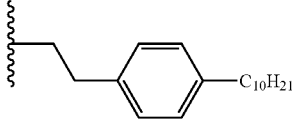 |
| 348 | O | O | O | O | H | H | H | H | 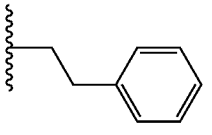 | 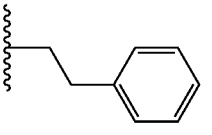 [SMILES: *CCc1ccccc1] |
| 349 | O | O | O | O | H | H | H | H | 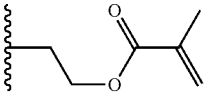 | 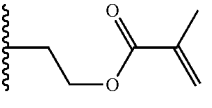 |
| 351 | O | O | O | O | H | H | H | H | 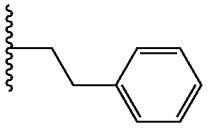 [SMILES: *CCc1ccccc1] | 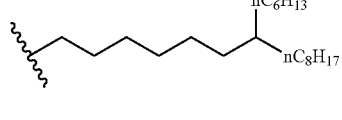 |
| 352 | O | O | O | O | H | H | H | H | 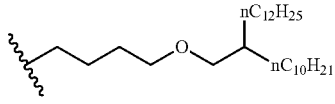 | 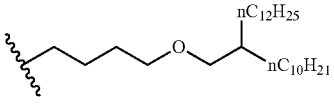 |

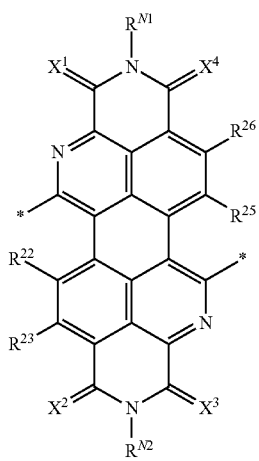

| No. | $X^1$ | $X^2$ | $X^3$ | $X^4$ | $R^{22}$ | $R^{23}$ | $R^{25}$ | $R^{26}$ | $R^{N1}$ | $R^{N2}$ |
|---|---|---|---|---|---|---|---|---|---|---|
| 401 | O | O | O | O | H | H | H | H | H | H |
| 402 | O | O | O | O | H | H | H | H | $CH_3$ | $CH_3$ |
| 403 | O | O | O | O | H | H | H | H | $nC_6H_{13}$ | $nC_6H_{13}$ |
| 404 | O | O | O | O | H | H | H | H | -cyclohexyl | -cyclohexyl |
| 405 | S | S | O | O | H | H | H | H | -cyclohexyl | -cyclohexyl |
| 406 | O | O | S | S | H | H | H | H | -cyclohexyl | -cyclohexyl |
| 407 | O | S | S | O | H | H | H | H | -cyclohexyl | -cyclohexyl |
| 408 | O | O | O | O | H | H | H | H | $CH_2C_3F_7$ | $CH_2C_3F_7$ |
| 409 | O | O | O | O | H | H | H | H | -isoPropyl | -isoPropyl |
| 410 | O | O | O | O | H | H | H | H | -tert-Butyl | -tert-Butyl |
| 411 | S | S | O | O | H | H | H | H | $CH(C_8H_{17})_2$ | $CH(C_8H_{17})_2$ |
| 412 | O | O | O | O | H | H | H | H | $CH(C_8H_{17})_2$ | $CH(C_8H_{17})_2$ |
| 413 | O | O | O | O | H | H | H | H | $C_2H_4C_5F_{11}$ | $C_2H_4C_5F_{11}$ |
| 414 | O | O | O | O | Cl | Cl | Cl | Cl | -cyclohexyl | -cyclohexyl |

5

10

15

-continued
| No. | X$^1$ | X$^2$ | X$^3$ | X$^4$ | R$^{22}$ | R$^{23}$ | R$^{25}$ | R$^{26}$ | R$^{N1}$ | R$^{N2}$ |
|---|---|---|---|---|---|---|---|---|---|---|
| 415 | O | O | O | O | H | H | F | H | 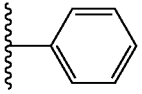 | 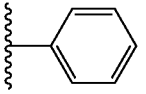 |
| 416 | O | O | O | O | F | F | F | F | 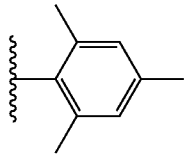 [SMILES: *c1c(C)cc(C)cc1C] | 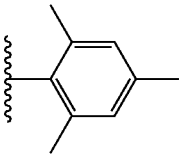 [SMILES: *c1c(C)cc(C)cc1C] |
| 417 | O | O | O | O | H | H | CN | H | 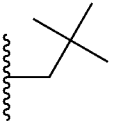 [SMILES: *CC(C)(C)C] | 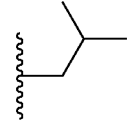 |
| 418 | O | O | O | O | H | H | H | H | 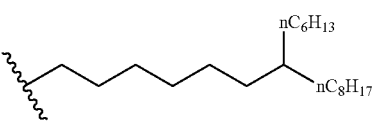 | 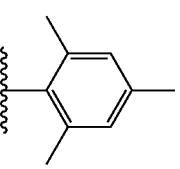 [SMILES: *c1c(C)cc(C)cc1C] |
| 419 | O | O | O | O | H | H | H | H | 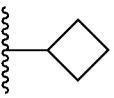 | 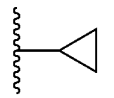 |
| 420 | O | O | O | O | nC$_6$H$_{13}$ | H | H | H | 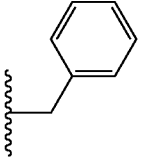 [SMILES: *Cc1ccccc1] | 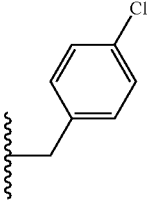 [SMILES: *Cc1ccc(Cl)cc1] |
| 421 | O | O | O | O | H | H | H | H | 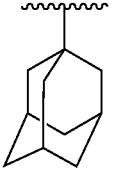 [SMILES: *C12CC3CC(CC(C3)C1)C2] | 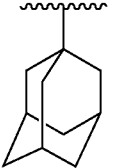 |
| 422 | O | O | O | O | Ph | H | H | Ph | 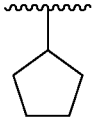 | 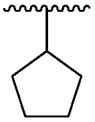 |
| 423 | O | O | O | O | H | H | H | H | CF$_3$ | C$_2$F$_5$ |
| 424 | O | O | O | O | CF$_3$ | H | H | H | 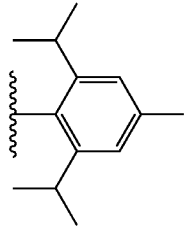 | 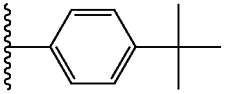 [SMILES: *c1ccc(C(C)(C)C)cc1] |

-continued
| No. | X¹ | X² | X³ | X⁴ | R²² | R²³ | R²⁵ | R²⁶ | $R^{N1}$ | $R^{N2}$ |
|---|---|---|---|---|---|---|---|---|---|---|
| 425 | O | O | O | O | H | H | H | H | 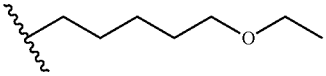 [SMILES: *CCCCCOCC] | 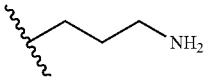 |
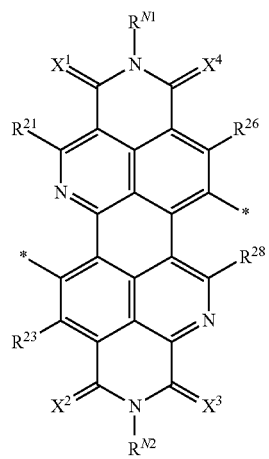
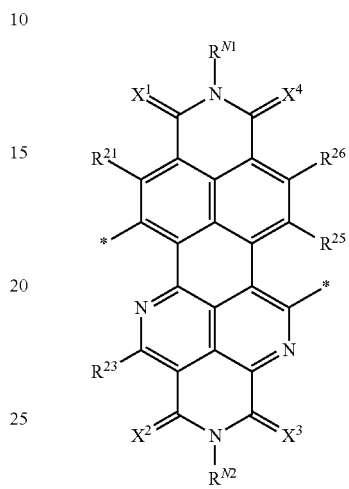
| No. | X¹ | X² | X³ | X⁴ | R²¹ | R²³ | R²⁸ | R²⁶ | $R^{N1}$ | $R^{N2}$ |
|---|---|---|---|---|---|---|---|---|---|---|
| 501 | O | O | O | O | H | H | H | H | H | H |
| 502 | O | O | O | O | H | H | H | H | CH₃ | CH₃ |
| 503 | O | O | O | O | H | H | H | H | 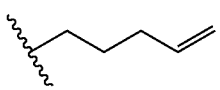 [SMILES: *CCCC=C] | nC₆H₁₃ |
| 504 | O | O | O | O | H | H | H | H | 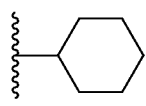 | 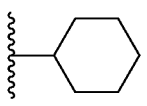 |
| 505 | S | S | O | O | H | H | H | H | nC₁₀H₂₁ | nC₁₀H₂₁ |
| 506 | O | O | S | S | H | H | H | H | 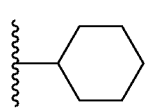 | 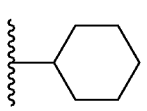 |
| 507 | O | S | S | O | H | H | H | H | 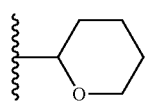 | 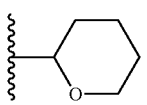 |
| 508 | O | O | O | O | 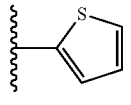 | H | H | 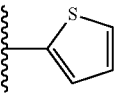 | 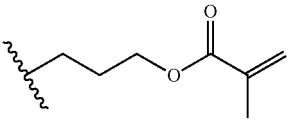 [SMILES: *CCCOC(=O)C(=C)C] | CH₂C₃F₇ |
| 509 | O | O | O | O | H | H | H | H | -isoPropyl | -isoPropyl |
| 510 | O | O | O | O | H | H | H | H | 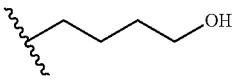 [SMILES: *CCCCO] | 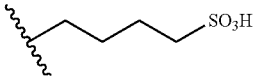 [SMILES: *CCCCS(=O)(=O)O] |

| No. | X¹ | X² | X³ | X⁴ | $R^{21}$ | $R^{23}$ | $R^{25}$ | $R^{26}$ | $R^{N1}$ | $R^{N2}$ |
|---|---|---|---|---|---|---|---|---|---|---|
| 601 | O | O | O | O | H | H | H | H | H | H |
| 602 | O | O | O | O | H | H | H | H | $CH_3$ | $CH_3$ |
| 603 | O | O | O | O | H | H | H | H | -(CH₂)₄-CH=CH₂ | $nC_6H_{13}$ |
| 604 | O | O | O | O | H | H | H | H | -cyclohexyl | -cyclohexyl |
| 605 | S | S | O | O | H | H | H | H | $nC_{10}H_{21}$ | $nC_{10}H_{21}$ |
| 606 | O | O | S | S | H | H | H | H | -cyclohexyl | -cyclohexyl |
| 607 | O | S | S | O | H | H | H | H | -2-tetrahydropyranyl | -2-tetrahydropyranyl |
| 608 | O | O | O | O | 2-thienyl | H | H | 2-thienyl | -(CH₂)₄-OC(O)C(CH₃)=CH₂ | $CH_2C_3F_7$ |
| 609 | O | O | O | O | H | H | 3-furyl | H | -isoPropyl | -isoPropyl |
| 610 | O | O | O | O | H | H | H | H | -(CH₂)₄-OH | -(CH₂)₄-$SO_3H$ |

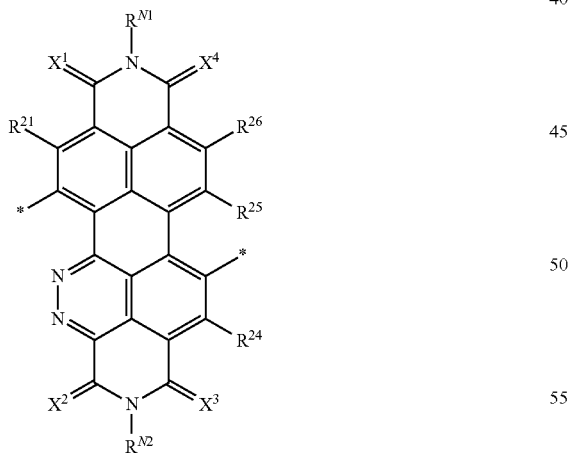

40

| No. | X¹ | X² | X³ | X⁴ | $R^{21}$ | $R^{24}$ | $R^{25}$ | $R^{26}$ | $R^{N1}$ | $R^{N2}$ |
|---|---|---|---|---|---|---|---|---|---|---|
| 701 | O | O | O | O | H | H | H | H | H | H |
| 702 | O | O | O | O | H | H | H | H | $CH_3$ | $CH_3$ |
| 703 | O | O | O | O | Cl | H | H | H | $nC_6H_{13}$ | $nC_6H_{13}$ |

-continued

| No. | $X^1$ | $X^2$ | $X^3$ | $X^4$ | $R^{21}$ | $R^{24}$ | $R^{25}$ | $R^{26}$ | $R^{N1}$ | $R^{N2}$ |
|---|---|---|---|---|---|---|---|---|---|---|
| 704 | O | O | O | O | F | H | H | H | cyclohexyl | cyclohexyl |
| 705 | S | S | O | O | CN | H | H | H | cyclohexyl | cyclohexyl |
| 706 | O | O | S | S | N(CH$_3$)$_2$ | H | H | H | cyclohexyl | cyclohexyl |
| 707 | O | S | S | O | H | H | H | H | cyclohexyl | cyclohexyl |
| 708 | O | O | O | O | H | H | H | 2-thienyl | CH$_2$C$_3$F$_7$ | CH$_2$C$_3$F$_7$ |
| 709 | O | O | O | O | H | H | 3-furyl | H | -isoPropyl | -isoPropyl |
| 710 | O | O | O | O | H | H | H | H | -tert-Butyl | -tert-Butyl |
| 711 | S | S | O | O | H | H | H | H | CH(C$_8$H$_{17}$)$_2$ | CH(C$_8$H$_{17}$)$_2$ |
| 712 | O | O | O | O | H | H | H | H | CH(C$_8$H$_{17}$)$_2$ | CH(C$_8$H$_{17}$)$_2$ |
| 713 | O | O | O | O | H | H | H | H | C$_2$H$_4$C$_5$F$_{11}$ | C$_2$H$_4$C$_5$F$_{11}$ |
| 714 | O | O | O | O | Cl | Cl | H | H | cyclohexyl | cyclohexyl |
| 715 | O | O | O | O | F | F | H | H | phenyl | phenyl |
| 716 | O | O | O | O | F | F | F | F | mesityl | mesityl |
| 717 | O | O | O | O | CN | H | H | H | neopentyl | isobutyl |

-continued
| No. | X$^1$ | X$^2$ | X$^3$ | X$^4$ | R$^{21}$ | R$^{24}$ | R$^{25}$ | R$^{26}$ | R$^{N1}$ | R$^{N2}$ |
|---|---|---|---|---|---|---|---|---|---|---|
| 718 | O | O | O | O | Br | H | H | Br | 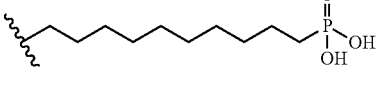 | 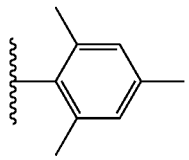 [SMILES: *c1c(C)cc(C)cc1C] |
| 719 | O | O | O | O | NO$_2$ | H | H | H | 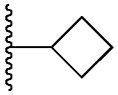 |  |
| 720 | O | O | O | O | CH$_3$ | H | H | H | 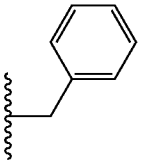 | 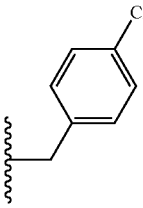 |
| 721 | O | O | O | O | CO$_2$CH$_3$ | H | H | H | 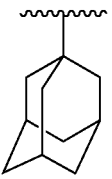 [SMILES: *C12CC3CC(CC(C3)C1)C2] | 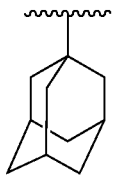 |
| 722 | O | O | O | O | H | H | H | H | 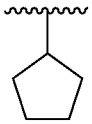 | 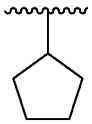 |
| 723 | O | O | O | O | —COOH | H | H | H | CF$_3$ | C$_2$F$_5$ |
| 724 | O | O | O | O | H | H | H | H | 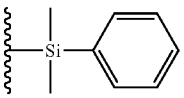 | 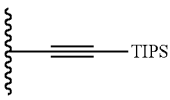 |
| 725 | O | O | O | O | OCH$_3$ | H | H | H | 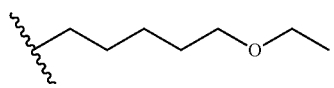 [SMILES: *CCCCCOCC] | 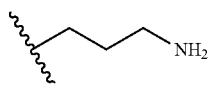 [SMILES: *CCCN] |

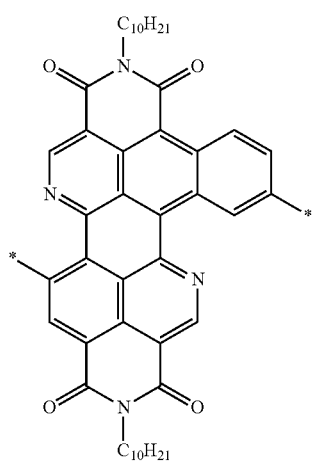
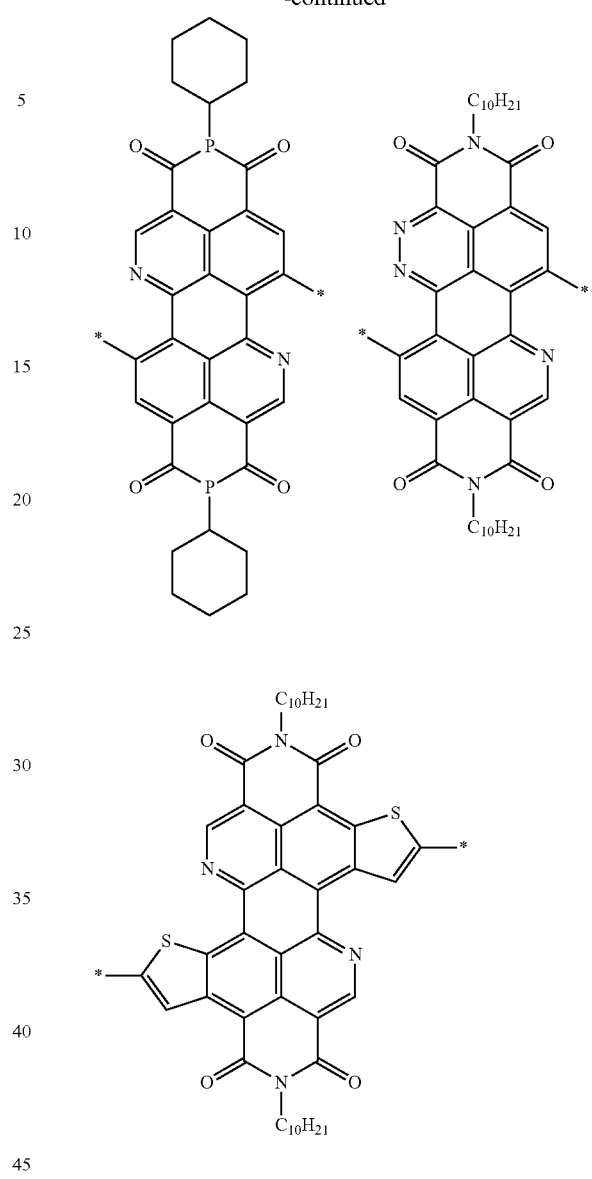
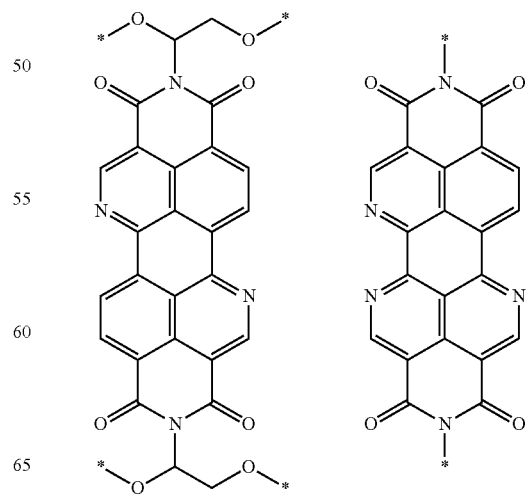

-continued

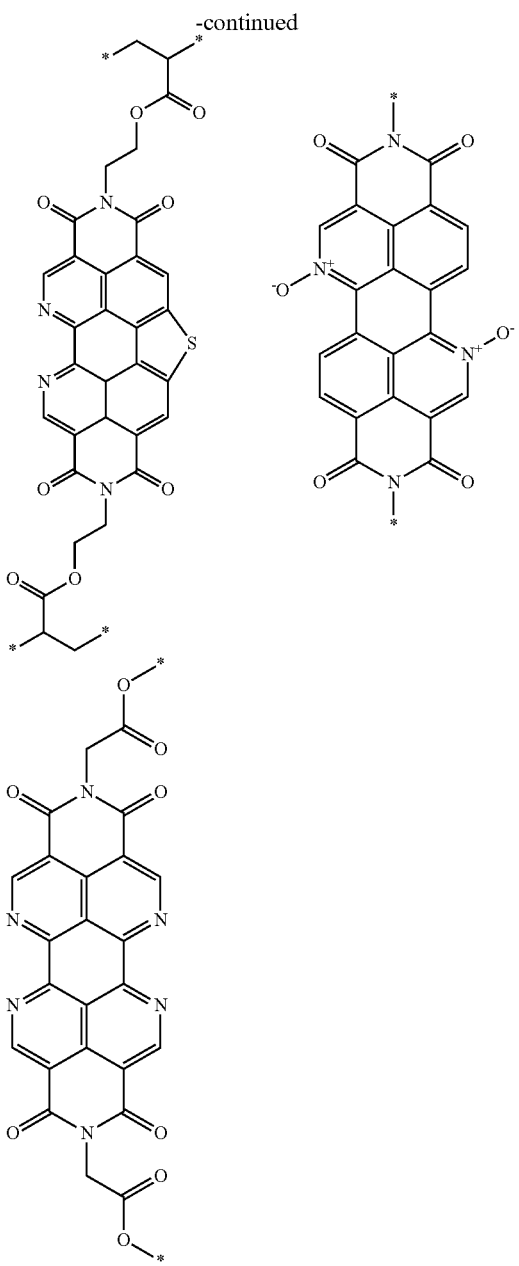

—Repeating Unit Including Aliphatic 7-Membered Ring Structure—

The polymer of the present invention has the repeating unit (I) including the structure represented by Formula (1), and includes no repeating unit having an aliphatic 7-membered ring structure. In other words, the polymer of the present invention consists of repeating units not including an aliphatic 7-membered ring structure. In a case where the polymer of the present invention includes no repeating unit having an aliphatic 7-membered ring structure, high carrier mobility can be realized. The details of the reason are not yet clear, but is considered as follows. That is, since the aliphatic 7-membered ring has poor planarity, the planarity of a repeating unit having the aliphatic 7-membered ring structure is also impaired. As a result, it is considered that the overlapping of orbits between π planes in the repeating unit is inhibited, and the overlapping of orbits between π planes with other repeating units in the polymer is also inhibited.

In the present invention, the phrase that the polymer includes no repeating unit having an aliphatic 7-membered ring structure means that the polymer chain (main chain) of the present invention does not have a repeating unit into which an aliphatic 7-membered ring structure is incorporated. Therefore, in the polymer of the present invention, the aliphatic 7-membered ring structure may be incorporated at the end of polymer chain or the graft chain. Preferably, the polymer of the present invention does not incorporate an aliphatic 7-membered ring structure in the polymer.

In the present invention, the polymer may incorporate an aromatic 7-membered ring structure. For example, an aromatic 7-membered ring structure such as tropone or a ring structure including an aromatic 7-membered ring (cycloheptatriene cation) such as azulene as a fused ring may be incorporated.

In the present invention, the aliphatic 7-membered ring structure means a 7-membered ring structure (for example, cycloheptane and cycloheptatriene) which does not exhibit aromaticity, and the aromatic 7-membered ring structure means a 7-membered ring structure (for example, cycloheptatriene cation) which exhibits aromaticity. Here, the aromaticity refers to that a compound satisfies the Huckel rule.

The repeating unit having an aliphatic 7-membered ring structure includes a repeating unit consisting of a fused ring of an aliphatic 7-membered ring and another ring, in addition to a repeating unit consisting of only an aliphatic 7-membered ring. Examples of such a repeating unit include the divalent group represented by the formula (A1) described in JP2015-153780A.

—Repeating Unit (II)—It is preferable that the polymer of the present invention has, as a repeating unit (II), a group consisting of a 5-membered or 6-membered monocyclic ring, a group consisting of a condensed ring in which at least two of the monocyclic rings are condensed, an ethenylene group or an ethynylene group, or a group obtained by combining these groups, in addition to the repeating unit (I). Here, a group consisting of a ring refers to a divalent group in which two hydrogen atoms are removed from the ring.

The 5-membered monocyclic ring forming the group consisting of a 5-membered or 6-membered monocyclic ring is not particularly limited, and examples thereof include a ring which can be conjugated to the repeating unit (I). Specific examples thereof include a 5-membered hydrocarbon ring (for example, cyclopentadiene ring), a 6-membered aromatic hydrocarbon ring (that is, a benzene ring), a 5-membered hetero ring (preferably aromatic hetero ring), and a 6-membered hetero ring (preferably aromatic hetero ring). Examples of the 5-membered hetero ring include a pyrrole ring, an imidazole ring, a pyrazole ring, an oxazole ring, a thiazole ring, a triazole ring, a furan ring, a thiophene ring, a selenophene ring, a silole ring, and a thiadiazole ring, and examples of the 6-membered hetero ring include a pyridine ring, a pyrimidine ring, a pyrazine ring, and a triazine ring.

The monocyclic ring may have a substituent. Examples of the substituent include the group selected from the substituent group Z and an oxo group (=O), and a substituent which can be adopted as R or Z described later is preferable.

The group consisting of a condensed ring in which at least two of the monocyclic rings are condensed is not particularly limited as long as a condensed ring obtained by appropriately combining the above-described monocyclic ring, and examples thereof include a ring which can be conjugated to the repeating unit (I). The condensed ring includes a group in which two ring-constituting atoms of the monocyclic rings are bonded by a carbon-carbon double bond. The number of condensed monocyclic rings is not particularly limited as long as 2 or more, and for example, preferably 2 to 8, more preferably 2 to 6, and still more preferably 2 or 3.

The type of the condensed monocyclic ring is not particularly limited, and the condensed monocyclic rings may be the same type or a different type thereof. Examples of the condensed ring include a condensed ring obtained by condensing only a 5-membered monocyclic ring, a condensed ring obtained by condensing only a 6-membered monocyclic ring, a condensed ring obtained by condensing only a 7-membered monocyclic ring (referring to a 7-membered aromatic monocyclic ring) exhibiting aromaticity, a condensed ring obtained by condensing a 5-membered monocyclic ring and a 6-membered monocyclic ring, and a condensed ring obtained by condensing two or more monocyclic rings selected from a 5-membered monocyclic ring and a 6-membered monocyclic ring with a 7-membered aromatic monocyclic ring.

The type of the condensed monocyclic ring preferably includes a 5-membered hetero ring and more preferably includes a thiophene ring.

As the condensed ring, for example, a benzimidazole ring, a benzoxazole ring, a benzothiazole ring, an indazole ring, a quinoline ring, a quinazoline ring, an azulene ring, or condensed rings represented by Formulae ($V_D$-2) to ($V_D$-17) and Formulae ($V_A$-1) to ($V_A$-11) is preferable.

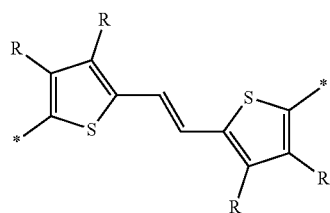

($V_D$-1)

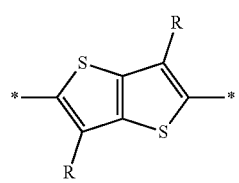

($V_D$-2)

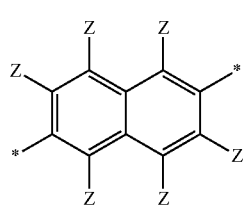

($V_D$-3)

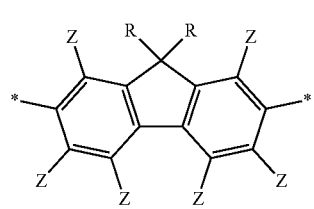

($V_D$-4)

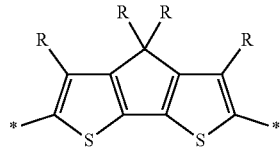

($V_D$-5)

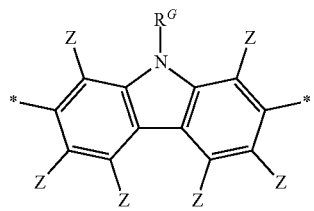

($V_D$-6)

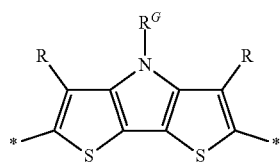

($V_D$-7)

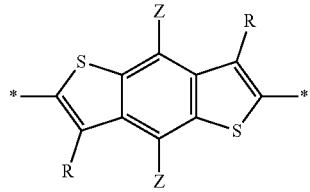

($V_D$-8)

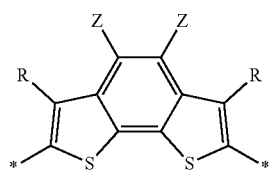

($V_D$-9)

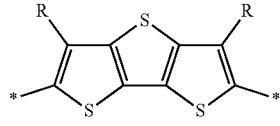

($V_D$-10)

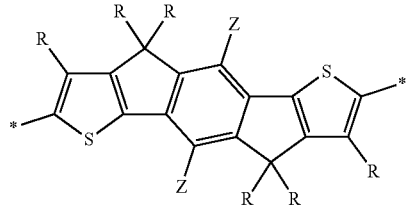

($V_D$-11)

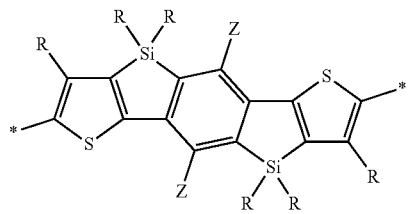

($V_D$-12)

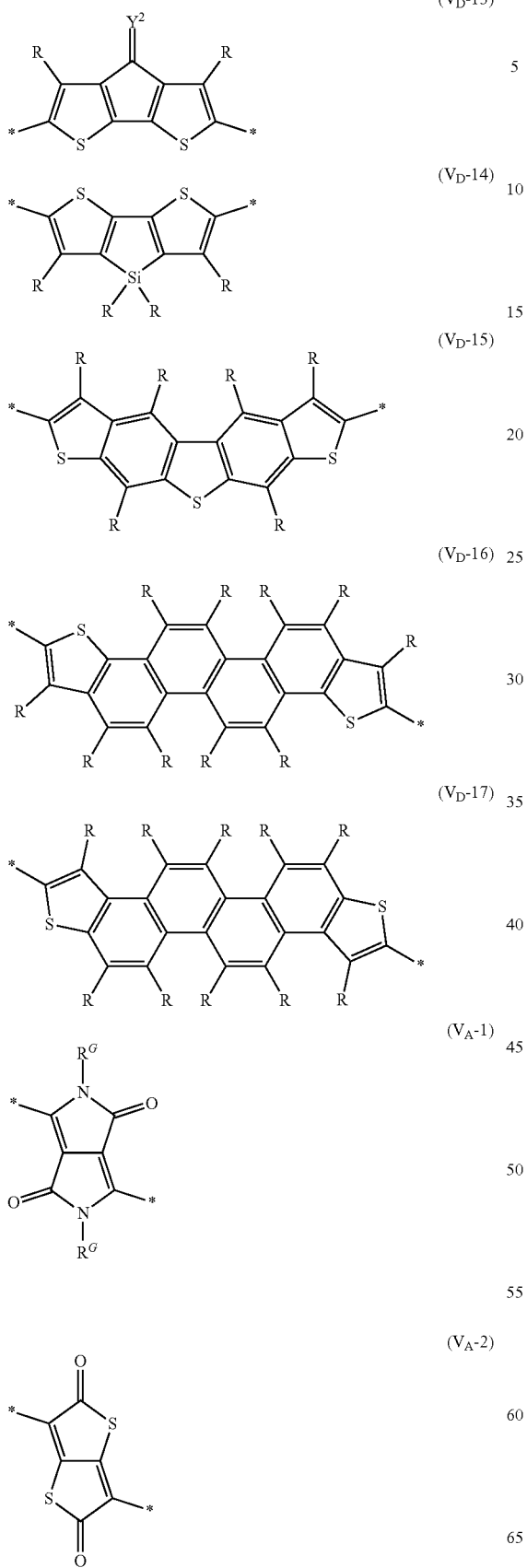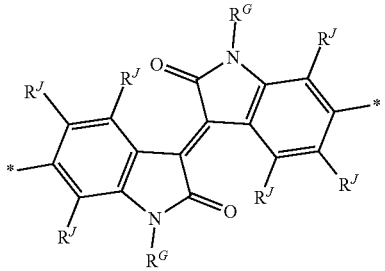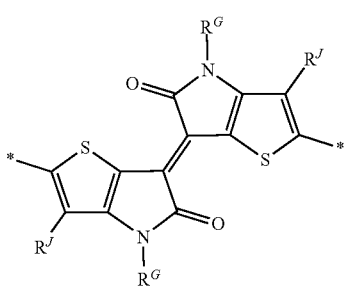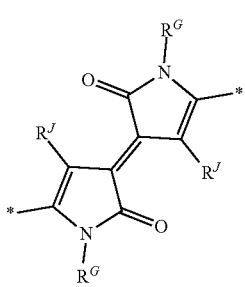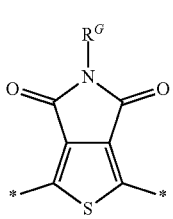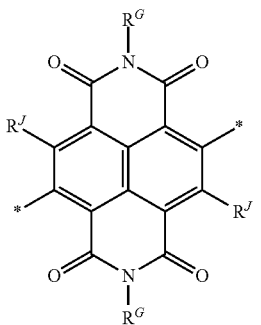

-continued

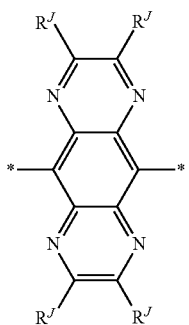
(V_A-8)

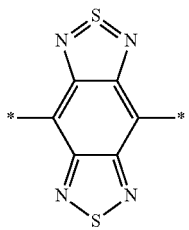
(V_A-9)

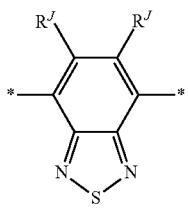
(V_A-10)

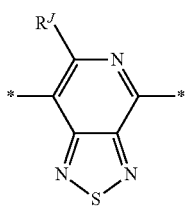
(V_A-11)

In each of the formulae, * indicates a bonding site to other repeating unit.

R and Z represent a hydrogen atom or a substituent. The substituent which can be adopted as R or Z is not particularly limited, and examples thereof include the group selected from the substituent group Z. Among these, a halogen atom (preferably a fluorine atom, a chlorine atom, a bromine atom, or an iodine atom), an alkyl group, or an alkynyl group is preferable. The alkyl group which can be adopted as R or Z is preferably an alkyl group having 1 to 35 carbon atoms, and more preferably an alkyl group having 1 to 26 carbon atoms. The alkyl group may include at least one of —O—, —S—, —C(=O)—, or —NR$^{X1}$— in the carbon chain or at the terminal of the carbon chain. R$^{X1}$ represents a hydrogen atom or a substituent. The number of —O—, —S—, and —NR$^{X1}$— which can be included in the carbon chain or at a terminal of the carbon chain is, in total, preferably an integer of 1 to 5, more preferably 1 to 3, and still more preferably 1. The substituent which can be adopted as R$^{X1}$ is not particularly limited, and examples thereof include an alkyl group (preferably an alkyl group having 1 to 25 carbon atoms), a halogen atom (preferably a fluorine atom, a chlorine atom, a bromine atom, or an iodine atom), or an aromatic hydrocarbon group (also referred to as an aryl group; preferably an aromatic hydrocarbon group having 6 to 20 carbon atoms). R$^{X1}$ is preferably a hydrogen atom or an alkyl group and more preferably an alkyl group.

R$^G$ represents an alkyl group or an aromatic hydrocarbon group. An aspect of the alkyl group is the same as the aspect which can be adopted as R or Z described above. The aromatic hydrocarbon group preferably has 6 to 30 carbon atoms.

R$^J$ represents a hydrogen atom, an alkyl group, a cyano group, or a halogen atom. Preferred aspects of an alkyl group and a halogen atom which can be adopted as R$^J$ are the same as the aspects of an alkyl group and a halogen atom which can be adopted as Z.

Y$^2$ represents an oxygen atom or a sulfur atom, and is preferably an oxygen atom.

The group obtained by combining the group consisting of a monocyclic ring, the group consisting of a condensed ring, an ethenylene group, and an ethynylene group is particularly limited as long as a divalent group obtained by combining at least two of the above-described respective groups. The number of groups to be combined is not particularly limited as long as 2 or more, and for example, preferably 2 to 8, more preferably 2 to 6, and still more preferably 2 or 3.

The type of the group to be combined is not particularly limited, and the groups to be combined may be the same type or a different type thereof. Examples of the group to be combined include the combinations of the polymers 1 to 12 in the specific examples and the examples described later, and a group consisting of 5-membered monocyclic ring—group consisting of condensed ring or an ethenylene group—group consisting of 5-membered monocyclic ring is preferable, and it is more preferable that the 5-membered monocyclic ring is a thiophene ring (for example, a group represented by Formula (V$_D$-1)).

—Other Repeating Unit (III)—

The polymer of the present invention may have a repeating unit (III), in addition to the repeating units (I) and (II). As the repeating unit (III), a repeating unit which is generally used in consideration of reactivity with the repeating units (I) and (II) can be used without particular limitation.

The content of the repeating unit (I) in the polymer of the present invention is preferably 10 to 90 mass %, more preferably 20 to 80 mass %, and still more preferably 30 to 80 mass %. In addition, the content of the repeating unit (II) in the polymer is, in total, preferably 10 to 90 mass %, more preferably 20 to 80 mass %, and still more preferably 30 to 80 mass %. The content of the repeating unit (III) in the polymer is appropriately determined as long as the effects of the present invention are not impaired.

The weight-average molecular weight of the polymer of the present invention is preferably 2000 to 1000000 and more preferably 3000 to 200000.

In the present invention, the weight-average molecular weight is measured by a gel permeation chromatography (GPC) method and is obtained in terms of standard polystyrene. Specifically, for example, HLC-8121 GPC (manufactured by Tosoh Corporation) is used as GPC, two columns of TSKgel GMH$_{HR}$-H(20)HT (manufactured by Tosoh Corporation, 7.8 mmID×30 cm) are used as a column, and 1,2,4-trichlorobenzene is used as an eluent. As the conditions, a sample concentration of 0.02 mass %, a flow rate of 1.0 mL/min, a sample injection amount of 300 μL, and a measurement temperature of 160° C. are set, and an infrared (IR) detector is used. The calibration curve is obtained by using 12 samples of "Standard sample TSK standard, polystyrene": "F-128", "F-80", "F-40", "F-20", "F-10", "F-4", "F-2", "F-1", "A-5000", "A-2500", "A-1000", and "A-500", manufactured by Tosoh Corporation.

The terminal structure of the polymer of the present invention is not particularly limited and do not definitively determined according to the presence or absence of other repeating units, the type of substrate used in the synthesis, or the type of quenching agent (reaction terminator) in the synthesis. Examples of the structure of the terminal include a hydrogen atom, a hydroxy group, a halogen atom, an ethylenically unsaturated group, an alkyl group, an aromatic heterocyclic group (preferably a thiophene ring), and an aromatic hydrocarbon group (preferably a benzene ring).

The method of synthesizing the polymer of the present invention is not particularly limited, and the synthesis can be performed with reference to a well-known method. For example, the synthesis can be performed by synthesizing respective precursor compounds which can derive the repeating units (I) and (II), and subjecting the respective precursors to a cross-coupling reaction such as Suzuki coupling reaction or Stille coupling reaction. In the synthesis of the polymer of the present invention, for example, publications of JP2010-527327A, JP2007-516315A, JP2014-515043A, JP2014-507488A, JP2011-501451A, JP2010-018790A, WO2012/174561A, JP2011-514399A, and JP2011-514913A can be referred to.

Specific examples of the polymer of the present invention will be shown below and in the examples, but the present invention is not limited to these aspects. In the following specific examples, the repeating units (I) and (II) are collectively described as one set of repeating units. A mixture of a cis isomer and a trans isomer is described using the structure of the trans isomer for convenience of description.

In the following specific examples, n, m, and l represent the number of repeating units. For example, each n, l, and m is preferably 2 to 1000 and more preferably 3 to 200.

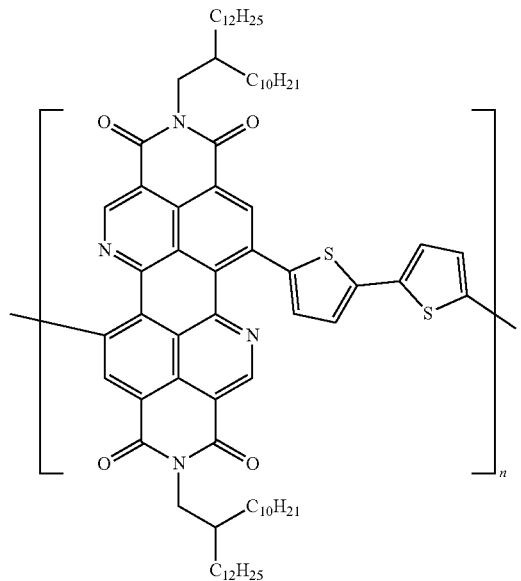

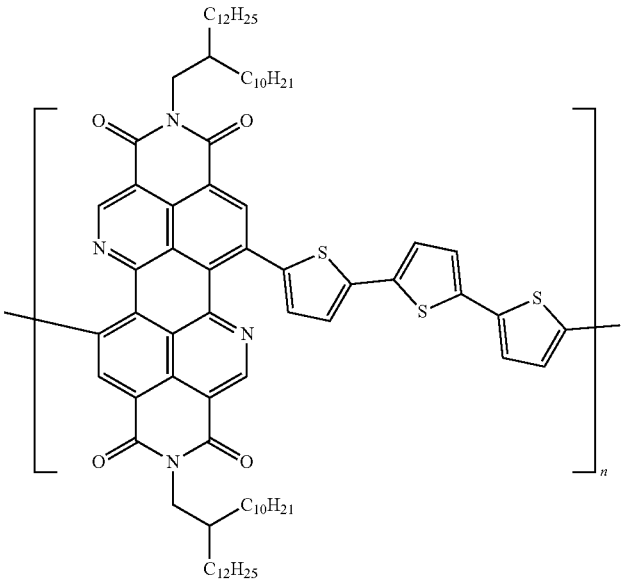

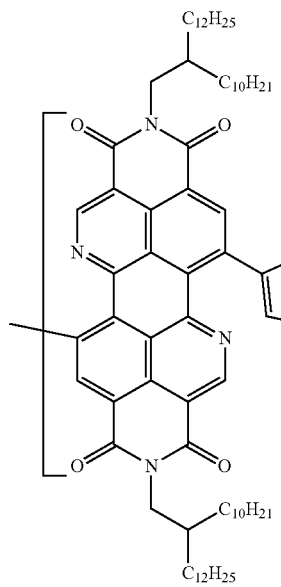

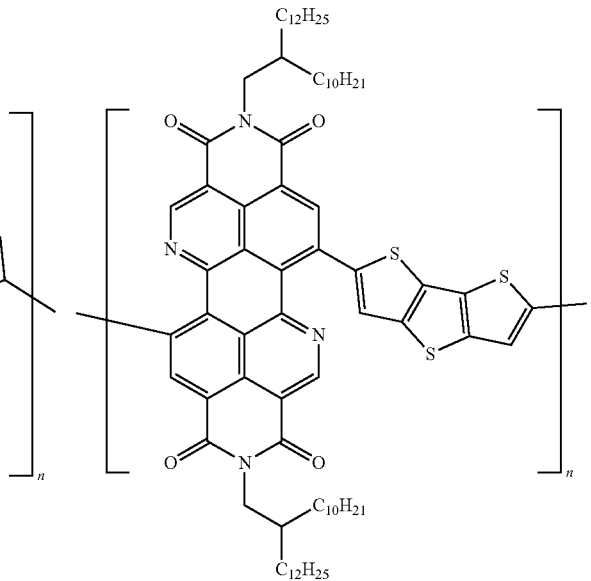

57
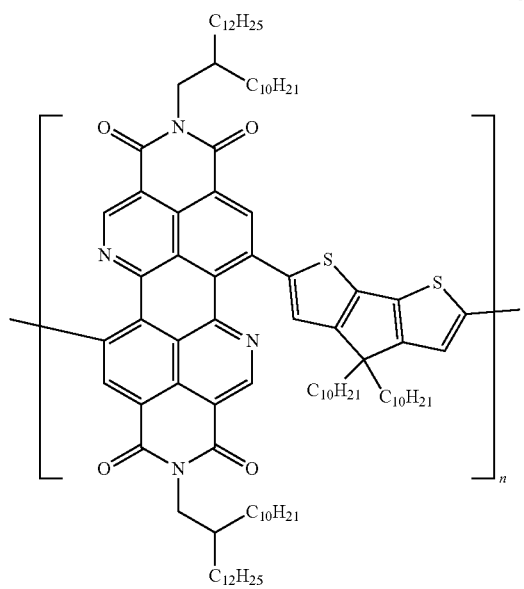
58
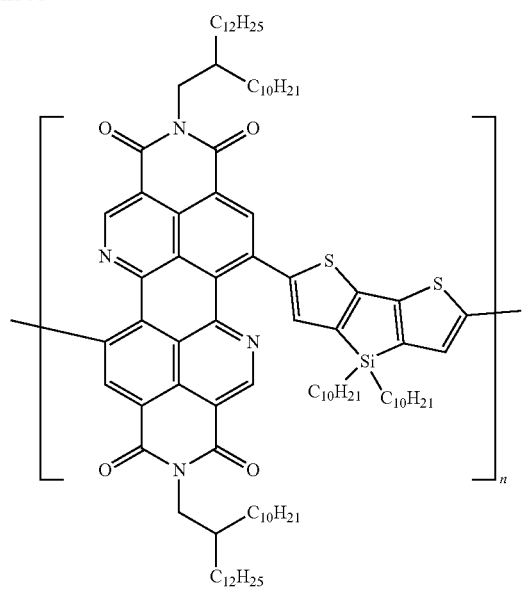
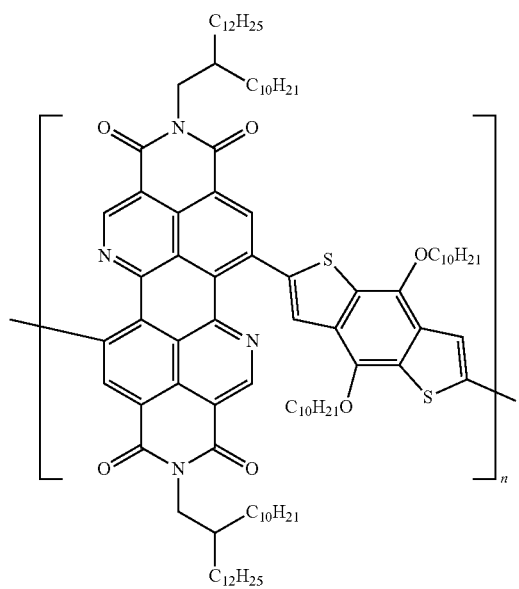
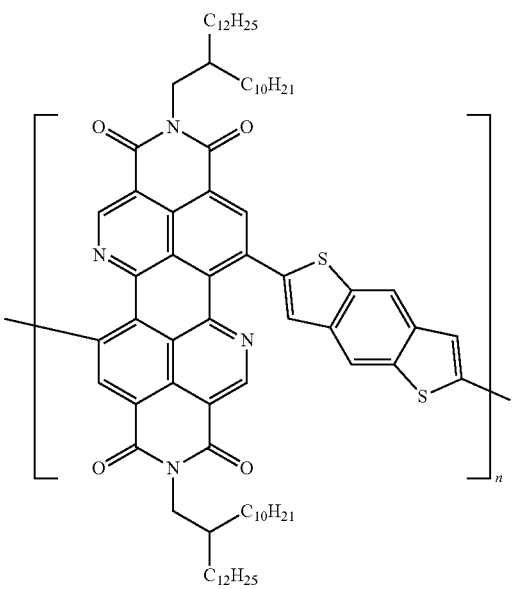

-continued
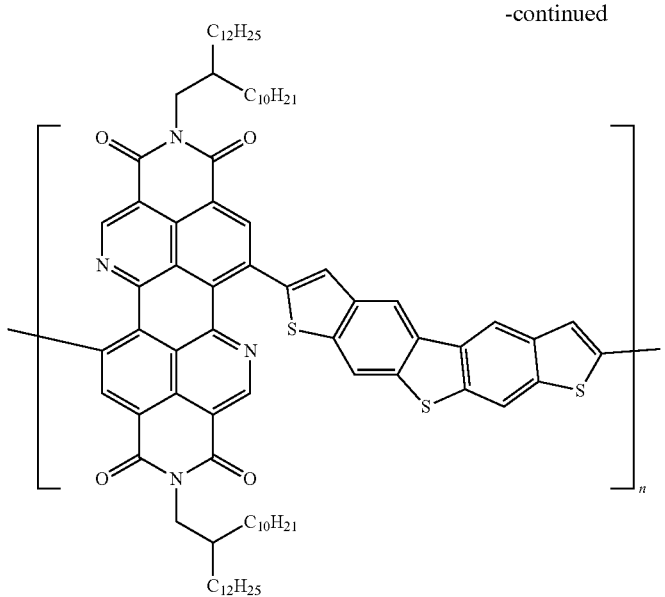
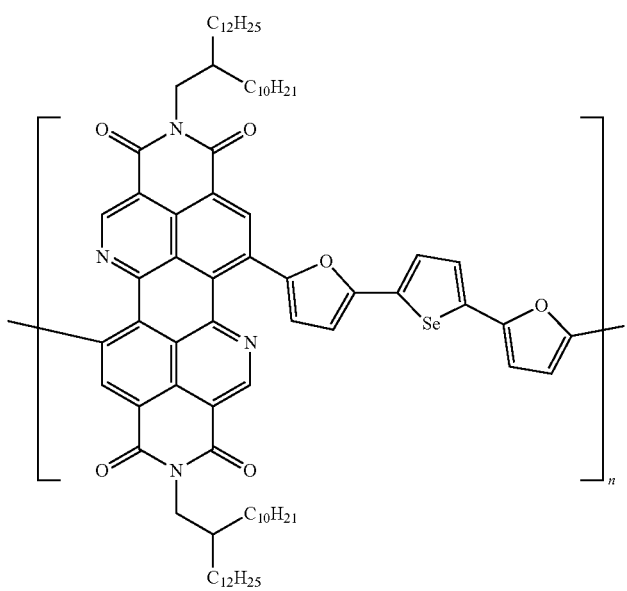

-continued
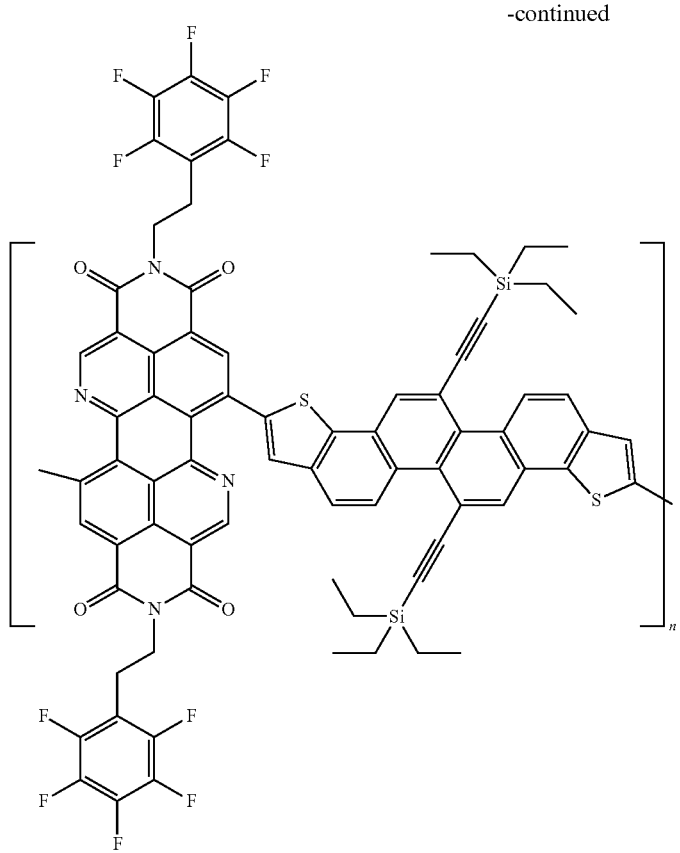
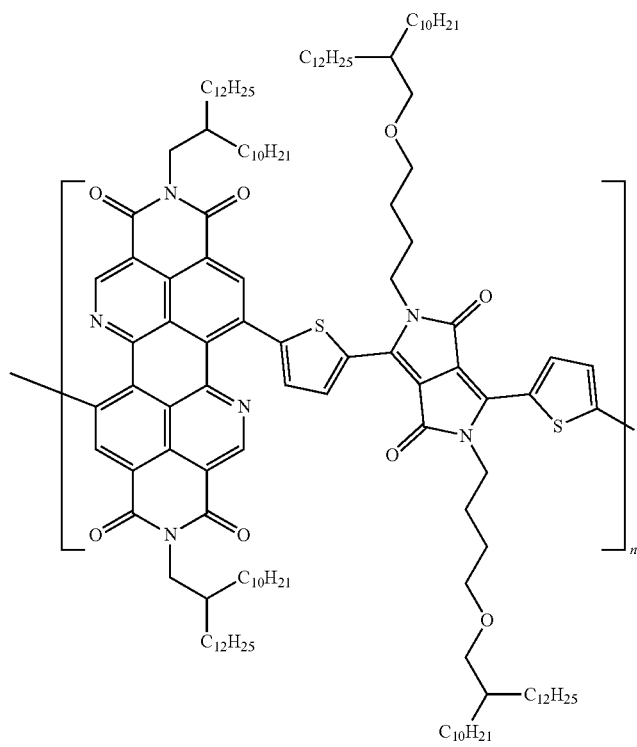

-continued
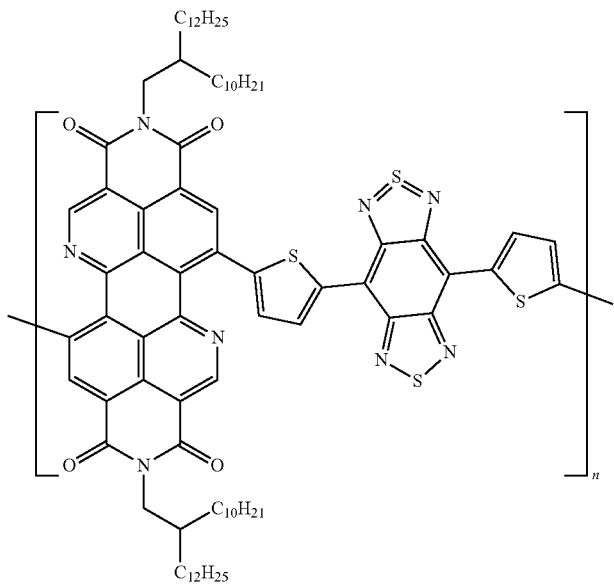
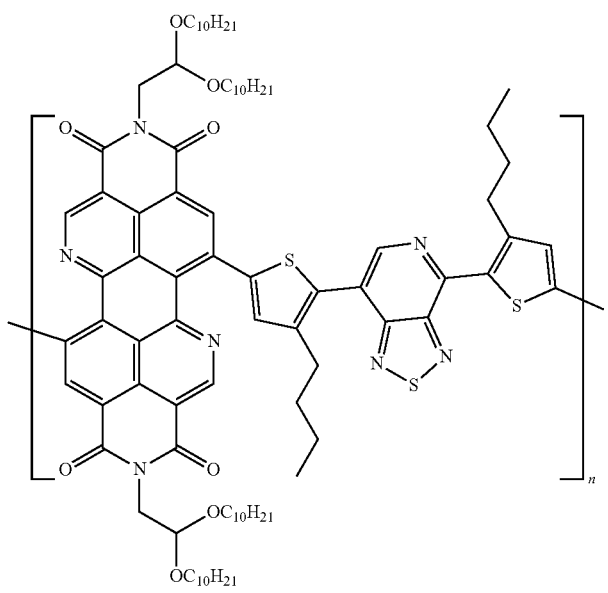

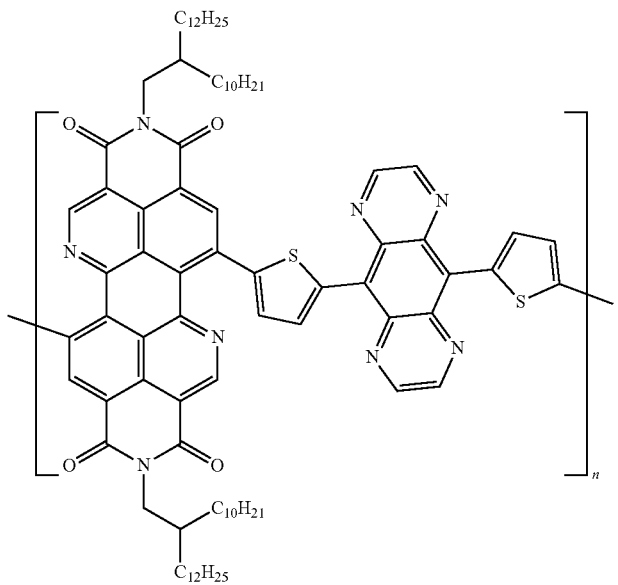
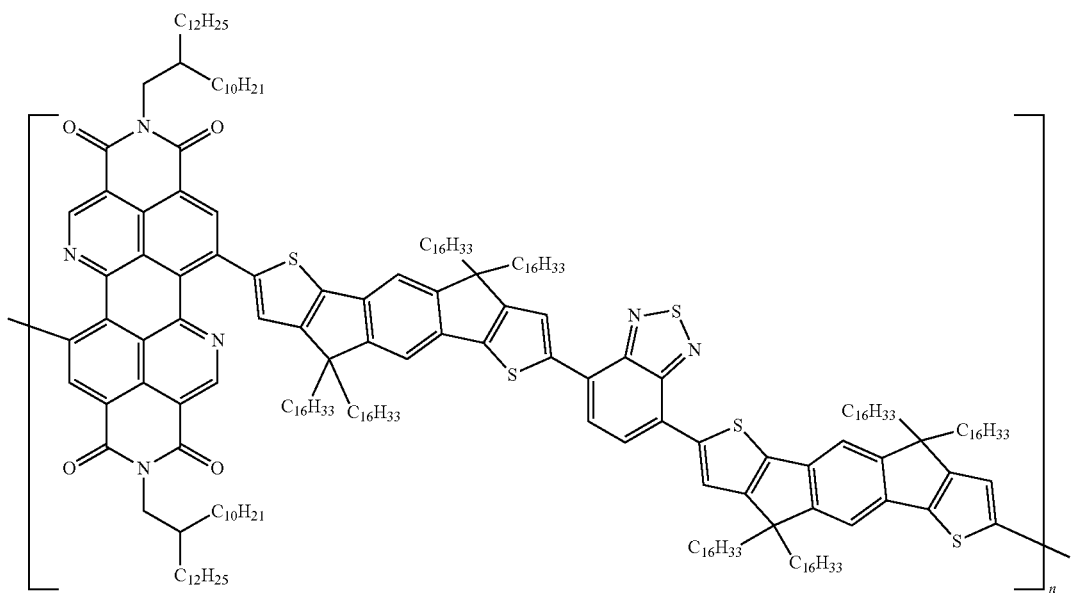

-continued
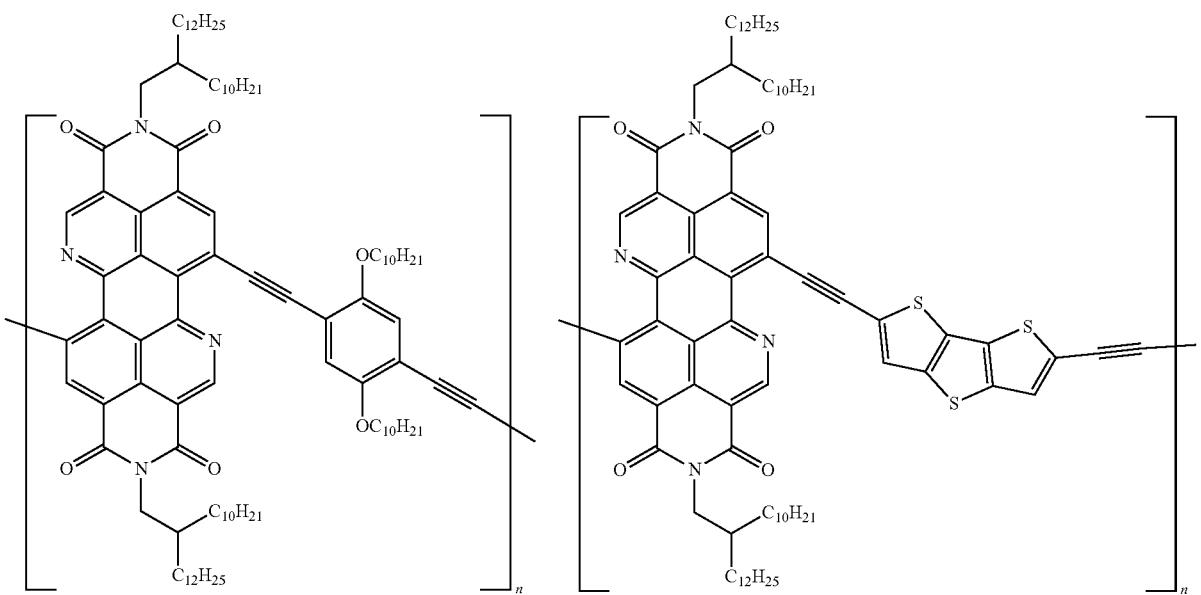
67 68
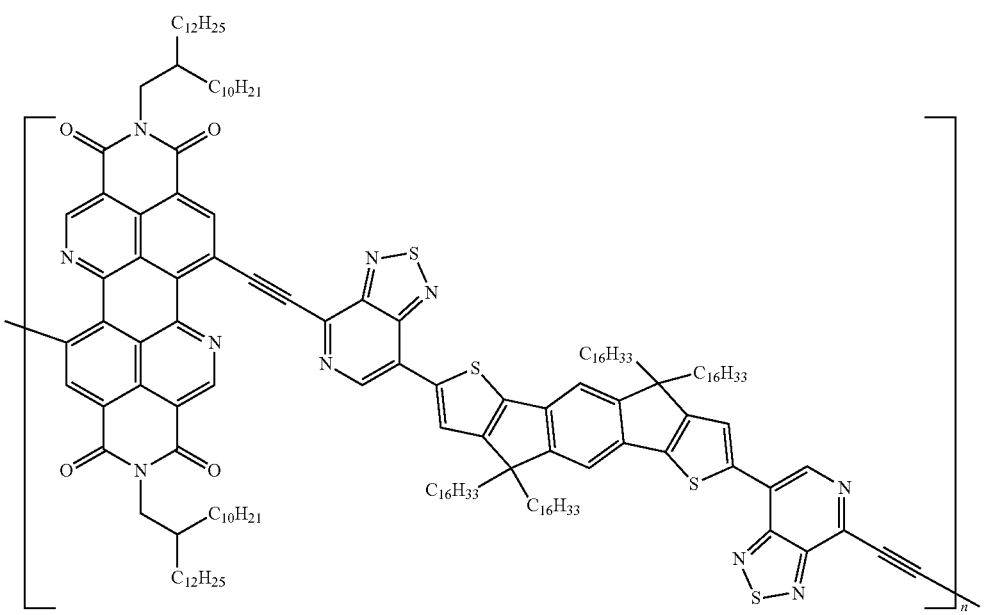

-continued
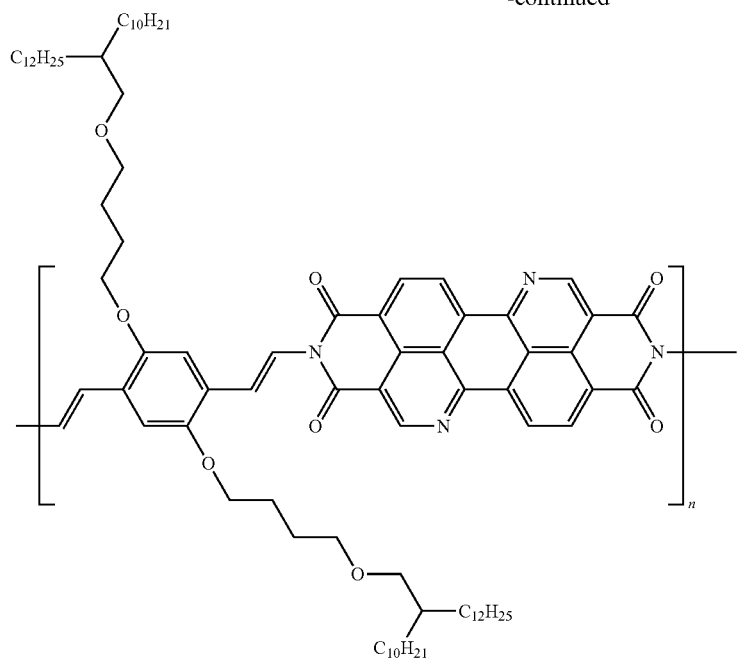
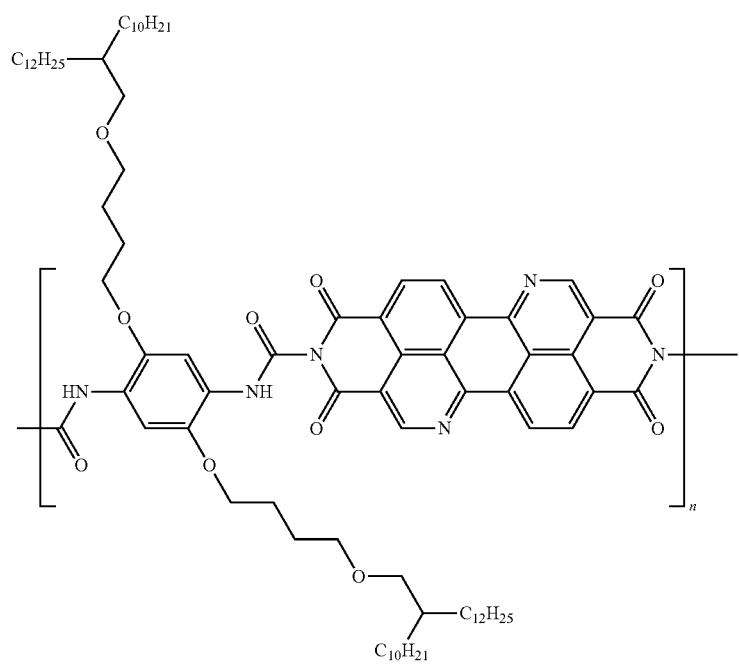

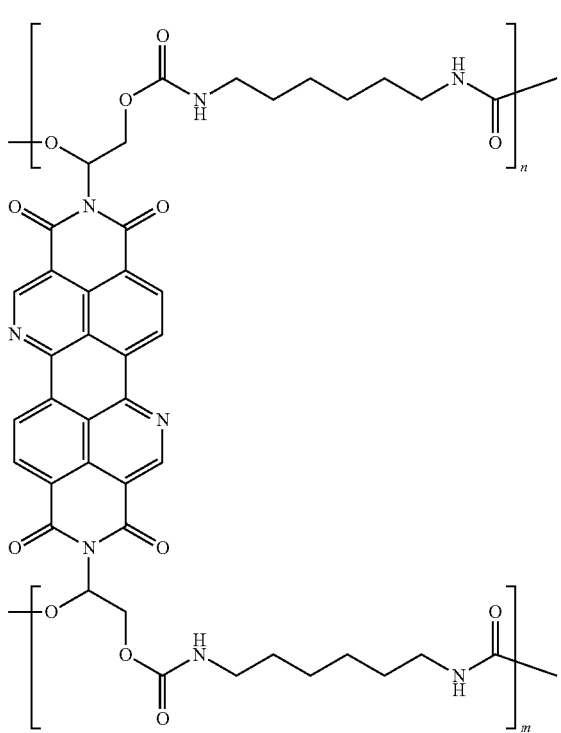
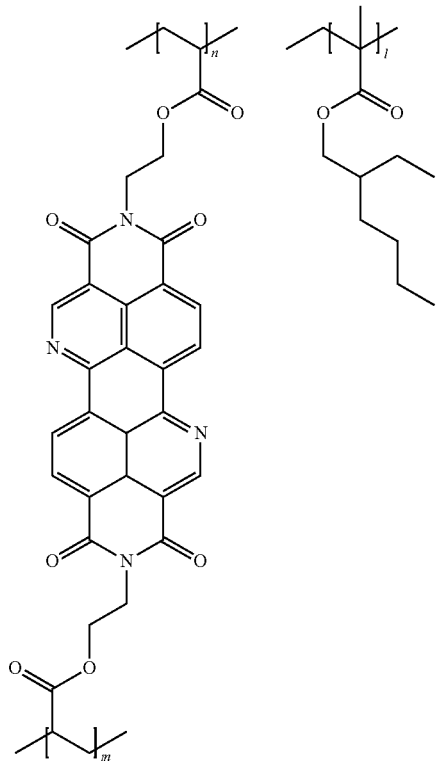

In the organic semiconductor layer, the content of the polymer of the present invention is preferably 10 mass % or more, more preferably 50 mass % or more, and still more preferably 80 mass % or more. In the organic semiconductor layer, the content of the polymer of the present invention can be 100 mass %. In a case where the organic semiconductor layer contains a binder or the like described later, for example, the content is preferably 90 mass % or less and still more preferably 80 mass % or less.

The organic semiconductor layer may contain a binder polymer (also simply referred to as a binder) or an additive, in addition to the polymer (organic semiconductor) of the present invention. As the additive, an additive which is generally used for the organic semiconductor layer can be used without particular limitation.

(Binder)

As the binder, a binder which is generally used for the organic semiconductor layer can be used without particular limitation.

Such a binder is not particularly limited, and examples thereof include an insulating polymer such as polystyrene, poly($\alpha$-methylstyrene), polycarbonate, polyarylate, polyester, polyamide, polyimide, polyurethane, polysiloxane, polysulfone, polymethylmethacrylate, polymethylacrylate, cellulose, polyethylene, and polypropylene, and a copolymer thereof. In addition to these, examples of the binder include a rubber or a thermoplastic elastomer such as an ethylene-propylene rubber, an acrylonitrile-butadiene rubber, a hydrogenated nitrile rubber, a fluoro-rubber, a perfluoro elastomer, a tetrafluoroethylene-propylene copolymer, an ethylene-propylene-diene copolymer, a styrene-butadiene rubber, polychloroprene, polyneoprene, a butyl rubber, a methylphenyl silicone resin, a methylphenylvinyl silicone resin, a methylvinyl silicone resin, a fluorosilicone resin, an acryl rubber, an ethylene acryl rubber, chlorosulfonated polyethylene, chloropolyethylene, an epichlorohydrin copolymer, a polyisoprene-natural rubber copolymer, a polyisoprene rubber, a styrene-isoprene block copolymer, a polyester-urethane copolymer, a polyether-urethane copolymer, a polyether ester thermoplastic elastomer, and a polybutadiene rubber. Furthermore, examples of the binder include a photoconductive polymer such as polyvinylcarbazole and polysilane, a conductive polymer such as polythiophene, polypyrrole, polyaniline, and poly p-phenylenevinylene, and a semiconductive polymer described in Chemistry of Materials, 2014, 26, 647, and the like.

In consideration of charge mobility, it is preferable that the binder has a structure not including a polar group. Here, the polar group refers to a functional group having a heteroatom other than carbon atoms and hydrogen atoms. As the binder having a structure not including a polar group, among the above-described compounds, polystyrene or poly ($\alpha$-methylstyrene) is preferable. In addition, a semiconductive polymer is also preferable.

The glass transition temperature of the binder is not particularly limited, and is appropriately set according to the use and the like. For example, in a case of imparting firm mechanical strength to the organic semiconductor layer, it is preferable that the glass transition temperature is set to be high. On the other hand, in a case of imparting flexibility to the organic semiconductor layer, it is preferable that the glass transition temperature is set to be low.

The weight-average molecular weight of a polymer used as the binder is not particularly limited, and is preferably 1,000 to 10,000,000, more preferably 3,000 to 5,000,000, and still more preferably 5,000 to 3,000,000.

The binder polymer may be used singly, and two or more kinds thereof may be used in combination.

The content of the binder in the organic semiconductor layer can be appropriately set without particular limitation.

For example, the content is preferably 90 mass % or less, more preferably 70 mass % or less, and still more preferably 50 mass % or less. The content of the binder in the organic semiconductor layer can be 0 mass % or more, and for example, is preferably 10 mass % or more, more preferably 15 mass % or more, and still more preferably 20 mass % or more.

(Additive)

The organic semiconductor layer may contain an additive, in addition to the polymer of the present invention.

As the additive, an additive which is generally used in the organic semiconductor layer of the organic semiconductor element may be used without particular limitation. Examples thereof include a surfactant, an antioxidant, a crystallization control agent, and a crystal orientation control agent. Examples of the surfactant and the antioxidant include the surfactants and the antioxidants described in paragraphs 0136 and 0137 of JP2015-195362, and the description in the paragraphs is preferably incorporated herein as it is.

The additive may be contained singly, and two or more kinds thereof may be contained.

The content ratio of the additive in the organic semiconductor layer is preferably 10 mass % or less, more preferably 5 mass % or less, and still more preferably 1 mass % or less.

The film thickness of the organic semiconductor layer can be appropriately adjusted depending on the organic semiconductor element to be, and for example, is preferably 10 to 500 nm and more preferably 20 to 200 nm.

(Method of Forming Organic Semiconductor Layer)

For example, the organic semiconductor layer can be formed by preparing an organic semiconductor composition (hereinafter, also referred to as the "organic semiconductor composition of the present invention") containing the polymer of the present invention and a solvent, applying or printing the composition on a substrate to form a coating film, and drying the coating film.

In the present invention, the expression "coating the substrate with the organic semiconductor composition" includes an aspect of applying the organic semiconductor composition over the substrate through another layer provided on the substrate, in addition to an aspect of directly applying the organic semiconductor composition to the substrate. Another layer (a layer which is in contact with an organic semiconductor layer and is a base of the organic semiconductor layer) to be coated with the organic semiconductor composition is inevitably determined according to the structure of the organic thin film transistor element. For example, in the case of a bottom gate type, the layer is a gate insulating film, and in the case of a top gate type (top gate-bottom contact type and top gate-top contact type), the layer is a source electrode or a drain electrode.

General methods can be used as the coating method with the organic semiconductor composition of the present invention, and examples thereof include a bar coating method, a spin coating method, a knife coating method, a doctor blade method, an ink jet printing method, a flexographic printing method, a gravure printing method, and a screen printing method. Furthermore, as the coating method with the organic semiconductor composition, a method (so-called gap cast method) of forming an organic semiconductor film disclosed in JP2013-207085A, a method (so-called an edge casting method or a continuous edge casting method) of manufacturing an organic semiconductor thin film disclosed in WO2014/175351A, and the like can be suitably applied.

In the drying (drying treatment), conditions can be appropriately selected according to the type of each component included in the organic semiconductor composition. Natural drying may be used, but from the viewpoint of improving productivity, a heat treatment is preferable. The conditions of heat treatment cannot be definitively determined, but for example, the heating temperature is preferably 30° C. to 250° C., more preferably 40° C. to 200° C., and still more preferably 50° C. to 150° C., and the heating time is preferably 10 to 300 minutes and more preferably 20 to 180 minutes.

The organic semiconductor composition of the present invention may contain one kind of the polymer of the present invention singly or may contain two or more kinds thereof, and usually, the polymer of the present invention is dissolved in the solvent. In the organic semiconductor composition, the content of the polymer of the present invention is not particularly limited, but it is preferable that the content thereof in solid contents excluding the solvent is in the same range as the content in the above-described organic semiconductor film.

The solvent contained in the organic semiconductor composition of the present invention is not particularly limited as long as the solvent dissolves or disperses the above-described polymer, and examples thereof include an inorganic solvent and an organic solvent. Among these, an organic solvent is preferable. The solvent may be used singly, and two or more kinds thereof may be used in combination.

The organic solvent is not particularly limited, and examples thereof include hydrocarbon solvents such as hexane, octane, and decane; aromatic hydrocarbon solvents such as toluene, xylene, mesitylene, ethylbenzene, decalin, 1-methylnaphthalene, 1-ethylnaphthalene, 1,6-dimethylnaphtalene, tetralin, and anisole; ketone solvents such as acetone, methyl ethyl ketone, methyl isobutyl ketone, cyclohexanone, acetophenone, propiophenone, and butyrophenone; halogenated hydrocarbon solvents such as dichloromethane, chloroform, tetrachloromethane, dichloroethane, trichloroethane, tetrachloroethane, chlorobenzene, 1,2-dichlorobenzene, 1,2,4-trichlorobenzene, chlorotoluene, and 1-fluoronaphthalene; heterocyclic solvents such as pyridine, picoline, quinoline, thiophene, 3-butylthiophene, and thieno[2,3-b]thiophene; halogenated heterocyclic solvents such as 2-chlorothiophene, 3-chlorothiophene, 2,5-dichlorothiophene, 3,4-dichlorothiophene, 2-bromothiophene, 3-bromothiophene, 2,3-dibromothiophene, 2,4-dibromothiophene, 2,5-dibromothiophene, 3,4-dibromothiophene, and 3,4-dichloro-1,2,5-thiadiazole; ester solvents such as ethyl acetate, butyl acetate, amyl acetate, 2-ethylhexyl acetate, γ-butyrolactone, and phenyl acetate; alcohol solvents such as methanol, propanol, butanol, pentanol, hexanol, cyclohexanol, methyl cellosolve, ethyl cellosolve, and ethylene glycol; ether solvents such as butyl ether, tetrahydrofuran, dioxane, dimethoxyethane, anisole, ethoxybenzene, propoxybenzene, isopropoxybenzene, butoxybenzene, 2-methylanisole, 3-methylanisole, 4-methylanisole, 4-ethylanisole, dimethylanisole (any one of 2,3-, 2,4-, 2,5-, 2,6-, 3,4-, 3,5-, or 3,6-), and 1,4-benzodioxane; amide solvents such as N,N-dimethylformamide and N,N-dimethylacetamide; imide solvents such as 1-methyl-2-pyrrolidone and 1-methyl-2-imidazolidinone; sulfoxide solvents such as dimethylsulfoxide; phosphoric acid ester solvents such as trimethyl phosphoric acid; nitrile solvents such as acetonitrile and benzonitrile; and nitro solvents such as nitromethane and nitrobenzene.

The content ratio of the solvent in the organic semiconductor composition is preferably 90 to 99.99 mass %, more preferably 95 to 99.99 mass %, and still more preferably 96 to 99.95 mass %.

The organic semiconductor composition can contain the above-described binder and/or additive. The content of the binder and the additive in the organic semiconductor composition may be appropriately adjusted depending on the aspect of the organic semiconductor layer to be formed. For example, it is preferable that the content thereof is in the same range as the content of the binder in the organic semiconductor film described above.

The method of preparing the organic semiconductor composition of the present invention is not particularly limited, and a general preparation method can be adopted. For example, it is possible to prepare the organic semiconductor composition of the present invention by adding respective components in a predetermined amount to the solvent and appropriately performing a stirring treatment.

The respective components can be appropriately heated during or after the stirring treatment as necessary. The heating temperature is not particularly limited, and is determined, for example, in a range of 150° C. to 40° C. In a case of using a solvent, the heating temperature is determined to be a temperature in the above-described range and lower than the boiling point of the solvent.

Hereinbefore, examples of using the organic semiconductor film (referred to as the organic semiconductor film of the present invention) containing the polymer of the present invention as the organic semiconductor layer of the organic thin film transistor element have been described, but the use of the organic semiconductor film of the present invention is not limited thereto, and examples thereof include an organic semiconductor layer included in each of the above-described organic semiconductor elements. Among these, the organic semiconductor film of the present invention is preferably used as the organic semiconductor layer of the organic thin film transistor element.

(Sealing Layer)

As described above, the organic semiconductor layer contains the organic semiconductor used in the present invention, and is driven stably even in the atmosphere. Therefore, the entire organic thin film transistor element does not need to be sealed (shielded) with respect to the atmosphere (oxygen gas) or moisture (the sealing layer may not be provided). Furthermore, for the purpose of stably driving over a long period of time, the entire organic thin film transistor element can be sealed with a metallic sealing can or a sealing agent.

As the sealing layer, a sealing agent (composition for forming a sealing layer) generally used for an organic TFT element can be used. Examples of the sealing agent include inorganic materials such as glass and silicon nitride, polymer materials such as parylene, and low molecular weight materials.

The sealing layer can be formed by a usual method such as coating and drying, using the above-described sealing agent.

The film thickness of the sealing layer is not particularly limited but is preferably 0.2 to 10 μm.

—Bottom Gate-Top Contact Type Organic Thin Film Transistor Element—

Figure 2:
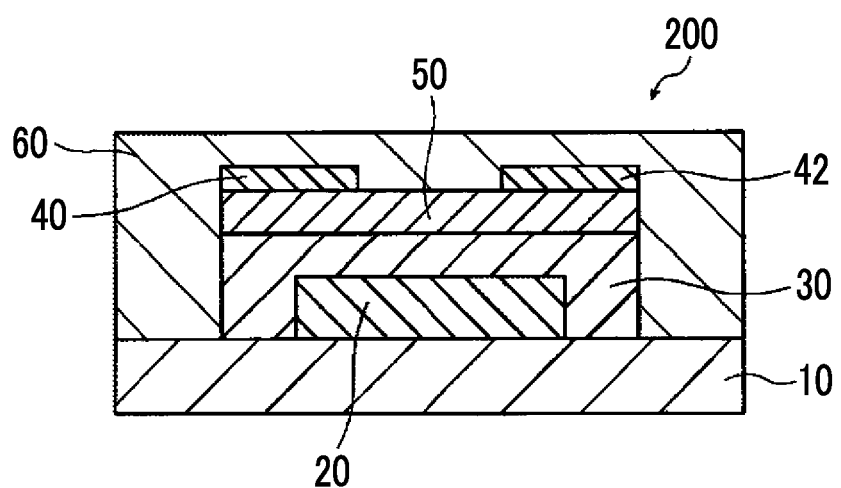
FIG. 2 is a cross-sectional schematic view illustrating a bottom gate-top contact type organic thin film transistor element which is an example of a semiconductor element of the present invention.

FIG. 2 is a cross-sectional schematic view illustrating a bottom gate-top contact type organic thin film transistor element 200 which is an example of the semiconductor element of the present invention.

As illustrated in FIG. 2, the organic thin film transistor element 200 has a substrate 10, a gate electrode 20, a gate insulating film 30, an organic semiconductor film 50, a source electrode 40 and a drain electrode 42, and a sealing layer 60.

The organic thin film transistor element 200 is the same as the organic thin film transistor element 100 except that the layer configuration (lamination aspect) is different. Accordingly, the substrate, the gate electrode, the gate insulating film, the source electrode, the drain electrode, the organic semiconductor layer, and the sealing layer are the same as those of the bottom gate-bottom contact type organic thin film transistor element, and thus descriptions thereof are omitted.

[Use of Organic Semiconductor Element]

The use of the organic semiconductor element of the present invention is not particularly limited, and can be used for, for example, electronic papers, display devices, sensors, electronic tags, and the like.

EXAMPLES

The present invention will be more specifically described based on the examples, but the present invention is not limited to the following examples.

Synthesis Example

Polymers 1 to 13 used in each example are shown below. n in the polymers 1 to 9 and 13 represents the number of repeating units, and numerical values attached to repeating units in polymers 11 and 12 represent the mass ratio of the repeating units.

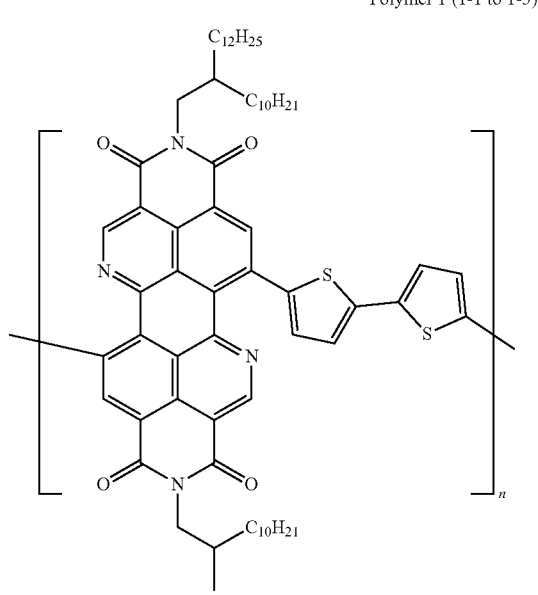

Polymer 1 (1-1 to 1-5)

Polymer 2
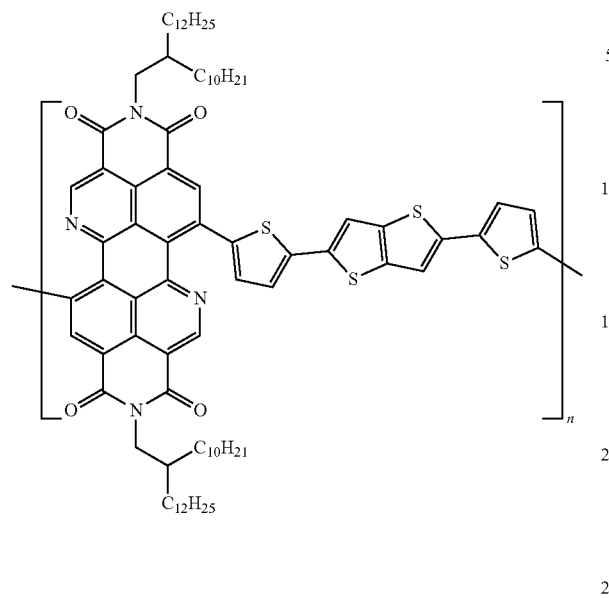
Polymer 3
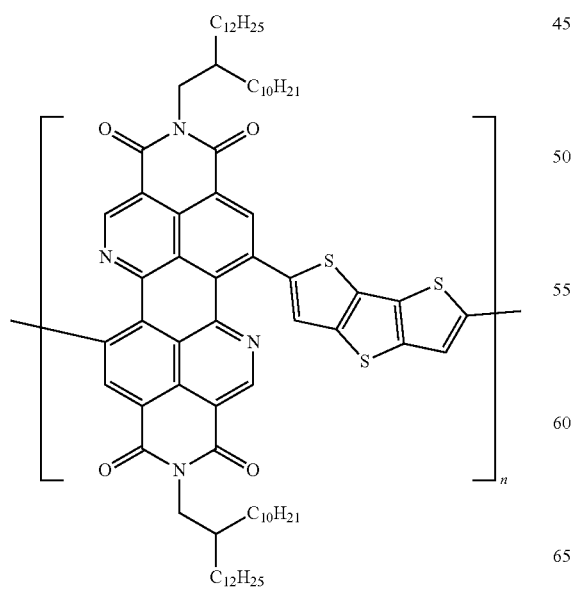
Polymer 4
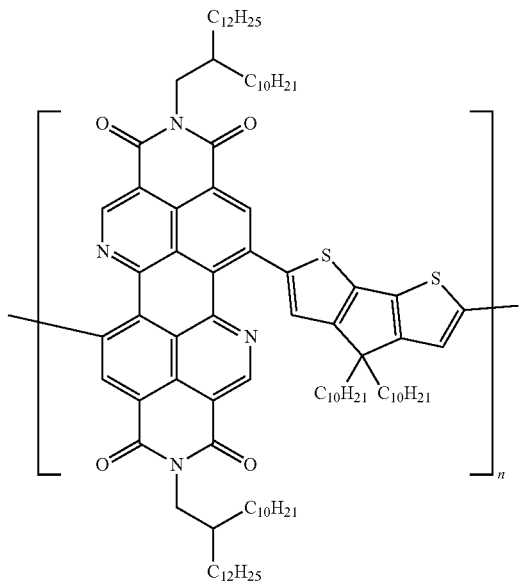
Polymer 5
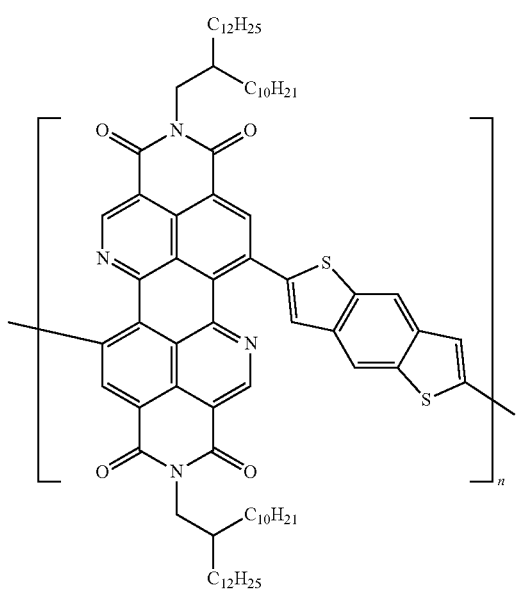

-continued
Polymer 6
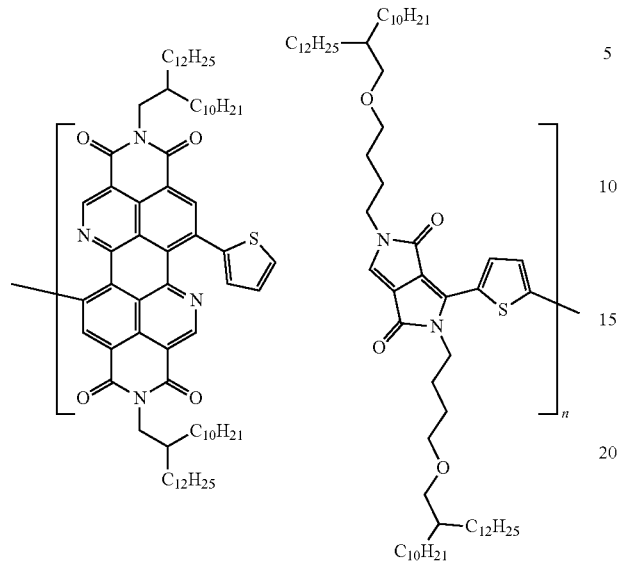
Polymer 7
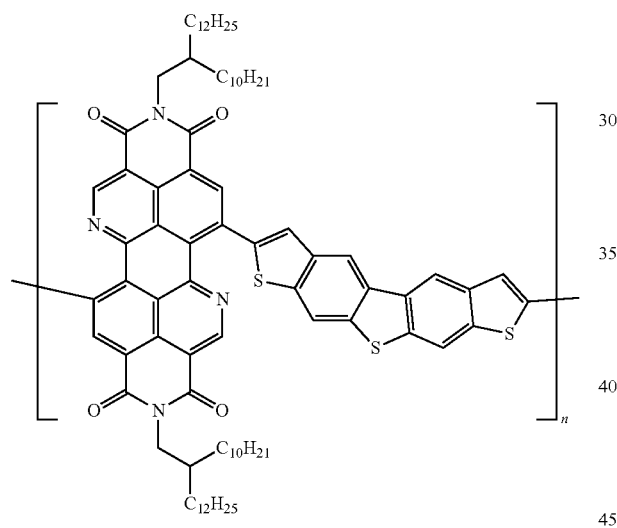
Polymer 9
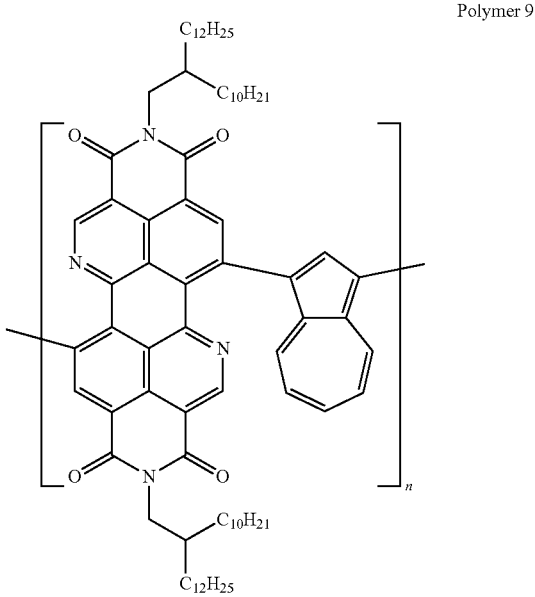
Polymer 8
Polymer 10
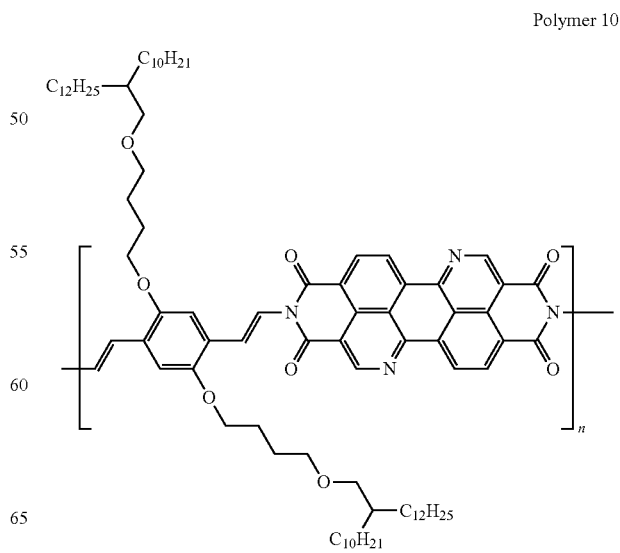

Polymer 11

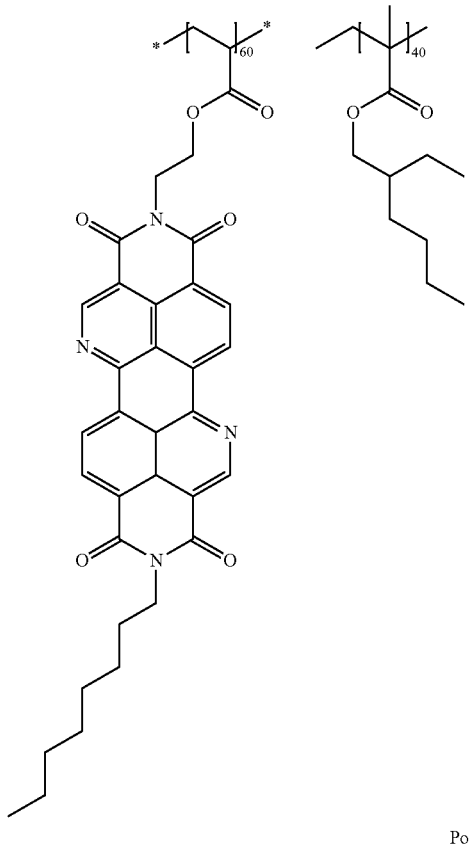

Polymer 12

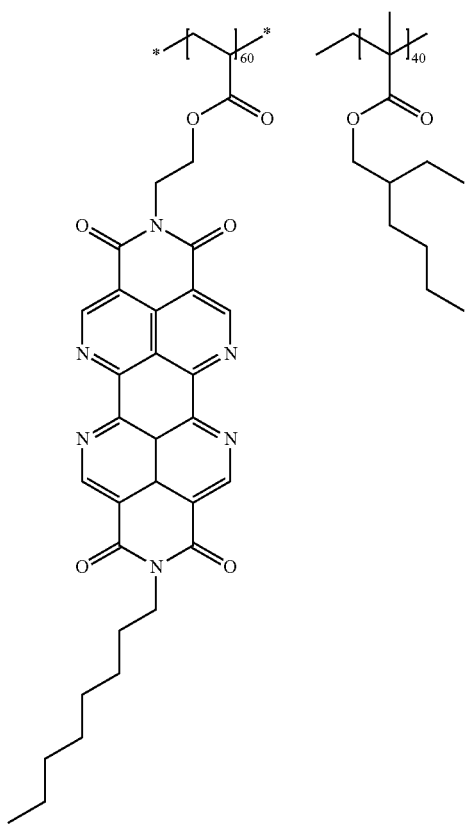

Polymer 13

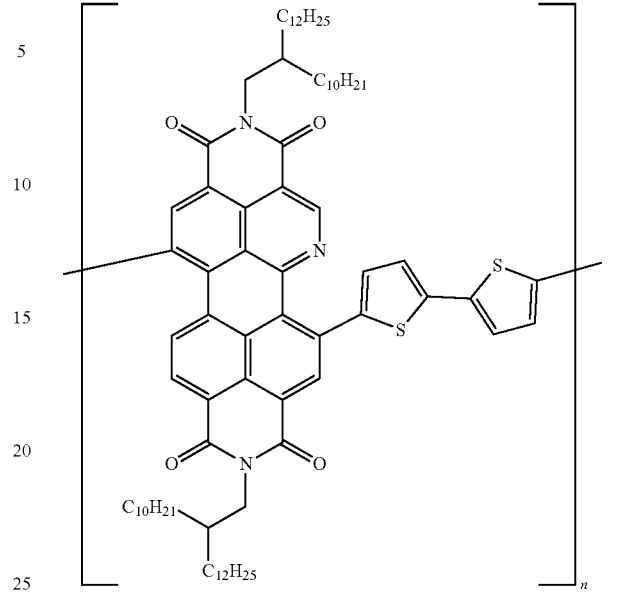

Synthesis Example: Synthesis of Polymer 1

Polymer 1 was synthesized as follows.

(Synthesis of Compound 1-2: dimethyl-2,2'-(9,10-dioxo-9,10-dihydroanthracene-1,5-diyl) bis(2-cyanoacetate)

1-1

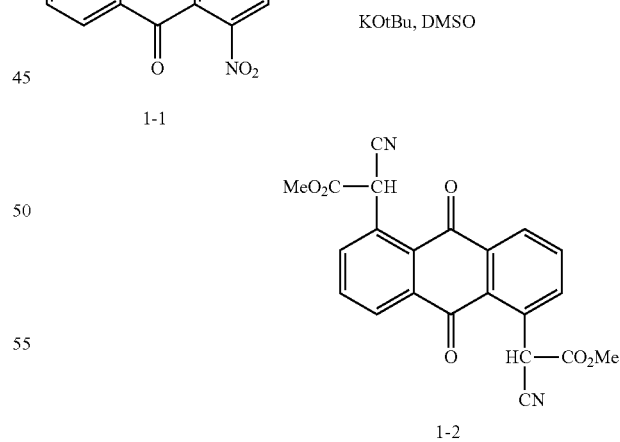

1-2

In the scheme, Me represents methyl, tBu represents t-butyl, and DMSO represents dimethyl sulfoxide, respectively.

At room temperature (20° C.), methyl cyanoacetate (133 g, 1.34 mol) was added to a dimethyl sulfoxide (600 mL) solution of 1,5-dinitroanthraquinone 1-1 (50 g, 168 mmol), and potassium-tert-butoxide (150.6 g, 1.34 mol) was further slowly added while paying attention to heat generation. The mixed solution was heated to 50° C. and stirred for 3 hours. The reaction solution was cooled to room temperature and poured into 2 L of iced water to stop the reaction. The precipitate was separated by filtration and purified by a silica gel column chromatography, thereby obtaining a compound 1-2 (26.0 g, 64.6 mmol, yield: 38%) as a light orange solid.

Synthesis of Compound 1-3: dimethyl-2,8-dihydroxybenzo[de]isoquinolino[1,8-gh]quinoline-3,9-dicarboxylate

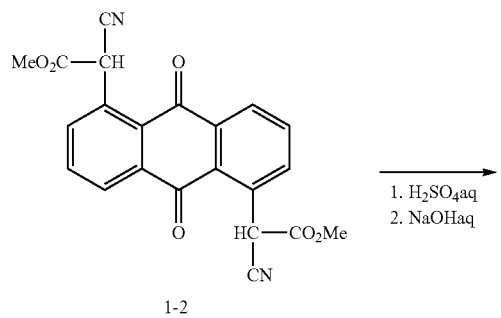

Synthesis of compound 1-4: dimethyl-2,8-bis(((trifluoromethyl)sulfonyl)oxy)benzo[de]isoquinolino[1,8-gh]quinoline-3,9-dicarboxylate

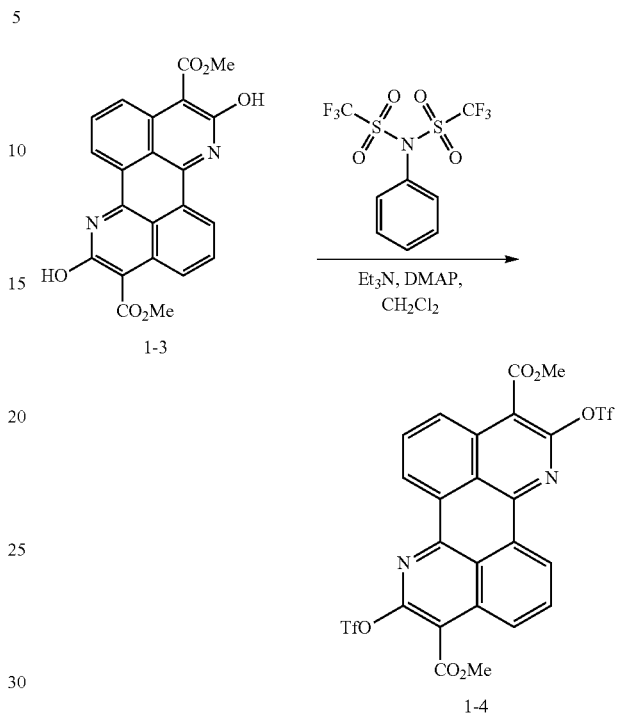

In the scheme, Me represents methyl, Et represents ethyl, DMAP represents 4-dimethylaminopyridine, and Tf represents trifluoromethanesulfonyl, respectively.

The compound 1-3 (17.0 g, 42.3 mmol), 4-dimethylaminopyridine (516 mg, 4.23 mmol), triethylamine (12.8 mL, 93.1 mmol), and 227 mL of dichloromethane were added to a reaction vessel and cooled to −20° C. under an argon atmosphere. N-phenyl bis(trifluoromethansulfonimide) (31.7 g, 88.8 mmol) was added thereto, and the mixed solution was returned to room temperature and stirred for 2 hours. The reaction solution was concentrated by drying under reduced pressure and recrystallized from ethyl acetate, thereby obtaining a compound 1-4 (20.0 g, 30.0 mmol, yield: 71%) as a yellow solid.

Synthesis of Compound 1-5: dimethylbenzo[de]isoquinolino[1,8-gh]quinoline-3,9-dicarboxylate

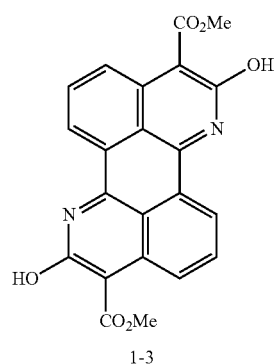

In the scheme, Me represents methyl.

The compound 1-2 (23.0 g, 57.2 mmol) was added to 230 mL of concentrated sulfuric acid, and the solution was stirred for 30 minutes. The obtained concentrated sulfuric acid solution was poured into 1900 mL of water, heated to 50° C., and stirred for 20 minutes. 710 mL of a 50 w/v % sodium hydroxide aqueous solution was added dropwise to the obtained solution and was further heated and stirred at 80° C. for 10 minutes. The reaction solution was cooled to room temperature and then neutralized with concentrated hydrochloric acid. The precipitate was separated by filtration and washed with water and acetone, thereby obtaining a compound 1-3 (20.0 g, 49.7 mmol, yield: 87%) as brown powder.

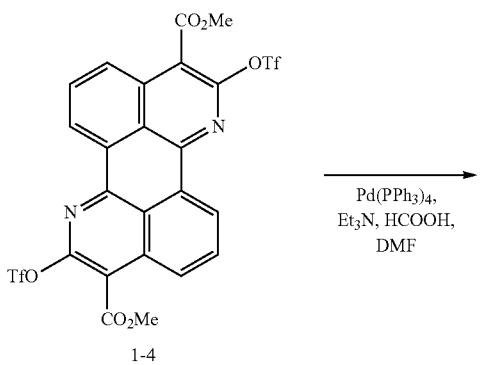

-continued

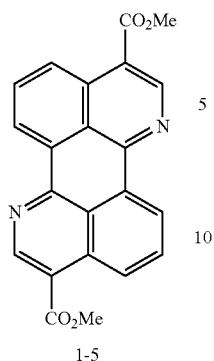

1-5

In the scheme, Me represents methyl, Et represents ethyl, Ph represents phenyl, Tf represents trifluoromethanesulfonyl, and DMF represents dimethylformamide, respectively.

The compound 1-4 (20.0 g, 30.0 mmol), tetrakis(triphenylphosphine)palladium (0) (3.47 g, 3.00 mmol), triethylamine (25.1 mL, 180 mmol), formic acid (6.79 mL, 180 mmol), and 250 mL of dimethylformamide were added to a reaction vessel, heated to 80° C. under an argon atmosphere, and stirred for 2 hours. The reaction solution was cooled to room temperature and poured into 1 L of water to stop the reaction. The precipitate was separated by filtration and washed with water and acetone, thereby obtaining a compound 1-5 (9.17 g, 24.8 mmol, yield: 83%) as a brown solid.

Synthesis of Compound 1-6: dimethyl-4,10-dibromobenzo[de]isoquinolino[1,8-gh]quinoline-3,9-dicarboxylate

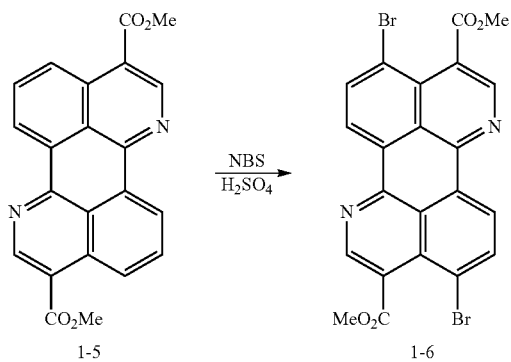

1-5 → 1-6

In the scheme, Me represents methyl and NBS represents N-bromosuccinimide, respectively.

A 50 mL concentrated sulfuric acid solution of the compound 1-5 (4.00 g, 10.8 mmol) and N-bromosuccinimide (14.4 g, 81.0 mmol) were added to a reaction vessel, heated to 50° C., and stirred for 2.5 hours. Next, the reaction solution was poured into 500 mL of iced water to stop the reaction. A 50 w/v % sodium hydroxide aqueous solution was added dropwise thereto for neutralization. Next, the precipitate was separated by filtration and washed with water and acetone, thereby obtaining a compound 1-6 (2.70 g, 5.11 mmol, yield: 47%) as a brown solid.

Synthesis of compound 1-7: 3,9-dimethyl-4,10-bis (2,4,6-trichlorophenyl)benzo[de]isoquinolino[1,8-gh]quinoline-3,4,9,10-tetracarboxylate

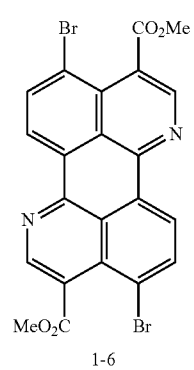 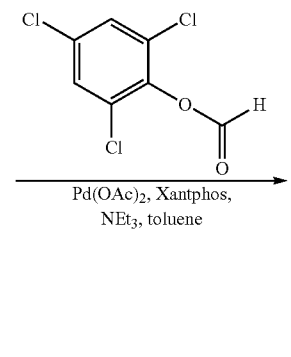

1-6

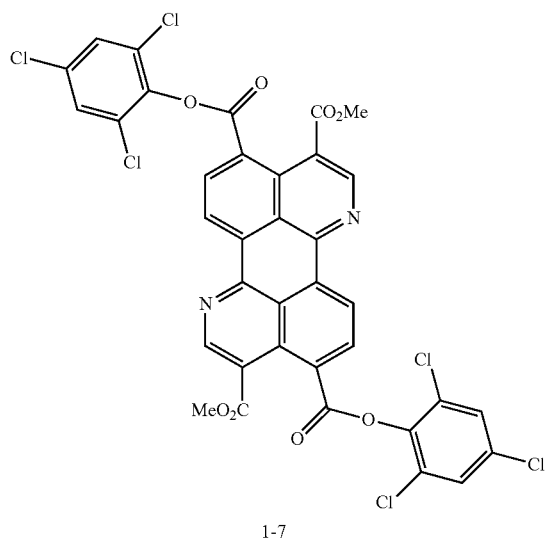

1-7

In the scheme, Me represents methyl, Et represents ethyl, Ac represents acetyl, and Xantphos represents 4,5-bis(diphenylphosphino)-9,9-dimethylxanthene, respectively.

The compound 1-6 (1.40 g, 2.65 mmol), 2,4,6-trichlorophenyl formate (2.53 g, 10.6 mmol), palladium acetate (II) (59.5 mg, 0.265 mmol), 4,5-bis(diphenylphosphino)-9,9-dimethylxanthene (307 mg, 0.530 mmol), and 13.7 mL of toluene were added to a Schlenk tube, and degassed and purged with argon gas. Under an argon atmosphere, triethylamine (1.47 mL, 10.6 mmol) was added to the obtained solution, and the solution was heated to 100° C. and stirred for 12 hours. The reaction solution was cooled to room temperature, and then water was added thereto. The organic layer was extracted with ethyl acetate, washed with brine, and concentrated under reduced pressure. The concentrated residue was purified by silica gel column chromatography, thereby obtaining a compound 1-7 (410 mg, 0.502 mmol, yield: 22%) as a light yellow solid.

Synthesis of Compound 1-8

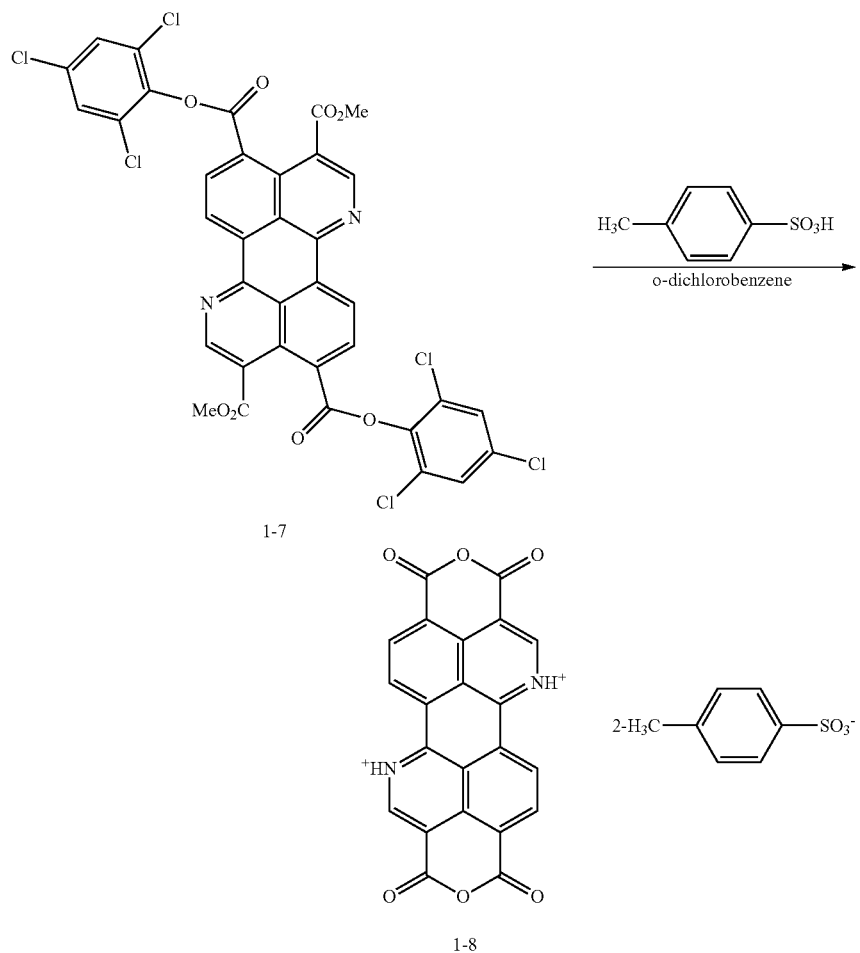

In the scheme, Me represents methyl.

The compound 1-7 (410 mg, 0.502 mmol), p-toluenesulfonic acid monohydrate (477 mg, 2.51 mmol), and 40 mL of o-dichlorobenzene were added to a reaction vessel, heated to 120° C. under an argon atmosphere, and stirred for 12 hours. Thereafter, the reaction solution was dried under reduced pressure to distill off the solvent. The solid content was dispersed in hexane, separated by filtration, and washed with hexane, thereby obtaining a compound 1-8 (194 mg, 0.263 mmol, yield: 52%).

Synthesis of Compound 1-9

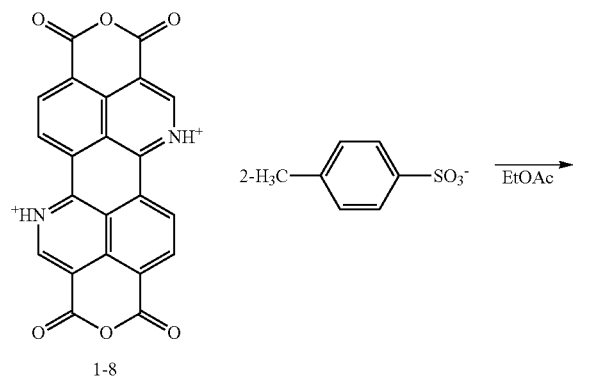

-continued

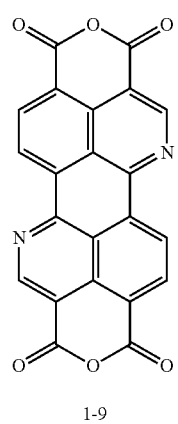

In the scheme, EtOAc represents ethyl acetate.

The obtained compound 1-8 (194 mg, 0.263 mmol) was dispersed in ethyl acetate, separated by filtration, and washed with ethyl acetate, thereby obtaining a compound 1-9 (95 mg, 0.240 mmol, yield: 91%).

Synthesis of Compound 1-10

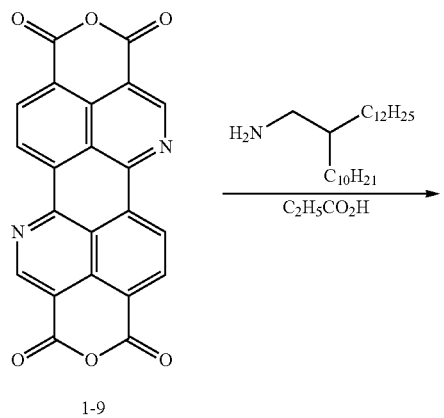

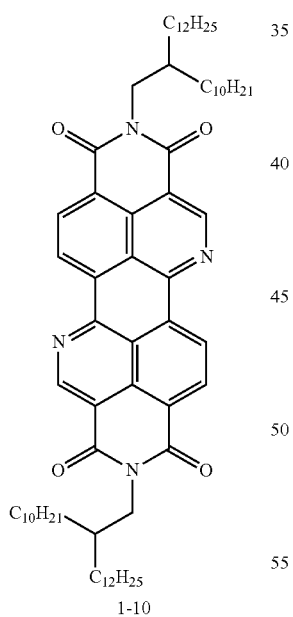

The compound 1-9 (4.93 g, 12.5 mmol), the amine shown in the scheme (13.3 g, 37.5 mmol), and 80 mL of propionic acid were added to a reaction vessel, heated to 140° C. under an argon atmosphere, and stirred for 6 hours. After distilling off the reaction solvent under reduced pressure, the obtained crude product was purified by silica gel column chromatography. By recrystallization from chloroform, a compound 1-10 (9.3 g, 8.7 mmol, yield: 70%) was obtained.

Synthesis of Compound 1-11

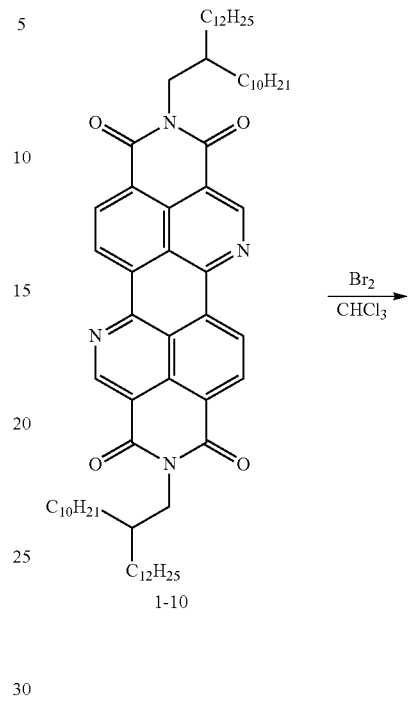

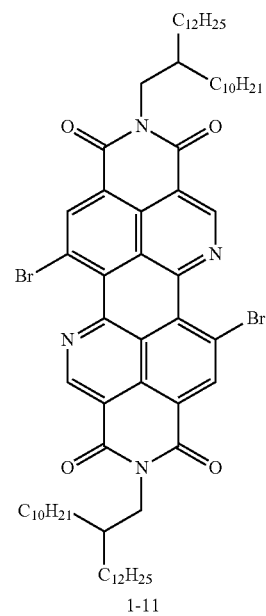

The compound 1-10 (8.7 g, 8.2 mmol), 87 mL of chloroform, and bromine (5.2 g, 32.8 mmol) were added to a reaction vessel, heated to 60° C., and stirred for 6 hours. After cooling with water, the reaction solution was subjected to a liquid separation by adding sodium thiosulfate aqueous solution, and the organic phase was dried with sodium sulfate. The organic phase was filtered, and then the solvent was distilled off from the filtrate under reduced pressure. The obtained crude purified product was purified by silica gel column chromatography, thereby obtaining a compound 1-11 (6.2 g, 5.1 mmol, yield: 62%).

Synthesis of Polymer 1

A polymer 1 was synthesized according to the following scheme.

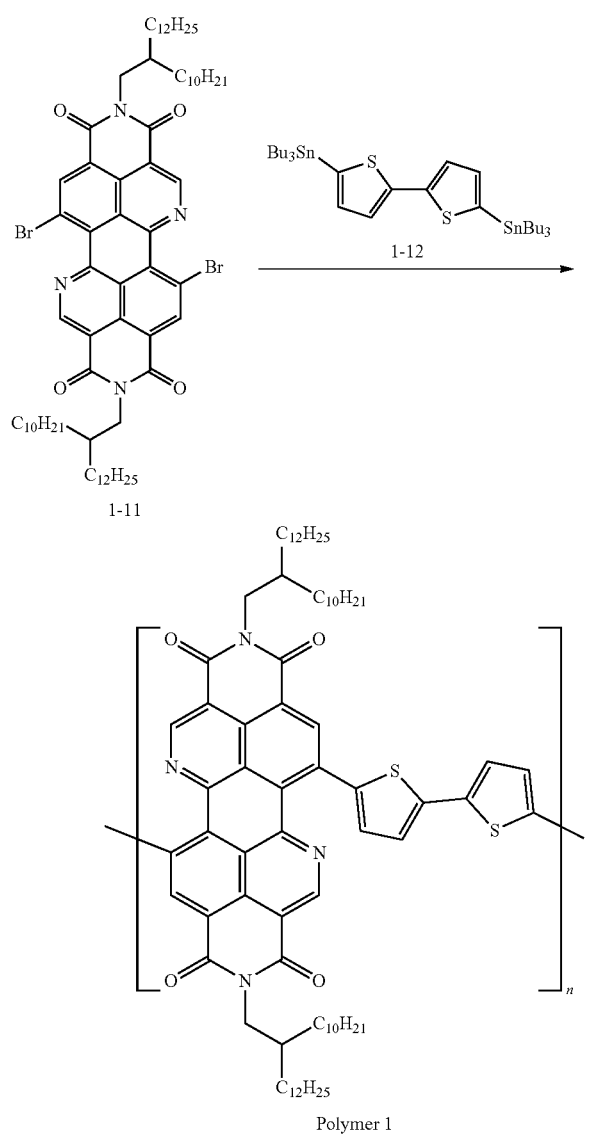

Polymer 1

In the scheme, Bu represents butyl and n represents the number of repeating units, respectively (the same applies hereinafter).

0.5 g of the compound 1-11 was dissolved in 5 mL of N-methylpyrrolidone (NMP). Thereafter, 1 equivalent of a bistributyltin compound 1-12 and 0.03 equivalent of Pd(PPh$_3$)$_4$ were added thereto and stirred for 2 minutes at 80° C. After returning to room temperature, water was added dropwise to the solution, the solution was filtered, and then the obtained filter product was washed with methanol and dried at 50° C. under reduced pressure, thereby obtaining 0.52 g of the polymer 1.

The weight-average molecular weight (Mw, measured by the above-described method; the same applies hereinafter) of the polymer 1 was 3200 (hereinafter, the polymer 1 having Mw of 3200 is referred to as a "polymer 1-1").

Synthesis Examples 2 to 5: Synthesis of Polymers 1-2 to 1-5

A polymer 1-2 was obtained in the same manner as in the synthesis of the polymer 1-1, except that the reaction conditions of the compound 1-11 were changed to a reaction temperature of 70° C. and a reaction time of 30 minutes. The weight-average molecular weight (Mw) of the polymer 1-2 was 12400.

A polymer 1-3 was obtained in the same manner as in the synthesis of the polymer 1-1, except that the reaction conditions of the compound 1-11 were changed to a reaction temperature of 90° C. and a reaction time of 2 hours. The weight-average molecular weight (Mw) of the polymer 1-3 was 48400.

A polymer 1-4 was obtained in the same manner as in the synthesis of the polymer 1-1, except that the reaction conditions of the compound 1-11 were changed to a reaction temperature of 110° C. and a reaction time of 3 hours. The weight-average molecular weight (Mw) of the polymer 1-4 was 95900.

A polymer 1-5 was obtained in the same manner as in the synthesis of the polymer 1-1, except that the reaction conditions of the compound 1-11 were changed to a reaction temperature of 120° C. and a reaction time of 6 hours. The weight-average molecular weight (Mw) of the polymer 1-5 was 146300.

Synthesis Example 6: Synthesis of Polymer 2

A polymer 2 was obtained in the same manner as in the synthesis of the polymer 1-3, except that the following compound 2-1 synthesized by the method described in Molecules, 2012, vol. 17, #10, p. 1216 to 1217 was used instead of the compound 1-12.

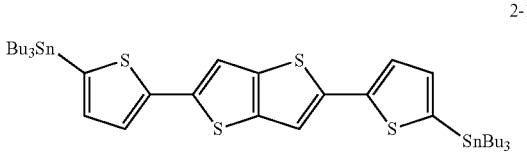

Synthesis Example 7: Synthesis of Polymer 3

A polymer 3 was obtained in the same manner as in the synthesis of the polymer 1-3, except that the following compound 3-1 synthesized by the method described in Journal of Polymer Science, Part A: Polymer Chemistry, 2013, vol. 51, #9, p. 1933 to 1941 was used instead of the compound 1-12.

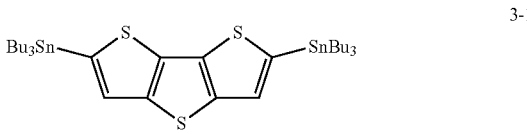

Synthesis Example 8: Synthesis of Polymer 4

A polymer 4 was obtained in the same manner as in the synthesis of the polymer 1-3, except that the following compound 4-1 synthesized by the method described in Dyes and Pigments, 2017, vol. 141, p. 262 to 268 was used instead of the compound 1-12.

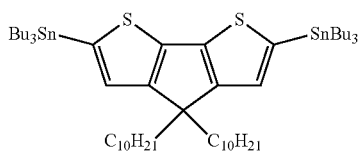

4-1

Synthesis Example 9: Synthesis of Polymer 5

A polymer 5 was obtained in the same manner as in the synthesis of the polymer 1-3, except that the following compound 5-1 synthesized by the method described in US2011/306541A was used instead of the compound 1-12.

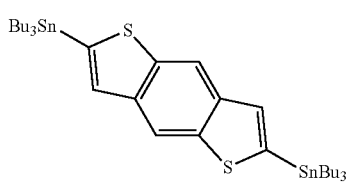

5-1

Synthesis Example 10: Synthesis of Polymer 6

A polymer 6 was obtained in the same manner as in the synthesis of the polymer 1-3, except that the following compound 6-2 was used instead of the compound 1-12. The compound 6-2 was synthesized according to the following scheme using the following compound 6-1 synthesized by the method described in WO2016/148169A. In the following scheme, Bu represents butyl and Ph represents phenyl, respectively.

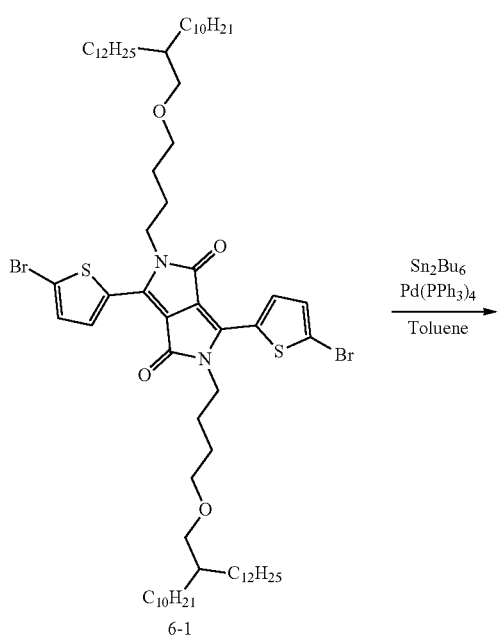

6-1

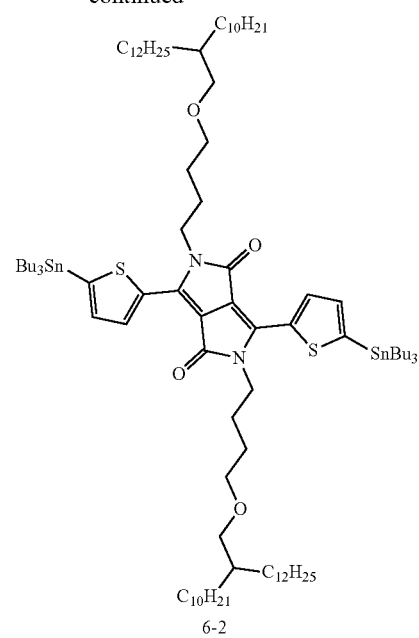

6-2

Synthesis Example 11: Synthesis of Polymer 7

A polymer 7 was obtained in the same manner as in the synthesis of the polymer 1-3, except that the following compound 7-2 was used instead of the compound 1-12. The compound 7-2 was synthesized according to the following scheme using the following compound 7-1 synthesized by the method described in Journal of Materials Chemistry C, 2017, vol. 5, #8, p. 1903 to 1909. In the following scheme, Bu represents butyl and Ph represents phenyl.

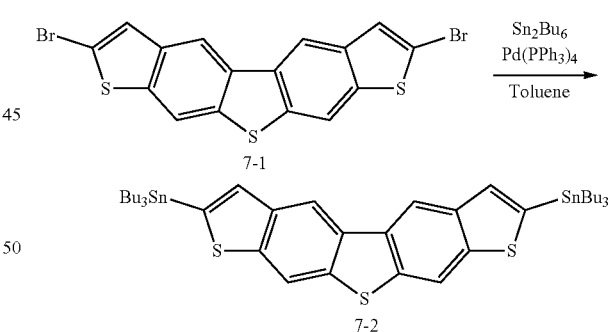

7-1

7-2

Synthesis Example 12: Synthesis of Polymer 8

A polymer 8 was obtained in the same manner as in the synthesis of the polymer 1-3, except that the following compound 8-3 was used instead of the compound 1-12. The compound 8-3 was synthesized according to the following scheme using the following compound 8-1 synthesized by the method described in WO2010/024388A. In the following scheme, Bu represents butyl and Ph represents phenyl.

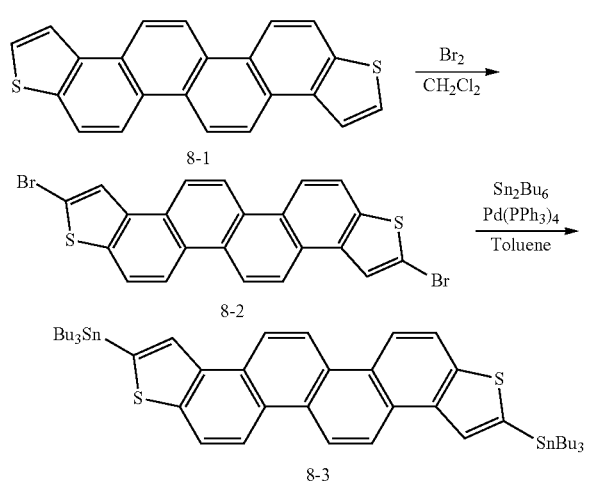

Synthesis Example 13: Synthesis of Polymer 9

A polymer 9 was obtained in the same manner as in the synthesis of the polymer 1-3, except that the following compound 9-2 was used instead of the compound 1-12. The compound 9-2 was synthesized according to the following scheme using the following compound 9-1. In the following scheme, Bu represents butyl and Ph represents phenyl.

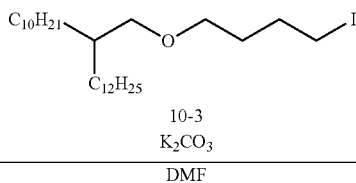

Synthesis Example 14: Synthesis of Polymer 10

A polymer 10 was synthesized according to the following scheme.

In the following scheme, Me represents methyl, Et represents ethyl, and Ph represents phenyl. In addition, DIBAL-H represents diisobutylaluminum hydride.

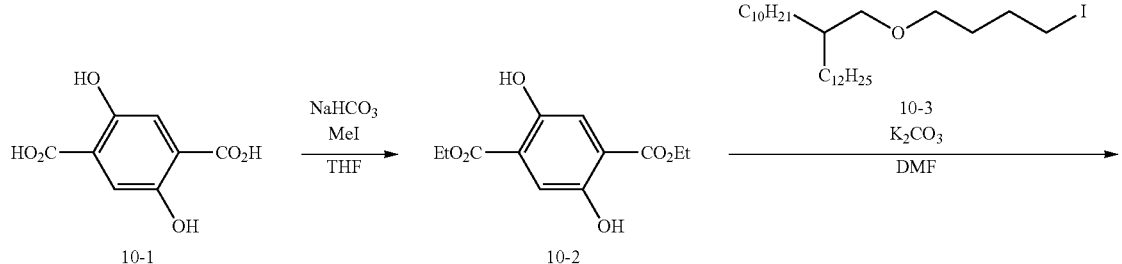

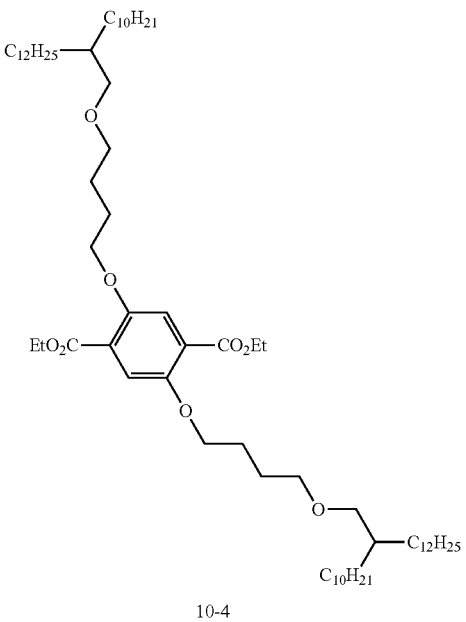

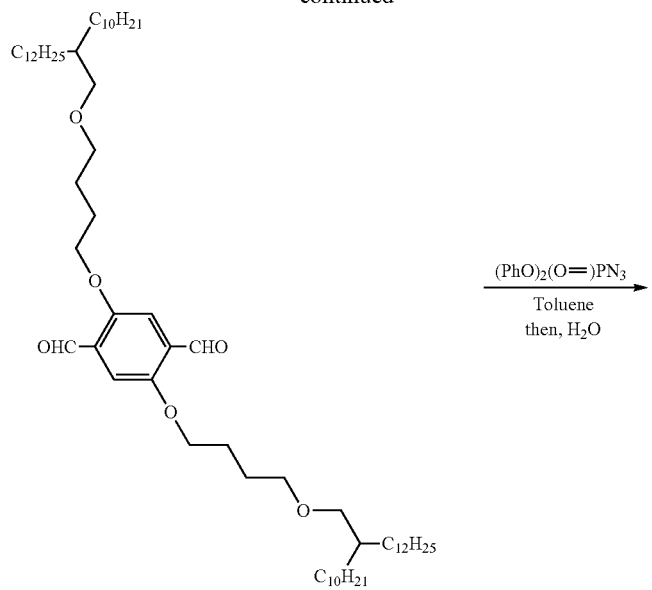
10-5
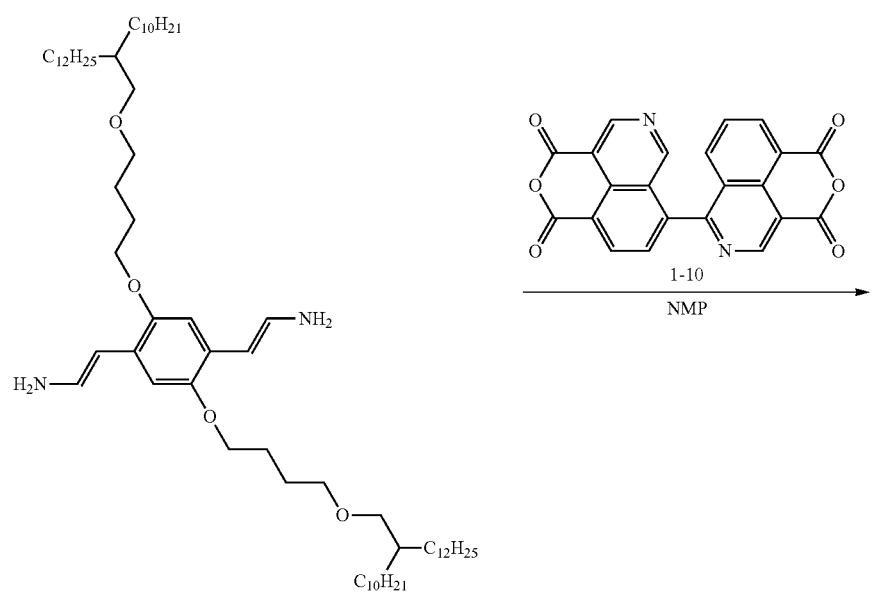
10-6

-continued
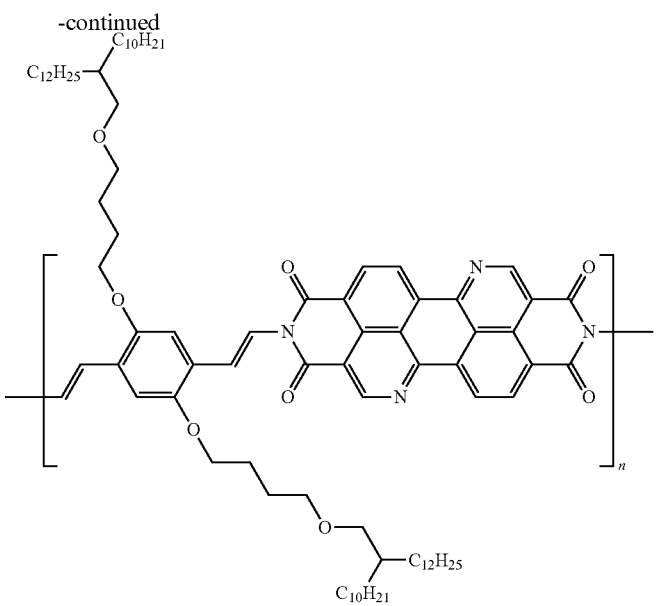
Polymer 10
Synthesis Example 15: Synthesis of Polymer 11
A polymer 11 was synthesized according to the following scheme.
In the following scheme, 2-EHMA represents 2-ethylhexyl methacrylate.
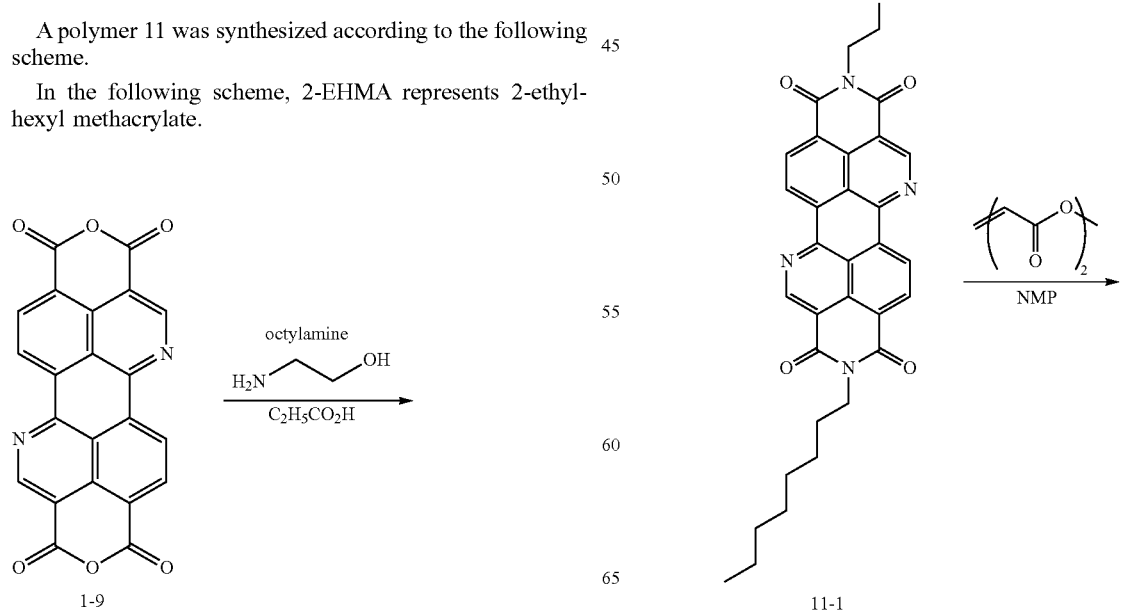

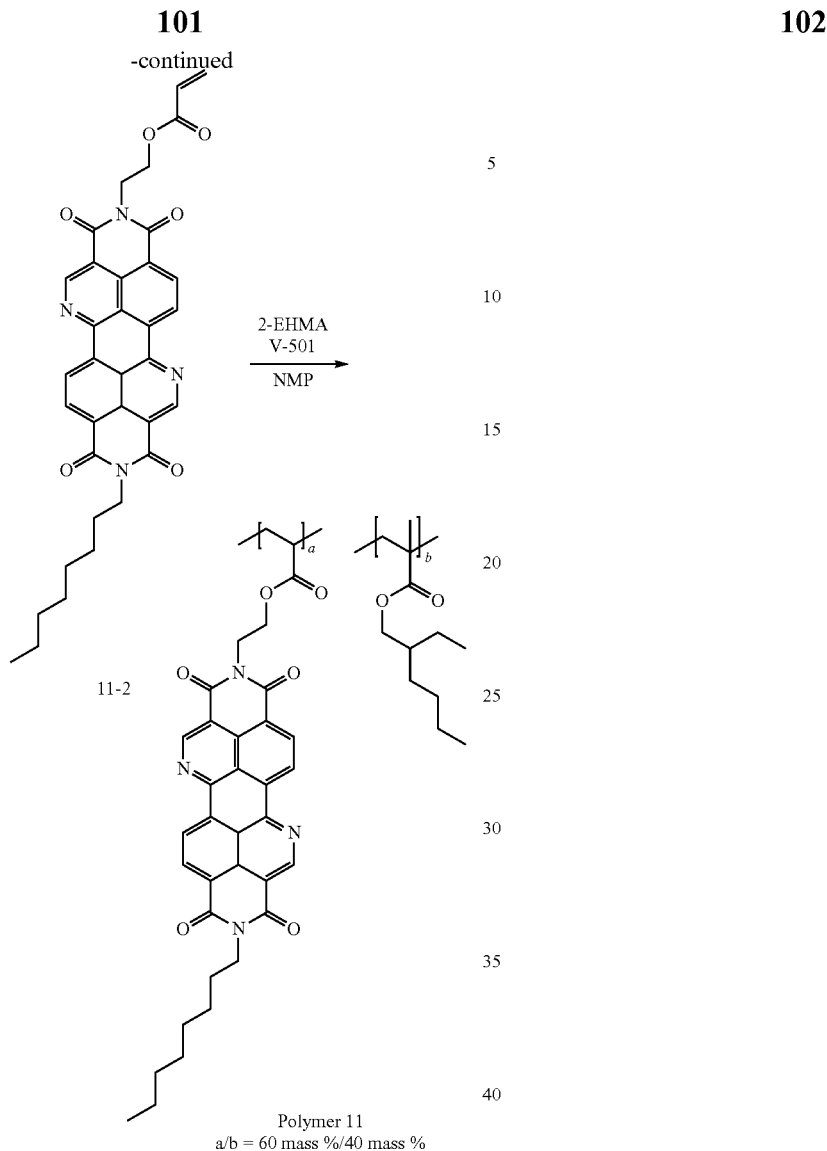

Polymer 11
a/b = 60 mass %/40 mass %

Synthesis Example 16: Synthesis of Polymer 12

A compound 12-6 was synthesized according to the following scheme.

A perylene compound in which the carbon atoms at 6-position and 12-position of the compound 1-9 were further substituted with nitrogen atoms was obtained in the same manner as in the synthesis of the polymer 1-3, except that the following compound 12-6 was used instead of the compound 1-1. A polymer 12 was obtained in the same manner as in the synthesis of the polymer 11, except that the perylene compound was used instead of the compound 1-9.

The following compound 12-2 was synthesized with reference to the method described in Journal of Labelled Compounds and Radiopharmaceuticals, 1997, vol. 42, #5, p. 1737 to 1744. In addition, the following compound 12-5 was synthesized with reference to the method described in Bioorganic & Medicinal Chemistry Letters 14 (2004), p. 3929 to 3932.

In the following scheme, Me represents methyl, Et represents ethyl, TMS represents trimethylsilyl, and Tf represents trifluoromethanesulfonyl, respectively.

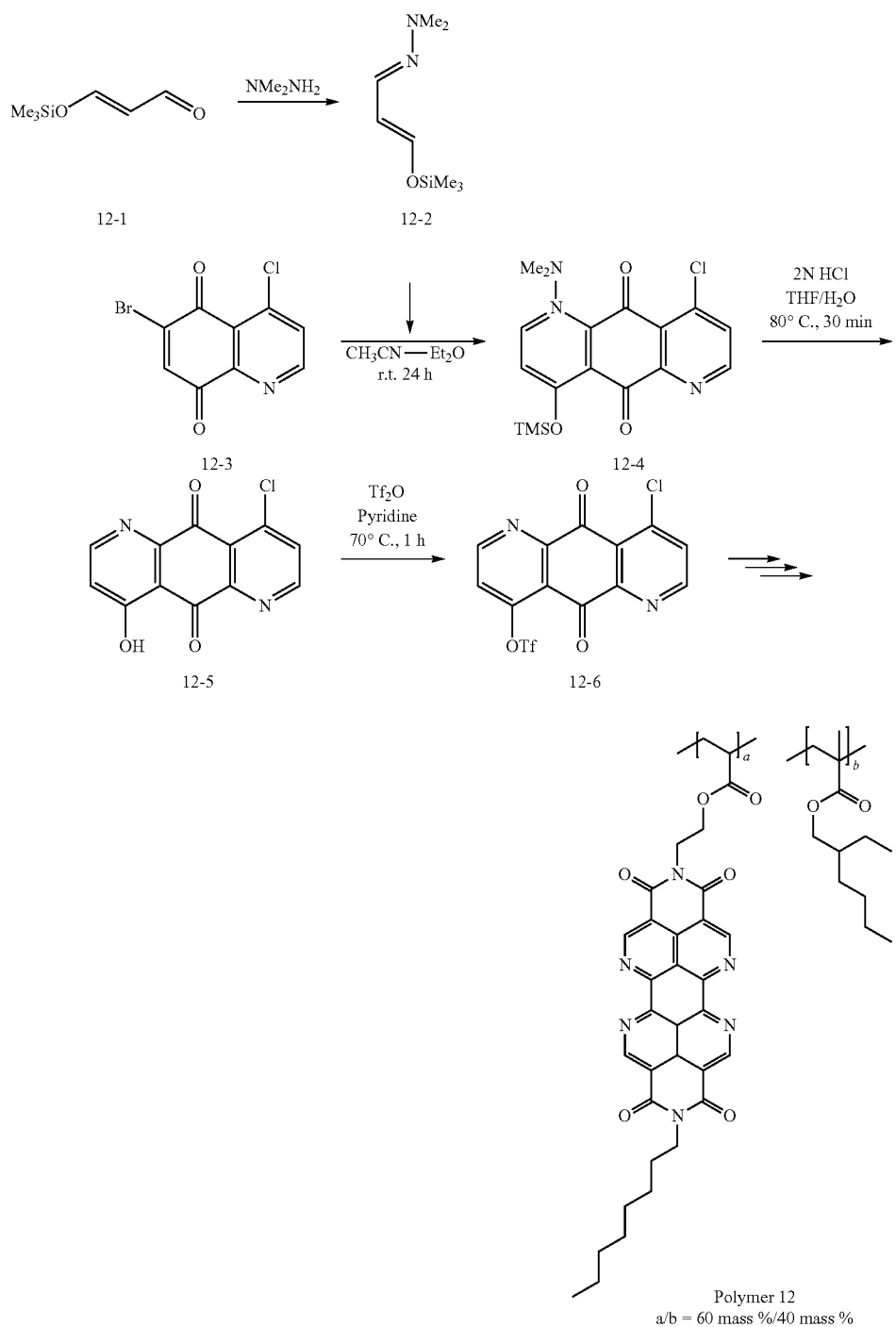

Polymer 12
a/b = 60 mass %/40 mass %

Synthesis Example 17: Synthesis of Polymer 13

A compound 13-5 was synthesized according to the following scheme.

A polymer 13 was obtained in the same manner as in the synthesis of the polymer 1-1, except that the following compound 13-5 was used instead of the compound 1-5.

The following compound 13-2 was synthesized with reference to the method described in Journal of Labelled Compounds and Radiopharmaceuticals, 1997, vol. 42, #5, p. 1737 to 1744. In addition, the following compound 13-5 was synthesized with reference to the method described in Bio-organic & Medicinal Chemistry Letters 14 (2004), p. 3929 to 3932.

In the following scheme, Me represents methyl, LDA represents lithium diisopropylamide, TBS represents a tert-butyldimethylsilyl group, tBu represents a tert-butyl group, DMI represents 1,3-dimethyl-2-imidazolidinone, NBS represents N-bromosuccinimide, Ph represents a phenyl group, and IBX represents 2-iodoxybenzoic acid, respectively.

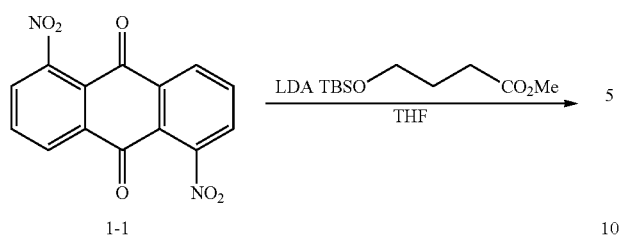

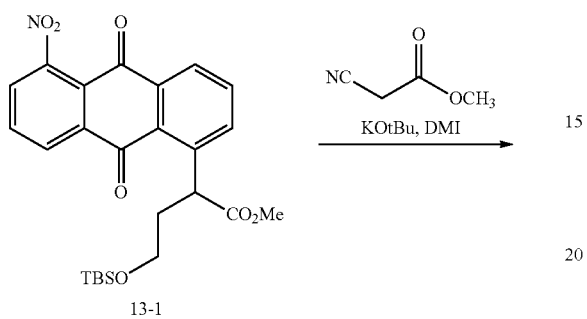

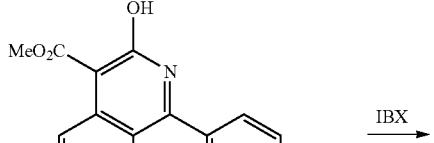

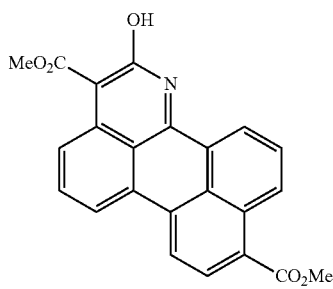

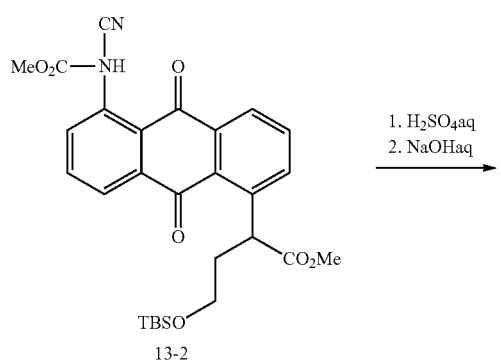

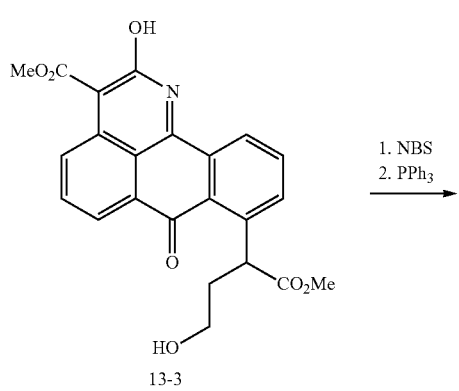

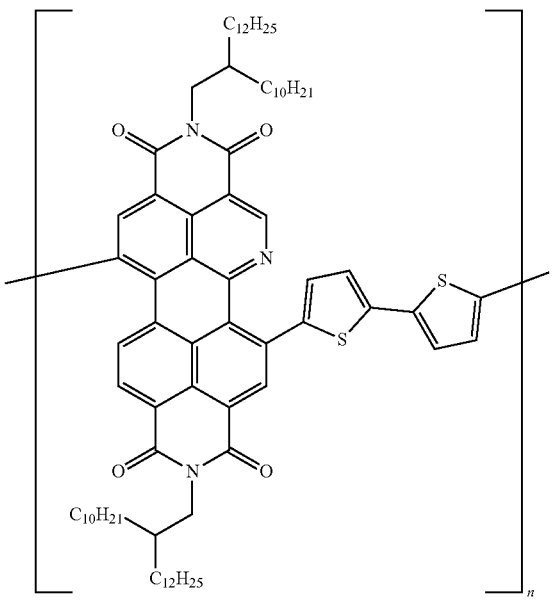

Polymer 13

<Compound for Comparison>

Comparative compounds c1 to c4 shown below were prepared.

The comparative compound c1 is a compound described in paragraph 0076 of JP2015-153780A.

The comparative compounds c2 and c3 are respectively compounds described in Example 3 and Example 4 of JP2011-514913A.

The comparative compound c4 is a compound described in paragraph 0082 of JP2011-514913A (1-methylhexyl was adopted as $R^1$).

c1

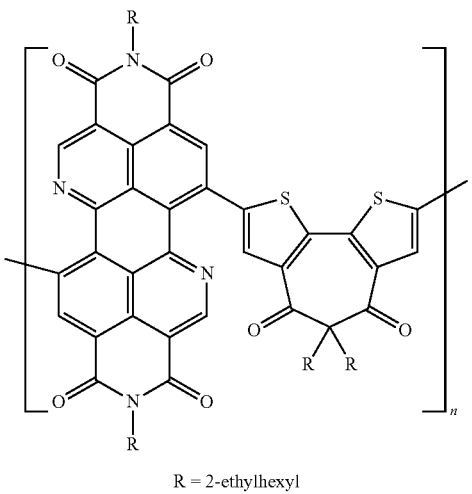

R = 2-ethylhexyl c2

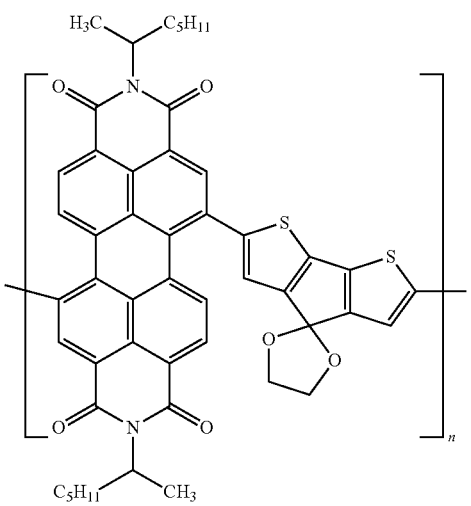

c3

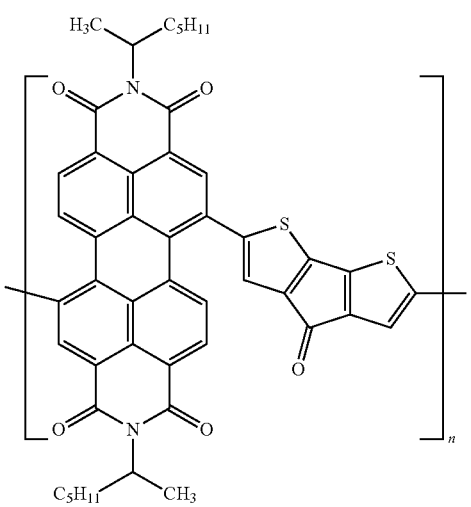

c4

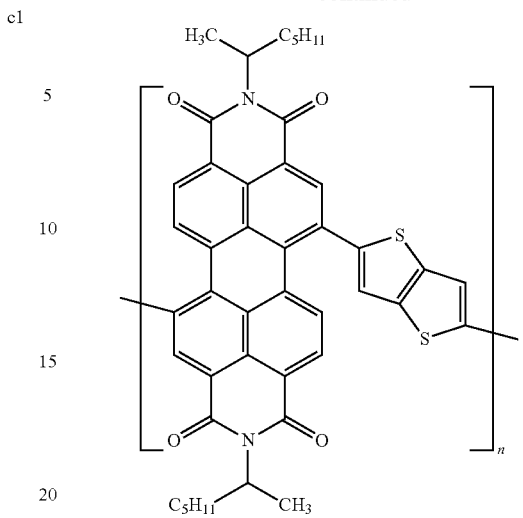

<Measurement of Weight-Average Molecular Weight>

Tables 1 and 2 show the results obtained by measuring, by the above-described method, the weight-average molecular weights of the produced polymers 1 to 13 and comparative compounds c1 to c4.

Example 1

The bottom gate-bottom contact type organic thin film transistor element 100 (not having the sealing layer 60) having the structure shown in FIG. 1 was produced and characteristics thereof were evaluated.

<Preparation of Organic Semiconductor Composition>

A 0.3 mass % solution of the polymer 1-1 was prepared by mixing the polymer 1-1 synthesized above and tetralin as a solvent, and heated to 40° C., thereby obtaining an organic semiconductor composition 1-1.

In addition, organic semiconductor compositions 1-2 to 1-17 and comparative compositions c1-1 to c1-4 were respectively prepared in the same manner described above, except that the polymers 1-2 to 1-5 and 2 to 13, and the comparative polymers c1 to c4 were used instead of the polymer 1-1.

[Manufacturing of Bottom Gate-Bottom Contact Type Organic Thin Film Transistor Element by Coating Process]

An organic thin film transistor element 1-1 (hereinafter, also referred to as an "element 1-1") was obtained by casting (drop cast method) the organic semiconductor composition 1-1 on the following substrate for the field effect transistor (FET) characteristic measurement heated to 40° C. under a nitrogen atmosphere, and drying for 5 hours to form an organic semiconductor film having a thickness of 20 nm.

As the substrate for FET characteristic measurement, a silicon substrate (thickness: 0.4 mm, corresponding to a substrate including a gate electrode) having a bottom gate-bottom contact structure including chromium/gold (gate width W=2000 μm, gate length L=100 μm, ratio W/L=20) disposed in a comb shape as source and drain electrodes and $SiO_2$ (film thickness of 500 nm) as a gate insulating layer was used.

Organic thin film transistor elements 1-2 to 1-17 (hereinafter, also referred to as "elements 1-2 to 1-17") and comparative organic thin film transistor elements c1-1 to c1-4 (hereinafter, also referred to as "comparative elements c1-1 to c1-4) were manufactured in the same manner as in the manufacturing of the element 1-1, except that the organic semiconductor compositions 1-2 to 1-17 and the comparative compositions c1-1 to c1-4 were respectively used instead of the organic semiconductor composition 1-1. The obtained elements 1-2 to 1-17 and the obtained comparative elements c1-1 to c1-4 were respectively used as organic thin film transistor elements in Examples 1-1 to 1-17, and Comparative Examples 1-1 to 1-4.

<Evaluation of Organic Thin Film Transistor Element>

With respect to each of the manufactured organic thin film transistor elements, carrier mobility under a normal atmospheric pressure of 1 atm (temperature: room temperature) was evaluated using a semiconductor parameter analyzer (4156C, manufactured by Agilent Technologies, Inc.) connected to a semi-auto prober (AX-2000, manufactured by Vector Semiconductor Co., Ltd.). The results are shown in Table 1.

(Evaluation of Carrier Mobility)

1. Measurement of Carrier Mobility $\mu^{ini}$ (Initial Carrier Mobility) after Manufacturing A voltage of −80 V was applied between the source electrode and the drain electrode of each organic thin film transistor element, the gate voltage was changed to in a range of +20 V to −100 V, and the carrier mobility $\mu^{ini}$ (cm$^2$/Vs) was calculated using the following equation representing the drain current $I_d$. It was determined that the calculated carrier mobility $\mu^{ini}$ was included in any of the evaluation standards described below.

It is preferable that the carrier mobility $\mu^{ini}$ is high, and in the present test, the carrier mobility $\mu^{ini}$ is preferably rank "D" or more, more preferably rank "C" or more, and still more preferably rank "A" or more.

$$I_d = (W/2L)\mu C_i (V_g - V_{th})^2$$

In the equation, L represents the gate length, w represents the gate width, μ represents the carrier mobility, $C_i$ represents the capacity per unit area of the gate insulating film, $V_g$ represents the gate voltage, and $V_{th}$ represents the threshold voltage, respectively.

—Evaluation Standard—

"AA": 1 cm$^2$/Vs or more
"A": 0.8 cm$^2$/Vs or more and less than 1 cm$^2$/Vs
"B": 0.6 cm$^2$/Vs or more and less than 0.8 cm$^2$/Vs
"C": 0.4 cm$^2$/Vs or more and less than 0.6 cm$^2$/Vs
"D": 0.2 cm$^2$/Vs or more and less than 0.4 cm$^2$/Vs
"E": 0.1 cm$^2$/Vs or more and less than 0.2 cm$^2$/Vs
"F": 0.05 cm$^2$/Vs or more and less than 0.1 cm$^2$/Vs
"G": less than 0.05 cm$^2$/Vs 2. Measurement of Carrier Mobility $\mu^{af}$ after Allowing to Stand in Atmosphere Each of the manufactured organic thin film transistor elements was allowed to stand for 1 week under a normal atmospheric pressure (temperature: room temperature, humidity: 50 RH %), and then the carrier mobility $\mu^{af}$ after allowing to stand in atmosphere was measured and evaluated in the same manner as 1. Measurement of the carrier mobility after manufacturing.

TABLE 1

| Element | Organic semi-conductor layer | Weight-average molecular | Carrier mobility (cm$^2$/Vs) | |
|---|---|---|---|---|
| number | Polymer | weight | $\mu^{ini}$ | $\mu^{af}$ |
| Examples 1-1 | Element 1-1 | Polymer 1-1 | 3200 | AA | AA |
| Examples 1-2 | Element 1-2 | Polymer 1-2 | 12400 | AA | AA |
| Examples 1-3 | Element 1-3 | Polymer 1-3 | 48400 | AA | AA |
| Examples 1-4 | Element 1-4 | Polymer 1-4 | 95900 | AA | AA |
| Examples 1-5 | Element 1-5 | Polymer 1-5 | 146300 | AA | AA |
| Examples 1-6 | Element 1-6 | Polymer 2 | 52400 | A | A |
| Examples 1-7 | Element 1-7 | Polymer 3 | 43900 | AA | AA |
| Examples 1-8 | Element 1-8 | Polymer 4 | 49100 | A | A |
| Examples 1-9 | Element 1-9 | Polymer 5 | 62000 | A | A |
| Examples 1-10 | Element 1-10 | Polymer 6 | 18600 | B | B |
| Examples 1-11 | Element 1-11 | Polymer 7 | 31800 | B | B |
| Examples 1-12 | Element 1-12 | Polymer 8 | 42700 | C | C |
| Examples 1-13 | Element 1-13 | Polymer 9 | 43400 | C | C |
| Examples 1-14 | Element 1-14 | Polymer 10 | 35400 | C | C |
| Examples 1-15 | Element 1-15 | Polymer 11 | 26700 | D | D |
| Examples 1-16 | Element 1-16 | Polymer 12 | 34200 | D | D |
| Examples 1-17 | Element 1-17 | Polymer 13 | 18500 | D | D |
| Comparative Examples 1-1 | Comparative element c1-1 | Comparative polymer c1 | 10300 | F | F |
| Comparative Examples 1-2 | Comparative element c1-2 | Comparative polymer c2 | 15400 | F | G |
| Comparative Examples 1-3 | Comparative element c1-3 | Comparative polymer c3 | 25100 | F | G |
| Comparative Examples 1-4 | Comparative element c1-4 | Comparative polymer c4 | 20500 | F | G |

From the results shown in Table 1, the following is found.

All of the organic thin film transistor elements c1-1 to c1-4 do not have sufficient semiconductor characteristics (carrier mobility $\mu^{ini}$) after manufacturing (initial). In addition, all of the organic thin film transistor elements c1-2 to c1-4 are deteriorated in initial carrier mobility $\mu^{ini}$ by allowing to stand under an atmosphere and do not exhibit sufficient durability.

In contrast, even in a case of the bottom gate-bottom contact type which has large exposed area of an organic semiconductor film to the atmosphere, all of the organic thin film transistor elements 1-1 to 1-17 of the present invention include an organic semiconductor layer containing the polymer of the present invention and exhibit high initial carrier mobility $\mu^{ini}$. In addition, all of the organic thin film transistor elements 1-1 to 1-17 of the present invention maintain high carrier mobility without decreasing the initial carrier mobility $\mu^{ini}$ in a case of allowing to stand in an atmosphere and exhibit excellent carrier mobility $\mu^{af}$ after allowing to stand. As described above, it was shown that the organic thin film transistor element of the present invention has high carrier mobility and can be stably driven under the atmosphere for a long time. In addition, it was confirmed that, although the use is not particularly limited, all of the polymers 1-1 to 1-5 and 2 to 13 of the present invention can be preferably used as an organic semiconductor material of the organic thin film transistor element, which exhibits the above-described excellent characteristics.

Example 2

The bottom gate-bottom contact type organic thin film transistor element 100 (not having the sealing layer 60) having the structure shown in FIG. 1 was produced and characteristics thereof were evaluated.

<Preparation of Organic Semiconductor Composition>

A coating solution was prepared by dissolving 0.5 mass % of the polymer 1-1, 0.5 mass % of poly α-methylstyrene, and 0.05% of BYK 323 (manufactured by BYK) as a surfactant in tetralin, thereby obtaining an organic semiconductor composition 2-1.

In addition, organic semiconductor compositions 2-2 to 2-17 and comparative compositions c2-1 to c2-4 were respectively prepared in the same manner described above, except that the polymers 1-2 to 1-5 and 2 to 13, and the comparative polymers c1 to c4 were used instead of the polymer 1-1.

[Manufacturing of Bottom Gate-Bottom Contact Type Organic Thin Film Transistor Element by Flexographic Printing]

In the same manner as in the manufacturing of the element 1-1, a bottom gate-bottom contact type substrate for FET characteristic measurement was prepared, and the organic semiconductor composition 2-1 was printed thereon by a flexographic printing method to form an organic semiconductor layer. Thus, an organic thin film transistor element 2-1 (hereinafter, also referred to as an "element 2-1") was obtained.

Specific method of forming the organic semiconductor layer by a flexographic printing method is as described below.

A flexo aptitude testing machine F1 (manufactured by IDC Testing Systems Co., Ltd.) was used as a printing device, and 1.70% of AFP DSH (manufactured by Asahi Kasei Co., Ltd.)/solid image was used as a flexo resin plate. Printing was performed at the pressure between the printing plate and the substrate of 60 N and a transport speed of 0.4 m/sec, and drying was performed at 60° C. for two hours to form an organic semiconductor layer (film thickness: 50 nm).

Organic thin film transistor elements 2-2 to 2-17 (hereinafter, also referred to as "elements 2-2 to 2-17") and comparative organic thin film transistor elements c2-1 to c2-4 (hereinafter, also referred to as "comparative elements c2-1 to c2-4) were manufactured in the same manner as in the manufacturing of the element 2-1, except that the organic semiconductor compositions 2-2 to 2-17 and the comparative compositions c2-1 to c2-4 were respectively used instead of the organic semiconductor composition 2-1. The obtained elements 2-1 to 2-17 and comparative elements c2-1 to c2-4 were respectively used as the organic thin film transistor elements in Examples 2-1 to 2-17 and Comparative Examples 2-1 to 2-4.

<Evaluation of Organic Thin Film Transistor Element>

With respect to each of the manufactured organic thin film transistor elements, carrier mobility $\mu^{ini}$ and $\mu^{af}$ were evaluated in the same as that of Example 1. The results are shown in Table 2.

TABLE 2

| | Element number | Organic semiconductor layer Polymer | Weight-average molecular weight | Carrier mobility (cm$^2$/Vs) $\mu^{ini}$ | $\mu^{af}$ |
|---|---|---|---|---|---|
| Examples 2-1 | Element 2-1 | Polymer 1-1 | 3200 | B | B |
| Examples 2-2 | Element 2-2 | Polymer 1-2 | 12400 | B | B |
| Examples 2-3 | Element 2-3 | Polymer 1-3 | 48400 | B | B |
| Examples 2-4 | Element 2-4 | Polymer 1-4 | 95900 | B | B |
| Examples 2-5 | Element 2-5 | Polymer 1-5 | 146300 | C | C |
| Examples 2-6 | Element 2-6 | Polymer 2 | 52400 | D | D |
| Examples 2-7 | Element 2-7 | Polymer 3 | 43900 | D | D |
| Examples 2-8 | Element 2-8 | Polymer 4 | 49100 | C | C |
| Examples 2-9 | Element 2-9 | Polymer 5 | 62000 | E | E |
| Examples 2-10 | Element 2-10 | Polymer 6 | 18600 | E | E |
| Examples 2-11 | Element 2-11 | Polymer 7 | 31800 | D | D |
| Examples 2-12 | Element 2-12 | Polymer 8 | 42700 | E | E |
| Examples 2-13 | Element 2-13 | Polymer 9 | 43400 | E | E |
| Examples 2-14 | Element 2-14 | Polymer 10 | 35400 | E | E |
| Examples 2-15 | Element 2-15 | Polymer 11 | 26700 | E | E |
| Examples 2-16 | Element 2-16 | Polymer 12 | 34200 | E | E |
| Examples 2-17 | Element 2-17 | Polymer 13 | 18500 | E | E |
| Comparative Examples 2-1 | Comparative element c2-1 | Comparative polymer c1 | 10300 | F | F |
| Comparative Examples 2-2 | Comparative element c2-2 | Comparative polymer c2 | 15400 | F | G |
| Comparative Examples 2-3 | Comparative element c2-3 | Comparative polymer c3 | 25100 | F | G |
| Comparative Examples 2-4 | Comparative element c2-4 | Comparative polymer c4 | 20500 | F | G |

From the results shown in Table 2, the following is found.

All of the organic thin film transistor elements c2-1 to c2-4 do not have sufficient semiconductor characteristics (carrier mobility $\mu^{ini}$) after manufacturing (initial). In addition, all of the organic thin film transistor elements c1-2 to c1-4 are deteriorated in initial carrier mobility $\mu^{ini}$ by allowing to stand under an atmosphere and do not also exhibit sufficient durability.

In contrast, even in a case of the bottom gate-bottom contact type which has large exposed area of an organic semiconductor film to the atmosphere, all of the organic thin film transistor elements 2-1 to 2-17 of the present invention include an organic semiconductor film containing the polymer of the present invention. Therefore, all of the organic thin film transistor elements 2-1 to 2-17 of the present invention exhibit high initial carrier mobility $\mu^{ini}$. In addition, all of the organic thin film transistor elements 1-1 to 1-17 of the present invention maintain high carrier mobility without decreasing the initial carrier mobility $\mu^{ini}$ in a case of allowing to stand in an atmosphere and have excellent carrier mobility $\mu^{af}$ after allowing to stand. As described above, the organic thin film transistor element of the present invention has high carrier mobility and can be stably driven under the atmosphere for a long time. In addition, all of the polymers 1-1 to 1-5 and 2 to 13 of the present invention can be preferably used as an organic semiconductor material of the organic thin film transistor element, which exhibits the above-described excellent characteristics.

Examples 1 and 2 show a bottom contact type organic thin film transistor element, but the present invention can be also applied to a top contact type organic thin film transistor element.

The present invention has been described with the embodiments thereof, any details of the description of the present invention are not limited unless described otherwise, and it is obvious that the present invention is widely construed without departing from the gist and scope of the present invention described in the accompanying claims.

The present application claims the priority of JP2018-008590 filed in Japan on Jan. 23, 2018, the contents of which are incorporated herein by reference, as a part of the description of the present specification.

EXPLANATION OF REFERENCES

10: substrate
20: gate electrode

30: gate insulating film
40: source electrode
42: drain electrode
50: organic semiconductor film
60: sealing layer
100, 200: organic thin film transistor element

What is claimed is:

1. A polymer which has a repeating unit including a structure represented by Formula (1),

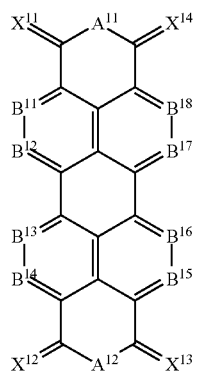

(1)

in Formula (1), $A^{11}$ and $A^{12}$ represent —O—, —N($R^N$)—, or —P($R^N$)—, $B^{11}$ to $B^{18}$ represent —N= or —C($R^M$)=, at least one of which is —N=, at least one of $R^N$ or $R^M$ represents a single bond or a linking group, and the other represents a hydrogen atom or a substituent, $X^{11}$ to $X^{14}$ represent an oxygen atom or a sulfur atom, and the polymer includes no repeating unit having an aliphatic 7-membered ring structure, and wherein the number of repeating units in the polymer is 3 or more.

2. The polymer according to claim 1, which has, as the repeating unit, a group consisting of a 5-membered or 6-membered monocyclic ring, a group consisting of a condensed ring in which at least two of the monocyclic rings are condensed, an ethenylene group or an ethynylene group, or a group obtained by combining these groups.

3. The polymer according to claim 1, wherein the repeating unit including the structure represented by Formula (1) is a repeating unit including a structure represented by Formula (2),

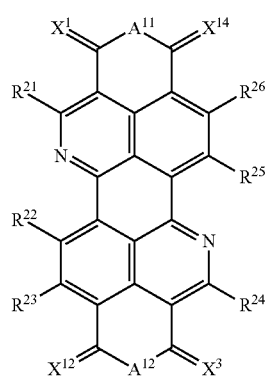

(2)

in Formula (2), $A^{11}$ and $A^{12}$ represent —O—, —N($R^N$)—, or —P($R^N$)—, at least one of $R^N$ and $R^{21}$ to $R^{26}$ represent a single bond or a linking group, and the others represent a hydrogen atom or a substituent, and $X^{11}$ to $X^{14}$ have the same meaning as $X^{11}$ to $X^{14}$ in Formula (1).

4. The polymer according to claim 1, wherein the repeating unit including the structure represented by Formula (1) is a repeating unit including a structure represented by Formula (3-1) or Formula (3-2),

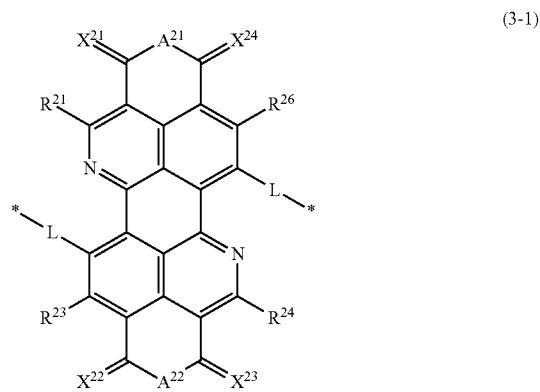

(3-1)

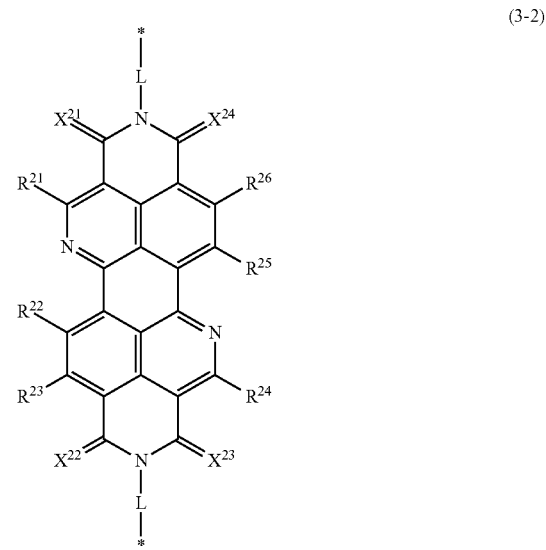

(3-2)

in Formula (3-1) and Formula (3-2), $A^{21}$ and $A^{22}$ represent —O—, —N($R^N$)—, or —P($R^N$)—, $R^N$ and $R^{21}$ to $R^{26}$ represent a hydrogen atom or a substituent, $X^{21}$ to $X^{24}$ have the same meaning as $X^{11}$ to $X^{14}$ in Formula (1), L represents a single bond or a linking group, and * represents a linking site.

5. An organic semiconductor composition comprising:
a polymer which has a repeating unit including a structure represented by Formula (1); and
a solvent,

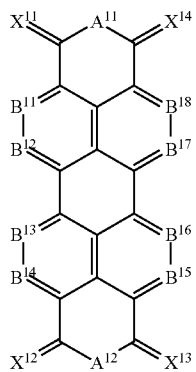

(1)

in Formula (1), $A^{11}$ and $A^{12}$ represent —O—, —N($R^N$)—, or —P($R^N$)—, $B^{11}$ to $B^{18}$ represent —N= or —C($R^M$)=, at least one of which is —N=, at least one of $R^N$ or $R^M$ represents a single bond or a linking group, and the other represents a hydrogen atom or a substituent, $X^{11}$ to $X^{14}$ represent an oxygen atom or a sulfur atom, and the polymer includes no repeating unit having an aliphatic 7-membered ring structure, and wherein the number of repeating units in the polymer is 3 or more.

6. A method of manufacturing an organic semiconductor film, the method comprising:
a step of applying or printing the organic semiconductor composition according to claim 5 on a substrate, and drying the applied or printed organic semiconductor composition to form an organic semiconductor film.

7. An organic semiconductor film comprising:
a polymer which has a repeating unit including a structure represented by Formula (1),

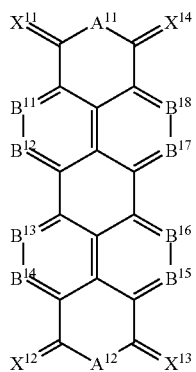

(1)

in Formula (1), $A^{11}$ and $A^{12}$ represent —O—, —N($R^N$)—, or —P($R^N$)—, $B^{11}$ to $B^{18}$ represent —N= or —C($R^M$)=, at least one of which is —N=, at least one of $R^N$ or $R^M$ represents a single bond or a linking group, and the other represents a hydrogen atom or a substituent, $X^{11}$ to $X^{14}$ represent an oxygen atom or a sulfur atom, and the polymer includes no repeating unit having an aliphatic 7-membered ring structure, and wherein the number of repeating units in the polymer is 3 or more.

8. An organic semiconductor element comprising:
an organic semiconductor layer containing a polymer which has a repeating unit including a structure represented by Formula (1),

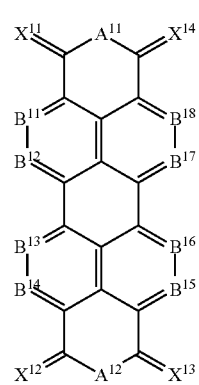

(1)

in Formula (1), $A^{11}$ and $A^{12}$ represent —O—, —N($R^N$)—, or —P($R^N$)—, $B^{11}$ to $B^{18}$ represent —N= or —C($R^M$)=, at least one of which is —N=, at least one of $R^N$ or $R^M$ represents a single bond or a linking group, and the other represents a hydrogen atom or a substituent, $X^{11}$ to $X^{14}$ represent an oxygen atom or a sulfur atom, and the polymer includes no repeating unit having an aliphatic 7-membered ring structure, and wherein the number of repeating units in the polymer is 3 or more.

9. The organic semiconductor element according to claim 8,
wherein the polymer has, as the repeating unit, a group consisting of a 5-membered or 6-membered monocyclic ring, a group consisting of a condensed ring in which at least two of the monocyclic rings are condensed, an ethenylene group or an ethynylene group, or a group obtained by combining these groups.

10. The organic semiconductor element according to claim 8,
wherein the repeating unit including the structure represented by Formula (1) is a repeating unit including a structure represented by Formula (2),

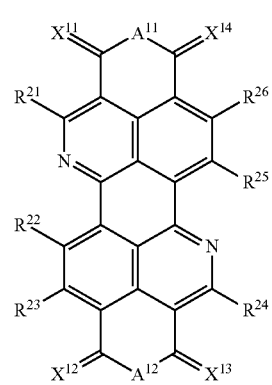

(2)

in Formula (2), $A^{11}$ and $A^{12}$ represent —O—, —N($R^N$)—, or —P($R^N$)—, at least one of $R^N$ and $R^{21}$ to $R^{26}$ represent a single bond or a linking group, and the others represent a hydrogen atom or a substituent, and $X^{11}$ to $X^{14}$ have the same meaning as $X^{11}$ to $X^{14}$ in Formula (1).

11. The organic semiconductor element according to claim 8,
wherein the repeating unit including the structure represented by Formula (1) is a repeating unit including a structure represented by Formula (3-1) or Formula (3-2),

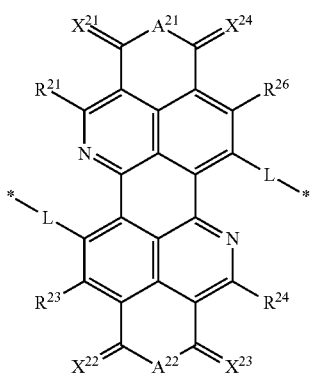

(3-1)

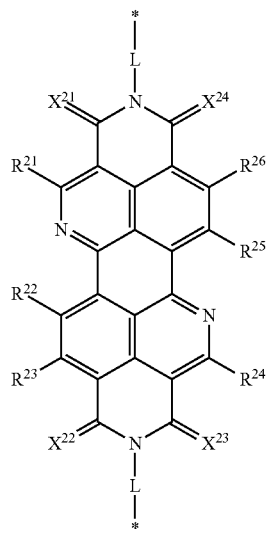

(3-2)

in Formula (3-1) and Formula (3-2), $A^{21}$ and $A^{22}$ represent —O—, —N($R^N$)—, or —P($R^N$)—, $R^N$ and $R^{21}$ to $R^{26}$ represent a hydrogen atom or a substituent, $X^{21}$ to $X^{24}$ have the same meaning as $X^{11}$ to $X^{14}$ in Formula (1), L represents a single bond or a linking group, and * represents a linking site.

12. The organic semiconductor element according to claim 8, which is an organic thin film transistor element.

* * * * *